United States Patent
Hewak et al.

(10) Patent No.: US 8,624,215 B2
(45) Date of Patent: Jan. 7, 2014

(54) PHASE CHANGE MEMORY DEVICES AND METHODS COMPRISING GALLIUM, LANTHANIDE AND CHALCOGENIDE COMPOUNDS

(75) Inventors: Daniel William Hewak, Hampshire (GB); Richard J. Curry, Hampshire (GB); Arshad Khawar Mairaj, Hampshire (GB); Robert E. Simpson, Hampshire (GB)

(73) Assignee: University of Southampton, Hampshire (GB)

( * ) Notice: Subject to any disclaimer, the term of this patent is extended or adjusted under 35 U.S.C. 154(b) by 388 days.

(21) Appl. No.: 11/643,044

(22) Filed: Dec. 20, 2006

(65) Prior Publication Data

US 2007/0181867 A1    Aug. 9, 2007

Related U.S. Application Data

(60) Provisional application No. 60/752,160, filed on Dec. 20, 2005.

(51) Int. Cl.
G11B 7/243 (2013.01)

(52) U.S. Cl.
USPC .................................................. 257/3

(58) Field of Classification Search
USPC ............................ 257/3, E21.273
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,983,542 A | 9/1976 | Ovshinsky |
| 3,988,720 A | 10/1976 | Ovshinsky |
| 4,103,044 A | 7/1978 | Eisenberg et al. |
| 4,622,654 A | 11/1986 | Yaniv et al. |
| 4,679,085 A | 7/1987 | Johnson et al. |
| 4,715,685 A | 12/1987 | Yaniv et al. |

(Continued)

FOREIGN PATENT DOCUMENTS

| | | |
|---|---|---|
| EP | 1667230 | 6/2006 |
| JP | 2000-207771 | 7/2000 |

(Continued)

OTHER PUBLICATIONS

Lucazeau et al. "Sprectres Vibrationnels, Transitions electroniques et Structures a Courtes Distances dans les Verres: Sulfures de Teres rares—Sulfures d Gallium" Mat. Res. Bull. vol. 12 pp. 437-488 (1977).*

(Continued)

Primary Examiner — Thomas L Dickey
(74) Attorney, Agent, or Firm — Renner, Otto, Boisselle & Sklar, LLP

(57) ABSTRACT

A new class of phase change materials has been discovered based on compounds of: Ga; lanthanide; and chalcogenide. This includes compounds of Ga, La, and S (GLS) as well as related compounds in which there is substitution of S with O, Se and/or Te. Moreover, La can be substituted with other lanthanide series elements. It has been demonstrated that this class of materials exhibit low energy switching. For example, the GLS material can provide an optical recording medium with erasability 3-5 dB greater than the erasability of GeSbTe (GST) material which is the standard material for phase change memories.

26 Claims, 37 Drawing Sheets
(15 of 37 Drawing Sheet(s) Filed in Color)

(56) References Cited

U.S. PATENT DOCUMENTS

| | | | |
|---|---|---|---|
| 4,719,594 A | 1/1988 | Young et al. | |
| 4,782,340 A | 11/1988 | Czubatyj et al. | |
| 4,795,657 A | 1/1989 | Formigoni et al. | |
| 4,845,533 A | 7/1989 | Pryor et al. | |
| 4,853,785 A * | 8/1989 | Ovshinsky et al. | 348/302 |
| 4,866,672 A | 9/1989 | Terao et al. | |
| 5,166,758 A | 11/1992 | Ovshinsky et al. | |
| 5,296,716 A | 3/1994 | Ovshinsky et al. | |
| 5,359,205 A * | 10/1994 | Ovshinsky | 257/3 |
| 5,534,711 A | 7/1996 | Ovshinsky et al. | |
| 5,536,947 A | 7/1996 | Klersy et al. | |
| 5,580,632 A * | 12/1996 | Ohkawa et al. | 428/64.1 |
| 5,596,522 A | 1/1997 | Ovshinsky et al. | |
| 5,599,751 A | 2/1997 | Harbison et al. | |
| 5,652,037 A | 7/1997 | Ohkawa et al. | |
| 5,687,112 A | 11/1997 | Ovshinsky | |
| 5,709,978 A | 1/1998 | Hirotsune et al. | |
| 5,714,768 A * | 2/1998 | Ovshinsky et al. | 257/40 |
| 5,789,277 A | 8/1998 | Zahorik et al. | |
| 5,814,527 A | 9/1998 | Wolstenholme et al. | |
| 5,879,955 A | 3/1999 | Gonzalez et al. | |
| 5,920,788 A | 7/1999 | Reinberg | |
| 5,933,365 A | 8/1999 | Klersy et al. | |
| 6,025,220 A | 2/2000 | Sandhu | |
| 6,075,719 A | 6/2000 | Lowrey et al. | |
| 6,104,038 A | 8/2000 | Gonzalez et al. | |
| 6,111,264 A | 8/2000 | Wolstenholme et al. | |
| 6,229,157 B1 | 5/2001 | Sandhu | |
| 6,300,684 B1 | 10/2001 | Gonzalez et al. | |
| 6,314,014 B1 | 11/2001 | Lowrey et al. | |
| 6,316,784 B1 | 11/2001 | Zahorik et al. | |
| 6,324,091 B1 | 11/2001 | Gryko et al. | |
| 6,337,266 B1 | 1/2002 | Zahorik | |
| 6,391,688 B1 | 5/2002 | Gonzalez et al. | |
| 6,392,913 B1 | 5/2002 | Sandhu | |
| 6,429,064 B1 | 8/2002 | Wicker | |
| 6,462,353 B1 | 10/2002 | Gilgen | |
| 6,480,438 B1 | 11/2002 | Park | |
| 6,487,113 B1 | 11/2002 | Park et al. | |
| 6,492,656 B2 | 12/2002 | Zahorik et al. | |
| 6,501,111 B1 | 12/2002 | Lowrey | |
| 6,507,061 B1 | 1/2003 | Klersy et al. | |
| 6,511,862 B2 | 1/2003 | Hudgens et al. | |
| 6,512,241 B1 | 1/2003 | Lai | |
| 6,514,788 B2 | 2/2003 | Quinn | |
| 6,534,780 B1 | 3/2003 | Gonzalez et al. | |
| 6,534,781 B2 | 3/2003 | Dennison | |
| 6,545,287 B2 | 4/2003 | Chiang | |
| 6,545,907 B1 | 4/2003 | Lowrey et al. | |
| 6,567,293 B1 | 5/2003 | Lowrey et al. | |
| 6,567,296 B1 | 5/2003 | Casagrande et al. | |
| 6,570,784 B2 | 5/2003 | Lowrey | |
| 6,576,921 B2 | 6/2003 | Lowrey | |
| 6,579,760 B1 | 6/2003 | Lung | |
| 6,589,714 B2 | 7/2003 | Maimon et al. | |
| 6,590,807 B2 | 7/2003 | Lowrey | |
| 6,593,176 B2 | 7/2003 | Dennison | |
| 6,597,009 B2 | 7/2003 | Wicker | |
| 6,608,773 B2 | 8/2003 | Lowrey et al. | |
| 6,613,604 B2 | 9/2003 | Maimon et al. | |
| 6,617,192 B1 | 9/2003 | Lowrey et al. | |
| 6,646,297 B2 | 11/2003 | Dennison | |
| 6,667,900 B2 | 12/2003 | Lowrey et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,674,121 B2 | 1/2004 | Misra et al. | |
| 6,687,153 B2 | 2/2004 | Lowrey | |
| 6,707,712 B2 | 3/2004 | Lowery | |
| 6,803,335 B2 | 10/2004 | Hewak et al. | |
| 6,878,618 B2 | 4/2005 | Lowrey et al. | |
| 6,881,603 B2 | 4/2005 | Lai | |
| 6,885,021 B2 | 4/2005 | Apodaca et al. | |
| 6,891,747 B2 | 5/2005 | Bez et al. | |
| 7,202,493 B2 | 4/2007 | Lung | |
| 7,319,235 B2 | 1/2008 | Happ | |
| 2001/0041241 A1 * | 11/2001 | Kondo | 428/64.4 |
| 2004/0113181 A1 | 6/2004 | Wicker | |
| 2004/0233748 A1 * | 11/2004 | Terao et al. | 365/202 |
| 2006/0109708 A1 * | 5/2006 | Pinnow et al. | 365/163 |
| 2006/0205110 A1 * | 9/2006 | Pinnow et al. | 438/102 |
| 2007/0053786 A1 | 3/2007 | Nonaka et al. | |
| 2008/0123396 A1 * | 5/2008 | Kato et al. | 365/163 |

FOREIGN PATENT DOCUMENTS

| | | |
|---|---|---|
| JP | 2003/011513 | 1/2003 |
| JP | 2003/208732 | 7/2003 |
| JP | 2003/248973 | 9/2003 |
| JP | 2005-117002 | 4/2005 |
| JP | 2005117002 | 4/2005 |
| WO | 2005/035455 | 4/2005 |

OTHER PUBLICATIONS

Benzaneth et al., "An EXAFS Structural Approach of the Lanthanum-Gallium-Sulfur Glasses", J. Non-Crystalline Solids, V. 110 pp. 89-100 (1989).*

Youden et al., "Pulsed laser deposition of Ga-La-S chalcogenide glass thin film optical waveguides" Appl. Phys. Lett. 63, 1601 (1993).*

Abdulhalim et al., "High Performance acousto-optic chalcogenide glass based on Ga2S3-La2S3 systems", J. Non-Crystalline Solids, V. 164-166 pp. 1251-1254 (1993).*

Brown, et al., "The effect of oxide on the spectroscopic properties of the praseodymium 1.3-micron transition in gallium-lanthanum-sulphide glass", Journal of Luminescence 66-67, pp. 278-284 (1996).*

Hewak et al., "Emission at 1.3 microns from dysprosium-doped Ga:La:S glass", Elect. Lett., vol. 30 pp. 968-970 (Jun. 9, 1994) Monro et al., "Chalcogenide holey fibres", Elect. Lett., vol. 36 pp 1998-2000 (Nov. 23, 2000).*

Petrovich et al. "Temperature dependence of reversible photodarkening in Ga:La:S and Ga:La:S:O glass fibers", Paper 2206, Proc. Int. Congr. Glass, vol. 2, Extended Abstracts, Edinburgh, Scotland, Jul. 1-6, 2001.*

Requejo-Isidro et al., "Self refractive non-linearities in chalcogenide based glasses", Journal of Non-Crystalline Solids vol. 317 pp. 241-246 (2003).*

Monro et al., "Chalcogenide holey fibres", Elect. Lett., vol. 36 pp 1998-2000 (Nov. 23, 2000).*

Samson et al., "Dysprosium doped Ga:La:S glass for an efficient optical fibre amplifier operating at 1.3 microns", Elect. Lett., vol. 30 pp. 1617-1619 (Sep. 15, 1994).*

Samson et al., "Properties of dysprosium-doped gallium lanthanum sulfide fiber amplifiers operating at 1.3 microns", Optics Letters, vol. 22, pp. 703-705 (May 15, 1997).*

Schweizer et al. "Site-selective spectroscopy in dysprosium-doped chalcogenide glasses for 1.3-micron optical-fiber amplifiers", J. Opt. Soc. Am. B, vol. 18, pp. 1436-1442 (Oct. 2001).*

Schweizer et al., "Spectroscopic data of the 1.8-, 2.9-, and 4.3-micron transitions in dysprosium-doped gallium lanthanum sulfide glass", Optics Letters, vol. 21, pp. 1594-1596 (Oct. 1, 1996).*

Morgan et al., "Crystallization of Gallium Lanthanum Sulfide Glasses", J. Am. Ceram. Soc., 81 [7] 1913-18 (1998).*

McGraw-Hill Encyclopedia of Physics, Second Edition, 1993 pp. 231-232.

J. Flahaut et al.; Glass Technology, vol. 24, "Rare Earth Sulphide and Oxysulphide Glasses;" Jun. 1983; pp. 149-155.

McGraw-Hill Encyclopedia of Physics, Second Edition; 1993; pp. 283.

Homer E. Kissinger; Analytical Chemistry, vol. 29, "Reaction Kinetics in Differential Thermal Analysis;" 1957; pp. 1702-1706.

T. Kyratsi et al.; Advanced Materials 15, No. 17, "A Wide Bandgap Phase-Change Material for Ultra High Density Rewritable Information Storage;" Sep. 3, 2003.

R. E. Simpson, et al.; E*PCOS Cambridge; "High Throughput Synthesis and Screening of Chalcogenide Materials for Data Storage;" Sep. 2005.

International Search Report and Written Opinion for PCT/GB2006/004635.

(56) References Cited

OTHER PUBLICATIONS

Prosecution history of EP 06820493 dated Sep. 15, 2008.
Energy Conversion Devices, Inc., "Phase Change Data Storage", MRS Tutorial, Dec. 1, 2003. pp. 1-65. [Exhibit C].
Kazuya Nakayama et al., "Nonvolatile memory based on phase change", 2004/11/04(ISNM2004) pp. 1-32. [Exhibit E].
Roberto Bez Fellow, "Phase Change Memory: State of the Art and Perspective", Numonyz, R&D—Technology Development, pp. 1-34. [Exhibit F].
L. Tichy et al., "Covalent bond approach to the glass-transition temperature of chalcogenide glasses", Journal of Non-Crystalline Solids 189 (1995). pp. 141-146 [Exhibit J].
A.L. Lacaita, "Phase Change Memories: State-of-the-art, challenges and perspectives", Solid-State Electronics 50 (2006). pp. 24-31. [Exhibit K].
Prashant N. Kumta et al., " Novel Glasses in Rare-Earth Sulfide Systems", Laboratory Report, Ceramic Bulletin, vol. 69, No. 12, (1990). pp. 1-8. [Exhibit L].
D.W. Hewak et al., "Quantum-Efficiency of Praseodymium Doped Ga:La:S for 1.3 µm Optical Fibre Amplifiers", IEEE Photonics Technology Letters, vol. 6, No. 5, May 1994. pp. 1-4. [Exhibit 0].
Agiga Tech; A Cypress Semiconductor Company., "PCM (Phase-Change Memory) Basics and Technology Advances", pp. 1-4. [Exhibit P].
Wuttig and Yamada, "Phase-change materials for rewriteable data storage", Nature Materials, Nature Publishing Group, pp. 824-832 (2007).
Japanese Office Action for corresponding application No. 2008-546573 mailed Jul. 3, 2012.

* cited by examiner

PHASE CHANGE MEMORY DEVICES AND METHODS COMPRISING GALLIUM, LANTHANIDE AND CHALCOGENIDE COMPOUNDS

CROSS REFERENCE TO RELATED APPLICATION

This application claims the benefit of U.S. Provisional Application No. 60/752,160 filed Dec. 20, 2005, which is hereby incorporated herein by reference in its entirety.

FIELD OF THE INVENTION

The present invention relates generally to phase change memories, and in particular to materials usable for such memories.

BACKGROUND OF THE INVENTION

Phase change memory elements are programmable by the input of energy of one form or another. Most commonly, optical or electrical energy is used.

Phase change materials are materials which can be switched between generally amorphous and generally crystalline states. These materials are used in memories where electrical, optical or other energy is used to switch the material between its different states as is well known in the art.

There are a large number of patents relating to inventions made by Ovshinsky and co-workers at Energy Conversion Devices, Inc. dating from the 1960's to recent times [1-14]. There are also many other patents in this field [15-78].

Phase change memory materials can be changed between structural states of generally amorphous and generally crystalline local order, or can be set between different detectable states of local order across a continuous spectrum between completely amorphous and completely crystalline states.

Some of the materials described by the Ovshinsky patents are switchable between two detectable structural states of generally amorphous and generally crystalline local order to accommodate the storage and retrieval of single bits of encoded binary information. It is also claimed that these materials can be set at intermediate detectable levels of local order over the entire spectrum between completely amorphous and completely crystalline states. For the latter case, the intermediate detectable levels were defined as any level over the whole range local order between the completely amorphous and the completely crystalline states and was described as a "grey scale" represented by the spectrum between the completely amorphous and the completely crystalline states.

These grey scale characteristics were used to speculate that many-state phase change memories could be built exploiting a continuously variable parameter such as resistance, where separately detectable steps between maximum and minimum levels could provide multilevel logic. However, to the inventors' knowledge, no unique or physically distinguishable characteristics have yet been identified that clearly delineate between the different so-called grey scale states, other than the continuum of variation between relative "amounts" of amorphous and crystalline local order.

Furthermore, it is not clear if the continuously variable degree of local order/disorder that provides the grey scale is stable with respect to time, environmental conditions or any unexpected, undesired or parasitic fluctuations of energy that may arise, such as fluctuations in electrical, optical, pressure or thermal energy.

In an optical phase change memory where the phase change material is switched between states by the application of optical energy, the state is detectable by properties such as: index of refraction, optical absorption, optical reflectivity, or combinations thereof. Other properties that can also be detected could be changes in volume and density, through photo-expansion or photo-compaction.

In an optical phase change memory material, a laser is generally used to supply the optical energy to cause the phase change between amorphous and crystalline states. The amount of energy applied to the memory material is a function of both the power of the laser as well as the period of time that the laser pulse is applied.

Importantly though, and not widely recognised in the prior art, is the importance of the absorption coefficient of the phase change material. If the material is transparent to the laser radiation, or if the phase change material layer is too thin, then the temperature increase can be relatively small. Similarly, the thermal conductivity and heat capacity of the phase change material is important.

The crystallisation energy is also important. As defined below, the crystallisation energy is the amount of energy per unit volume needed to substantially re-crystallise an amorphous programmable volume region of the phase change memory material. If the crystallisation energy is too high, the material requires exposure to either a higher power laser pulse or a longer laser pulse in order to convert the material from the amorphous to the crystalline states. It is desirable to be able to control the crystallisation energy of a phase change memory material via the addition of one or more modifier elements. It is also desirable to increase the erasability of optical recording media. If the crystallisation energy is too low, the memory material will be unstable and information stored could be irretrievable lost.

Electrical phase change memory is capable of being electrically switched between generally amorphous and generally crystalline states for electronic memory applications. As mentioned above, it is also postulated that the material can be electrically modified between many different detectable states of local order across the continuum between completely amorphous and completely crystalline states.

That is, the electrical switching of such materials can take place between completely amorphous and completely crystalline states in a binary system, or between a larger number of incremental steps having different degrees of local order to provide a "grey scale". Alternatively, a binary system can be contemplated which switches between two intermediate states in the continuum where one is more amorphous and less crystalline than the other.

The "grey scale" described in the Ovshinsky patents is counter-intuitive and its physical basis is unclear and has yet to be convincingly explained either by theory or experiment. The explanation given in the Ovshinsky patents is that a memory element is transferred from its high resistance state to its low resistance state through a series of sub-interval pulses and, with application of each sub-interval pulse, the resistance of the memory device does not substantially change until the total integrated duration of the sub-interval pulses is equal to or greater than a set duration. Once the final sub-interval pulse has delivered the last increment of the energy, the device is said to be transformed to the low resistance state.

In summary, while a many-state material would have clear advantages in terms of being able to store higher densities of data per unit area, it is not yet clear that a suitably stable phase change material for implementing such a many-state memory has been identified.

More generally, while phase change memories can be, and have been, made successfully, their penetration into mainstream markets is limited by several factors.

The main materials system used to date is based on GeSbTe compounds, sometimes referred to as GST, typically including one or more further elements referred to as "modifiers" or "dopants" in order to improve or otherwise adjust one or more relevant properties of the device, such as switching speed or energy.

Although GeSbTe and related phase-change compounds have generally favourable properties for phase change data storage, they have the following limitations. They provide only relatively slow electrical switching speeds. They require relatively high energy consumption, especially for writing. They could have better stability, both for long term data storage and to be stable against changes in environmental conditions, this being the case especially for multi-level devices that exploit the "grey scale". These limitations all follow from the inherent materials properties of the phase change compound and are thus relevant for any kind of phase change memory device made from such material, whether the devices are actuated optically, electrically or otherwise.

SUMMARY OF THE INVENTION

According to the invention there is provided a phase change memory device comprising a phase change material, wherein the phase change material is a compound of: (i) Ga; (ii) lanthanide; and (iii) chalcogenide.

In one class of embodiments, the compound comprises Ga, La, and S (often referred to in the art as GLS). The GLS may be relatively free of modifiers and dopants, for example made of at least 99% atoms of Ga, La and S. GLS is a well known glass compound (see U.S. Pat. No. 6,803,335 [79] and references therein). However, its use as a phase change material is considered to be new. Indeed, a focus of GLS research has been on how best to suppress its crystallisation, since crystallisation is of course a generally undesirable event in glass formation.

As discussed in the examples detail below, it has been discovered that GLS and related compounds are excellent phase change materials exhibiting low energy switching, multiple discrete crystalline states and other highly desirable properties for a phase change material. For example, the GLS based material of the invention can provide an optical recording medium with very low erasability, for example 3 dB, 5 dB or greater than the erasability of a GST based material of the prior art with the same structure.

As well as GLS compounds, the invention envisages partial or total substitution of La with other lanthanide series elements (periodic table 58-71). It also envisages partial or total substitution of S with one or more of the other chalcogenides O, Se and Te in all possible permutations including: S; O; Se; Te; S and O; S and Se; S and Te; S, Se and Te; and O, S, Se and Te. In one example, the ratio of O atoms to S atoms is chosen as approximately 1:19 representing a substitution of approximately 5% of the S by O. In another example, the substitution of S by O is equal to the Ga:La ratio, whereby the compound is represented by j(2Ga:3S) to k(2La:3O) where $1<j<3$ and $1<k<3$.

Our experiments have demonstrated that by substituting some or all of the S by Se, the characteristic temperatures for the phase change can be reduced and also controlled in a reproducible way. Furthermore, substitution of S or Se by Te allows further reduction in the characteristic temperatures. In one example, the ratio of S atoms to Se atoms is chosen as approximately 1:19 representing a substitution of approximately 5% of the S by Se. In another example, the substitution of S by Te is complete, whereby the compound is represented by the ratio of Ga atoms to La atoms to Te atoms (i.e., Ga:La:Te) is chosen as approximately 3:1:6. Moreover, complete substitute of S by Se in similar ratios can be performed to obtain a compound with higher characteristic temperatures.

In a first group of example GLS compositions, the ratio of atoms of $Ga_w$, $La_x$, $S_y$ is in the range $25<w<35$, $5<x<15$, $50<y<70$. Preferably the ratio of Ga:S atoms is approximately 2:3, and the ratio of La:S atoms is approximately 2:3, which is achievable using $Ga_2S_3$ and $La_2S_3$ starting materials when manufacturing the GLS compound as described in the prior art [79]. More preferably, the ratio of Ga to La is 3:1, so that the ratio of atoms of Ga:La:S is approximately 3:1:6. This can be achieved with $Ga_2S_3$ and $La_2S_3$ starting materials provided in a ratio of 3:1.

In a second group of example GLS compositions, the ratio of atoms of $Ga_w$, $La_x$, $S_y$ is in the range $5<w<15$, $25<x<35$, $50<y<70$. Examples in this composition range have been shown to have the completely unexpected property that they exhibit multiple distinct crystallisation states in addition to the amorphous state. These materials thus offer the ability to provide stable, supra-binary logic or multi-bit data storage in that the "grey scale" continuum of the prior art is replaced with 3 or more discrete and stable physical states of the compound. Preferably the ratio of Ga:S atoms is approximately 2:3, and the ratio of La:S atoms is approximately 2:3. More preferably the ratio of Ga to La is 1:3, so that the ratio of atoms of Ga:La:S is approximately 1:3:6. This can be achieved with $Ga_2S_3$ and $La_2S_3$ starting materials provided in a ratio of 1:3.

In a third group of example GLS compositions, the ratio of atoms of $Ga_w$, $La_x$, $S_y$ is in the range $15<w<25$, $15<x<25$, $50<y<70$. Preferably, the ratio of Ga:S atoms is approximately 2:3, and the ratio of La:S atoms is approximately 2:3. More preferably the ratio of Ga to La is 1:1, so that the ratio of atoms of Ga:La:S is approximately 2:2:6. This can be achieved with $Ga_2S_3$ and $La_2S_3$ starting materials provided in a ratio of 1:1.

The above-mentioned first, second and third groups of examples of GLS compositions can also be replicated in the Ga:La:Te system, i.e. with S substituted with Te.

The above-mentioned first, second and third groups of examples of GLS compositions can also be replicated in the Ga:La:Se system, i.e. with S substituted with Se.

Further, the above-mentioned first, second and third groups of examples of GLS compositions can be replicated for any substitutional combination of S, Te and Se atoms making up the chalcogenide.

The lanthanide may be La, another lanthanide, namely Ce, Pr, Nd, Pm, Sm, Eu, Gd, Tb, Dy, Ho, Er, Tm, Yb or Lu, or La in combination with at least one further lanthanide element. In the latter case, the ratio of atoms of La to atoms of said at least one further lanthanide element may be in the range 9:1 to 1:1. In one example, the ratio of other lanthanide atoms to La atoms (e.g. Pr:La) is chosen as approximately 1:4 representing a substitution of approximately 20% of the La by another lanthanide element. In another example, the ratio of other lanthanide atoms to La atoms (e.g. Er:La) is chosen as approximately 1:1 representing a substitution of approximately 50% of the La by another lanthanide.

The compound may further comprise a halide modifier of one or more Group VII elements selected from the group F, Cl, Br and I, and/or Group I elements selected from the group Na, K, Rb and Cs. The halide modifier may make up between 1% to 30%, or 20% to 30% of the atoms of the compound.

The Group VII halide modifiers may be conveniently introduced to the compound by substitution of LaF, LaCl, LaBr or LaI for $La_2S_3$ or by GaF, GaCl, GaBr or GaI for $Ga_2S_3$.

Specific examples of the compound are: $(30Ga_2S_3\ 70La_2S_3)\ 10LaF_3$; $(30Ga_2S_3\ 70La_2S_3)\ 30CsCl$; $(30Ga_2S_3\ 70La_2S_3)\ 10NaCl$; $(40Ga_2S_3\ 60La_2S_3)\ 10LaF_3$ $(50Ga_2S_3\ 50La_2S_3)\ GaF_3$; and $(30Ga_2S_3\ 70La_2S_3)\ GaCl_3$.

The compound may further comprise a transition metal modifier of one or more elements selected from elements 21 to 30, 39 to 48, and 72 to 80 of the periodic table, namely: Sc, Ti, V, Cr, Mn, Fe, Co, Ni, Cu, Zn (21-30); Y, Zr, Nb, Mo, Tc, Ru, Rh, Pd, Ag, Cd (39-48); and Hf, Ta, W, Re, Os, Ir, Pt, Au, Hg (72-80). The transition metal modifier is preferably one or more elements selected from the group: Cr, Fe, Ni, Nb, Pd, Pt, Cu, Au, Ag—most preferably Cu, Ag and/or Au.

The compound may further comprise one or more elements selected from the group: B, Al, In, Si, Ge, Sn, As, Sb, Bi.

The phase change material is preferably non-volatile.

The phase change material is preferably directly overwritable.

Gallium sulphide on its own as a compound, although readily crystallized from the melt, is not a glass former. It is only the combination of gallium sulphide and lanthanum sulphide that a glass forming compound is obtained. We therefore use the term glass forming as a description of the GLS compound. Any additional element or compound that is added to, or substitutes some or all of the gallium lanthanum or sulphur we refer to as a modifier. The modifiers may be present in the compound in trace levels, that is on the order of part per million by weight or in an atomic percentage on the order of 0.001 or in more substantial concentrations as high as 50% in atomic percentage, most preferably between 0.06 and 1.0 atomic percent. This range is considered significant in view of the crystallisation process as now explained. Crystallisation can be divided into two basic steps: (1) the formation of nuclei, and (2) the growth of said nuclei into crystals. The nucleation process may be either homogeneous nucleation or heterogeneous nucleation. Generally, the amount of energy needed for heterogeneous nucleation is less than that required for homogeneous nucleation. Though not wishing to be bound by theory, it is believed that the modifier element adds heterogeneous nucleation sites to the phase change material. Even a relatively small amount of said modifer can significantly alter the crystallisation process. The addition of heterogeneous nucleation sites reduces the amount of energy necessary for nucleation and thereby reduces the crystallisation energy of the phase change material. Further, the decrease in crystallisation energy of the phase change material increases the erasability of the recording medium using the phase change material. It is believed that at atomic percentages below about 0.06, the modifier element does not provide enough heterogeneous nucleation sites to favourably affect the nucleation characteristics of the material, and at atomic percentages that are above about 1.0, the modifier element has no additional beneficial effect, and can in some cases deleteriously affect the desirable characteristics of the phase change material.

The modifier, in addition to the effects that the small atomic percentages in the range 0.001 or 0.06 to 1.0 can have on crystallisation, can also significantly alter other characteristics of the glass or crystalline phase when introduced in larger quantities. For examples, partial substitution of S by O can have significant effect of the environmental stability of the material, which is also a desirable improvement for many applications of phase change memory.

The compound is suitable for use in optically and electrically actuated phase change memory devices.

Namely, the invention includes embodiments of the device in which the phase change material is addressable by an optical beam configured to allow optical pulses to be applied to programmable volumes of the phase change material to selectively read and induce phase changes in the programmable volumes selected by the optical beam.

Moreover, the invention includes further embodiments of the device in which the phase change material is addressable by a plurality of electrodes which define an array of programmable volumes of the phase change material and which are configured to allow electrical pulses to be applied to the programmable volumes to selectively read and induce phase changes in the programmable volumes selected by the electrodes.

More generally, the energy applied to the programmable volume of phase change material may be of any form, not limited to electrical and optical energy. For example, particle beam energy, thermal energy, electromagnetic energy, acoustical energy, and pressure energy may be considered. The electrical energy may take the form of electrical current or voltage.

In the case of electrical actuation, the energy preferably takes the form of electrical current used to apply a set current pulse having an amplitude equal to a set amplitude and a duration equal to a set duration, which are necessary and sufficient to set the programmable volume of phase change material from a high resistance state to a low resistance state.

In the case of electrical actuation, the state of the phase change materials can be sampled by a resistivity measurement. The material preferably (1) have a plurality of detectable electrical resistivity values, (2) can be switched from any one resistivity value to any other resistivity value in response to an electrical signal, and (3) can be set directly to one of the resistivity values without the need to be set to a specific starting or erased resistivity value, regardless of the previous resistivity value of the material, in response to the electrical signal.

In devices according to the invention, phase change material can be used in combination with a dielectric material. The dielectric materials can be any dielectric material that is chemically non-reactive with the phase change material. Preferably, the dielectric material has a melting point higher than that of the phase change material.

Through the use of the materials described herein an electrically and/or optical erasable and/or other electro-optic, acousto-optic or magneto-optic interactions, directly overwritable or re-writeable memory material has been developed which is capable of providing fast read and write speeds, non-volatility and random access reprogramming capabilities at a low cost per megabyte of storage.

In one embodiment, the memory material comprises a phase change material that is capable of changing from a first detectable state to a second detectable state upon the application of an electrical signal (thereafter referred to as electrical phase change memory).

In another embodiment, the memory material comprises a phase change material that is capable of changing from a first detectable state to a second detectable state upon the application of a pulse of illumination, for example, from a focused laser beam (thereafter referred to as optical phase change memory).

The phase change material has a first detectable characteristic when in the first state and a second detectable characteristic when in the second state. Preferably, the first and second detectable characteristics are each electrical resistivities, in the case of electrical phase change memory, or reflectivity, in the case of optical phase change memory.

In one embodiment of the present invention, the phase change material has two detectable electrical resistivity values. This provides for a single-cell memory element having binary storage capabilities.

In another embodiment of the present invention, the phase change material has three detectable electrical resistivity values. This provides for a single-cell memory element having multi-bit storage capabilities.

It is believed that the size and composition of the crystallites which exist in the bulk of the memory material are directly proportional to the phase change memory material and any dopants and modifiers which are incorporated with the phase change alloy. These crystallites are unique and vary with the alloy composition and doping level. Each discrete crystal has a detectable resistance values to which the material can be reliably and repeatably set.

The range of resistances also allows for grey scale and multilevel analogue memory storage. Multilevel memory storage is accomplished by dividing the broad dynamic range into a plurality of sub-ranges or levels. The continuous resistance programmability allows for multiple bits of binary information to be stored in a single memory cell. This multilevel storage is accomplished by mimicking multiple bits of binary information in pseudo-analogue form and storing this analogue information in a single memory cell. Thus, by dividing the dynamic range of resistances into 2n analogue levels, each memory cell would be provided with the capability of storing n bits of binary information.

The invention provides an electrically operated single-cell memory element comprising: a phase change material and a dielectric material, where the phase change material has a plurality of detectable resistivity values and can be set directly to one of the resistivity values without the need to be set to a specific starting or erased resistivity value, regardless of the previous resistivity value of the material, in response to an electrical signal; and means for delivering the electrical signal to at least a portion of the volume of memory material.

The invention also provides an optically operated single-cell memory element comprising based on a material that has an amorphous state and a crystalline state and is capable of being switched between the amorphous and crystalline states in response to optical energy. An additional characteristic is that the material undergoes a detectable change in either the index of refraction, optical absorption, or optical reflectivity when switched between the amorphous and crystalline states.

The device is preferably generally planar and can beneficially include compositional modification across at least one dimension of its area. The compositional modification can be used to yield substantially stable values of resistance, including the addition of band gap widening elements to increase the inherent resistance of the material. One example of compositional modification is to include graded compositional inhomogeneities with respect to thickness. For instance, the volume of phase change material may be graded from a first Ga:La:S alloy to a second Ga:La:S alloy of differing composition. The compositional grading may take any form which reduces drift of set resistance values. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of Ga:La:S at one surface to Ga:La:S:O at the opposite surface.

In another aspect the invention includes a method of operating a phase change memory device by selectively switching any of the compound described above based on: (i) Ga; (ii) lanthanide; and (iii) chalcogenide between a first state and a second state. The first state may be a crystalline phase of the phase change material and the second state an amorphous phase of the phase change material. Alternatively, the first state and the second state can be first and second crystalline phases of the phase change material, and optionally a third state, which is an amorphous phase of the phase change material. The switching may be performed optically, electrically or by any of the other means described herein.

Definitions

"amorphous" refers to a state of the phase change material which is relatively structurally less ordered or more disordered than single crystal and has a detectable characteristic, such as high electrical resistivity.

"atomic percentage" of an element, is the percentage of that element, per number of atoms, within the material.

"chalcogenide" refers to elements within Group VI of the periodic table consisting of oxygen (O), sulphur (S), selenium (Se) and tellurium (Te) and to compounds containing such elements.

"compositional modification" includes any means of compositionally modifying the phase change material to yield substantially stable values of resistance, including the addition of band gap widening elements to increase the inherent resistance of the material.

"crystalline" refers to a state of the phase change material which is relatively structurally more ordered than amorphous and has at least one detectably different characteristic, such as a lower electrical resistivity.

"crystallisation energy" is defined as the amount of energy per unit volume to substantially re-crystallise an amorphised volume of phase change material. The energy needed to crystallise the volume of phase change material may be supplied by a laser beam pulse having power P and pulse width W. The amount of energy E delivered to the amorphised volume is the product P×W. Comparative tests may be performed based on the percentage difference in crystallisation energy between (1) a phase change material exemplifying the invention and (2) a prior art phase change material. These tests measure under "static" test conditions by irradiating sample volumes of each of the two materials with a laser beam having power P and pulse width W and subsequently measuring the optical reflectivities of the samples.

"dielectric material" is defined as a material which is an electrical insulator or in which an electric field can be sustained with a minimum dissipation of power. More quantitatively, a solid is a dielectric if its valence band is full and is separated from the conduction band by at least 3 eV, which is a standard definition taken from McGraw-Hill Encyclopedia of Physics, Second Edition, 1993, page 283 [81].

"directly overwritable" in terms of the phase change material means that memory elements based on the phase change material need not be set to a specific starting point in order to change the information stored within the memory elements.

"erasability" is defined as the difference between the carrier-to-noise ratio (CNR) of the recorded signal (the "record CNR") and the carrier-to-noise ratio after erase (the "erase CNR") of an optical recording medium (i.e. erasability=record CNR—erase CNR). The record CNR is the ratio of the power of a carrier frequency signal recorded onto the medium to the power of the noise level of the medium. This is conventionally expressed as: record CNR=20*log 10 (rms voltage of the recorded signal/rms noise voltage). The erase CNR is the carrier-to-noise ratio of the signal recorded into the medium after that portion of the medium, where the signal was recorded, has been subjected to an erase procedure.

"lanthanide" refers to elements 57-71 of the periodic table, namely La, Ce, Pr, Nd, Pm, Sm, Eu, Gd, Tb, Dy, Ho, Er, Tm, Yb and Lu.

"non-volatile" in terms of the phase change material means that the phase change material will maintain the integrity of the information stored by a memory cell made of the material (within a selected margin of error) without the need for a periodic refresh. Hence, the set resistivity value can be held constant for archival time periods without losing the integrity of information store therein.

"taggant" refers to a modifier or dopant which is used to identify a material, layer or region of a phase change memory device.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

EXAMPLES

Example 1

Operation of GLS Phase Alloy

In this example, we demonstrate electrical phase change behaviour of a thin film GLS alloy. The phase-change alloy comprises Ga, La, and S in which the ratio of Ga to La to S (Ga:La:S) is chosen as approximately 1:3:6 to form a phase change alloy. More preferably, the electrical phase-change alloy comprises Ga, La, S in the ratio Gaw Lax Sy where $5<w<10$, $25<x<35$, $50<y<70$. More preferably, $w+x+y=100\%$. More preferably, the ratio of both Ga atoms to S atoms and La atoms to sulphur atoms is chosen as 2:3 and the ratio of 2Ga:3S to 2La:3S is chosen to be 1:3.

In one embodiment of the present invention, the means for delivering is a first contact and a second contact. Each of the contacts is adjoining the volume of memory material. As used herein, a contact is adjoining the volume of memory material if at least a portion of the contact is touching the memory material.

A borosilicate microscope slide was used as a substrate on which the phase change memory device was operated. Aluminium, gold and copper metals have been evaporated onto approximately a 1 cm×1 cm area of the slides. The layers were typically 200 nm in depth. An Oxford Instruments RF-sputterer was then used to deposit the phase change alloy based on gallium, lanthanum and sulphur (GLS) onto the metal layer. Another layer of metal was then evaporated onto the GLS film.

Figure 1:
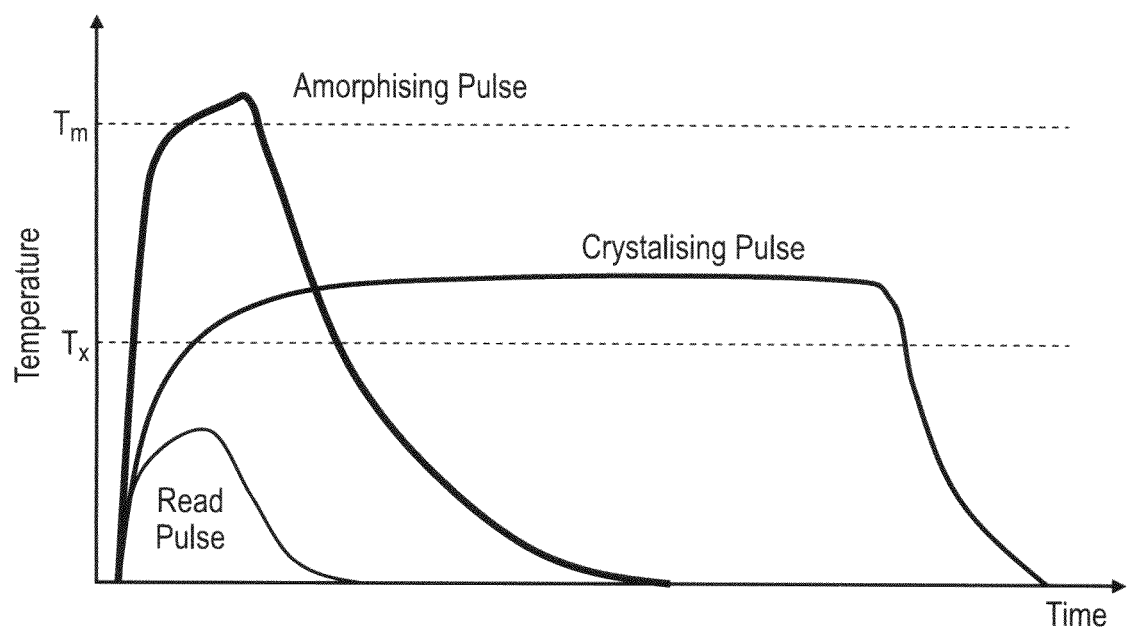
FIG. 1 is a graphical representation of the programming of a phase change memory element of an embodiment of the invention in which phase change memory material temperature is plotted on the abscissa. The graph illustrates the different regimes of a programmable memory element. The temperature increase can be induced through energy of many forms including electrical and optical. A crystallising pulse introduces a phase change from glass to crystal. An amorphising pulse introduces a phase change to an amorphous state by melting the crystal and cooling relatively quickly. A lower energy electrical or optical pulse is used to read the data by interrogating the phase.
Figure 2:
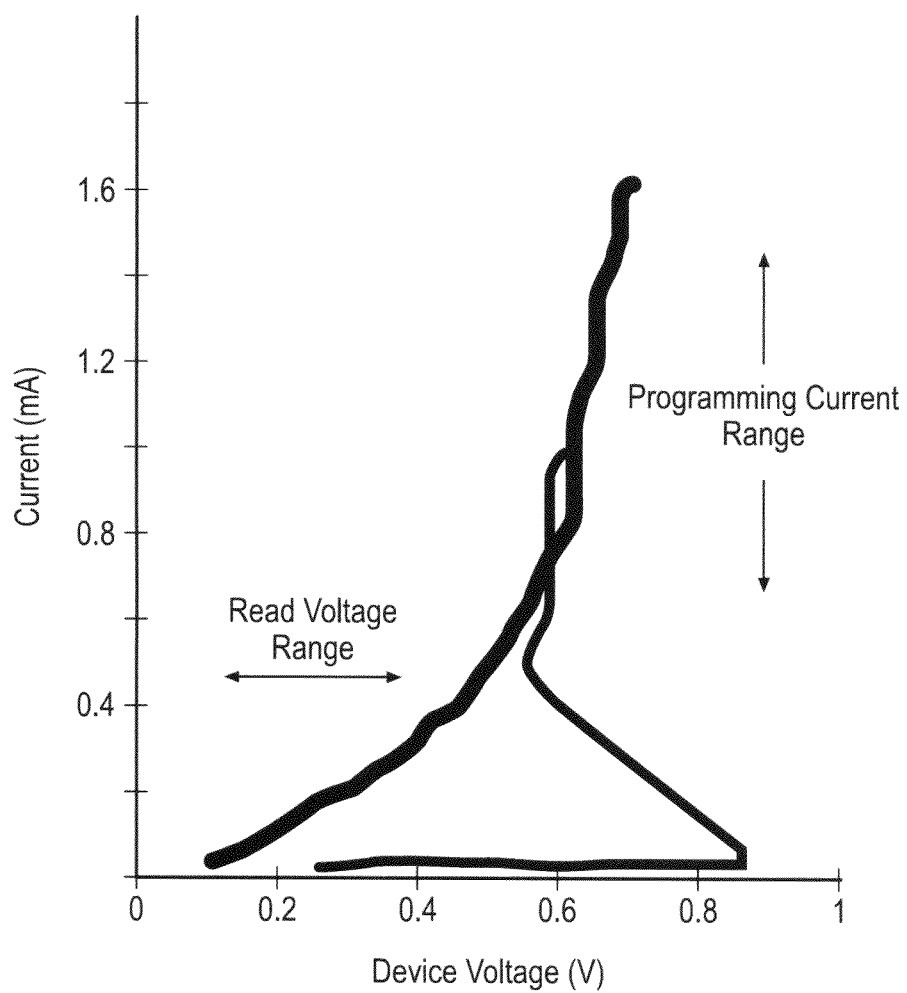
FIG. 2 is a graphical representation of an electrical memory element of an embodiment of the present invention in which device resistance is plotted on the ordinate and the amplitude of the applied current pulse is plotted on the abscissa. The graph illustrates the different programming regimes of the universal memory element.
Figure 3:
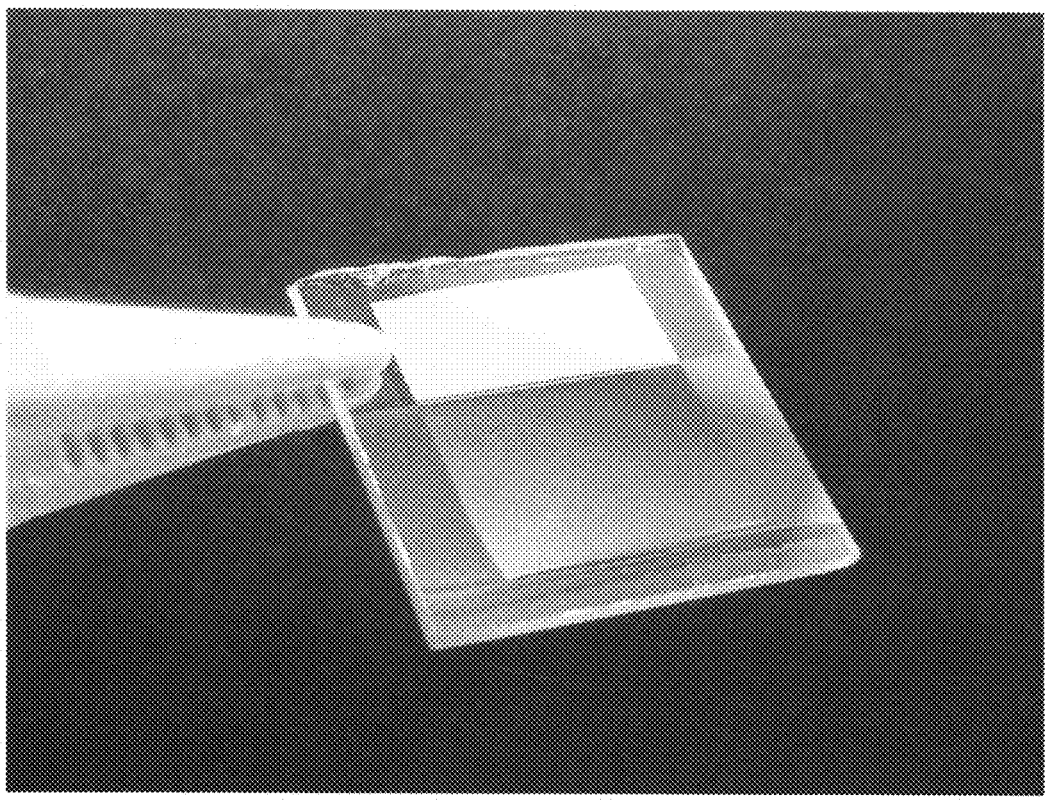
FIG. 3 is a photograph of a single cell memory chip prototype according to an embodiment of the invention for reversibly switching a GLS phase change alloy in the form of a thin film deposited by physical vapour deposition with aluminium electrodes.

FIG. 3 shows the device which is fully operational. A silver epoxy was used to connect the lower and upper metal layers to a Keithley 238 voltage source and ammeter. The I-V characteristic of the device was then measured.

Figure 4:
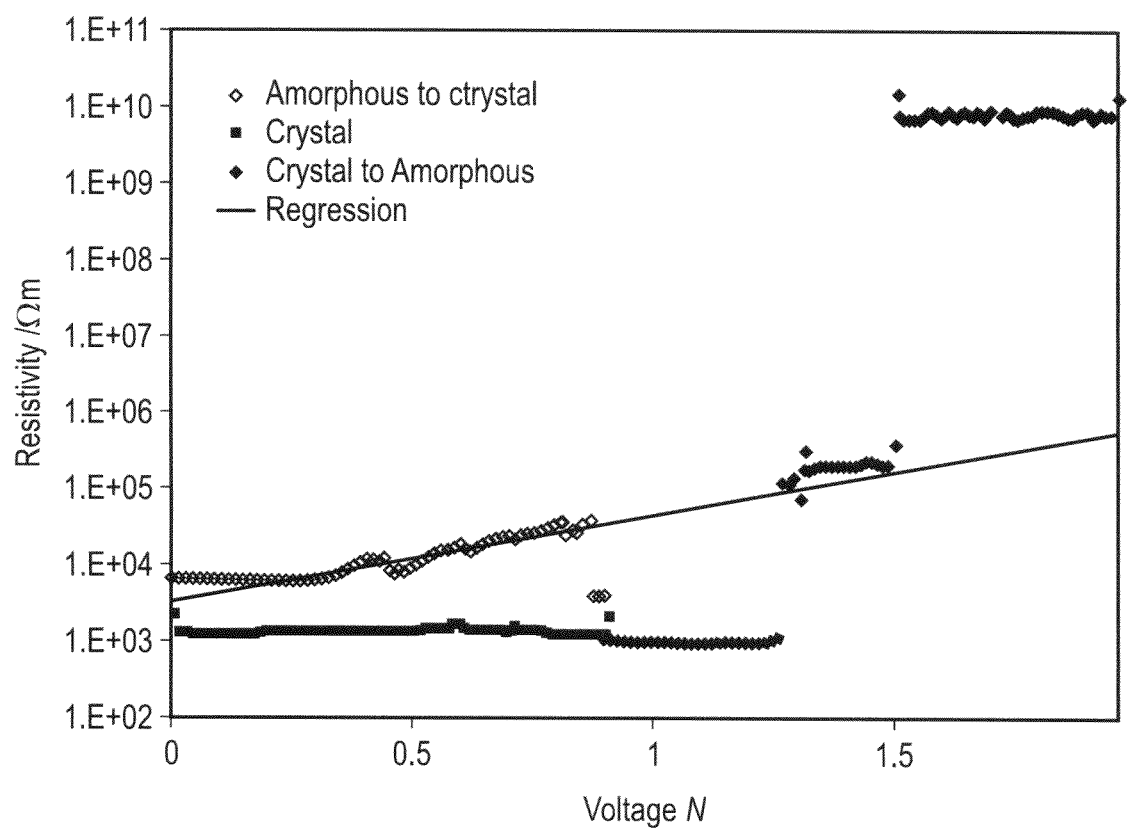
FIG. 4 is an experimental measurement performed on the GLS single cell memory chip shown in FIG. 3. The resistivity as a function of the applied voltage is plotted and an amorphous-to-crystal and crystal-to-amorphous phase change is observed.

FIG. 4 clearly shows the switching nature of the chalcogenide film. At 1.2V the current drops almost to zero. The resistance is given on a logarithmic scale. If one extrapolates the curve before the switch to the voltage where the material again switches to a lower conductive state, one can see that the extrapolated curve has the same values as those measured, indicating that the material has switched back to its initial state. Increasing the voltage further causes the film's resistivity to increase by another four orders of magnitude.

Figure 5:
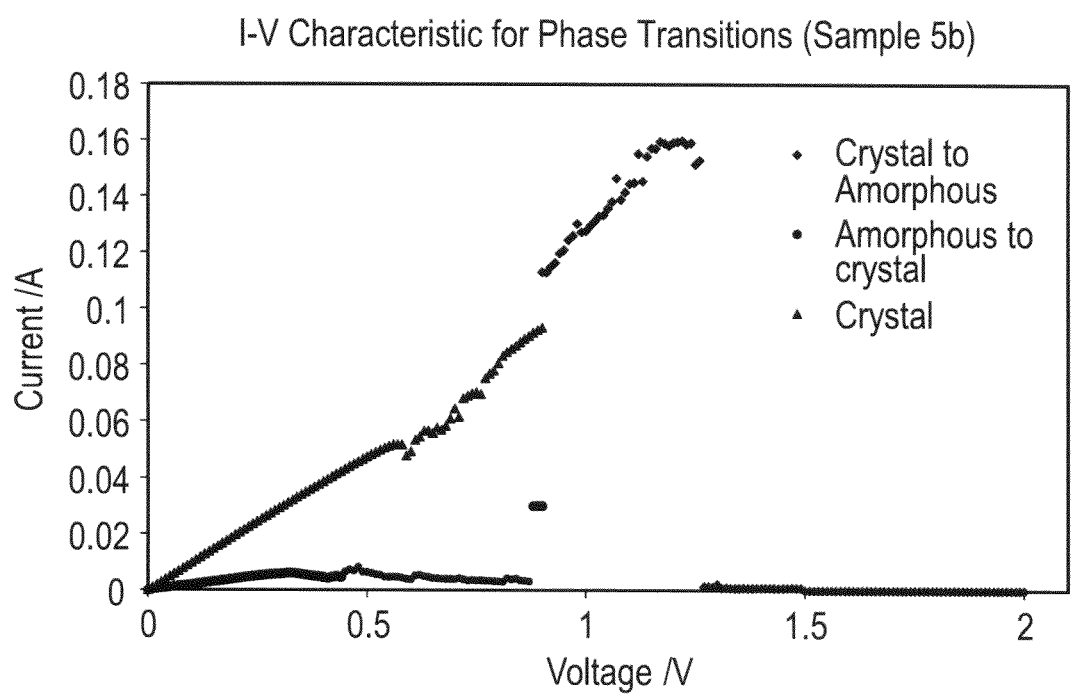
FIG. 5 is an experimental measurement performed on the GLS single cell memory chip shown in FIG. 3. The current as a function of the applied voltage is plotted and an amorphous-to-crystal and crystal-to-amorphous phase change is observed.

FIG. 5 shows the I-V characteristics of the device and again illustrates the switching nature of the GLS phase change alloy.

Example 2

Electrical Phase Change Memory Cell Array

In this example we demonstrate the operation of our GLS phase change alloy as an electrical data storage element. We demonstrate electrical phase change behaviour of an array of memory cells fabricated from a range of GLS alloy compositions. The phase-change alloy comprises Ga, La, and S in which the Ga to La to S ratio is chosen to vary over a wide range. Here the phase-change alloy comprises Ga, La, S in the ratio Gaw Lax Sy where $5<w<10$, $25<x<35$, $50<y<70$ with $w+x+y=100\%$.

As in the previous example, metallic tracks were thermally evaporated onto a suitable substrate using an Edwards coater. The tracks were fabricated from Chromium since its melting point (1907° C.) is far greater than that of the aforementioned GLS phase change alloy. The tracks were typically 1 mm width, 200 nm depth and 50 mm length. The phase change alloy GLS was then deposited by pulse laser deposition onto the surface electrodes and substrate. The substrate was not rotated or moved during deposition thus a compositional gradient was deposited in which the relative concentrations of Ga, La and S varied across the array. This allows verification in parallel of a range of GLS alloy compositions.

An upper layer of Cr electrode tracks was then evaporated perpendicular to the original tracks. At the intersection between the two electrodes the GLS alloy is sandwiched and thus can be electrically addressed. Each intersection forms a GLS phase change memory cell.

Figure 6A:
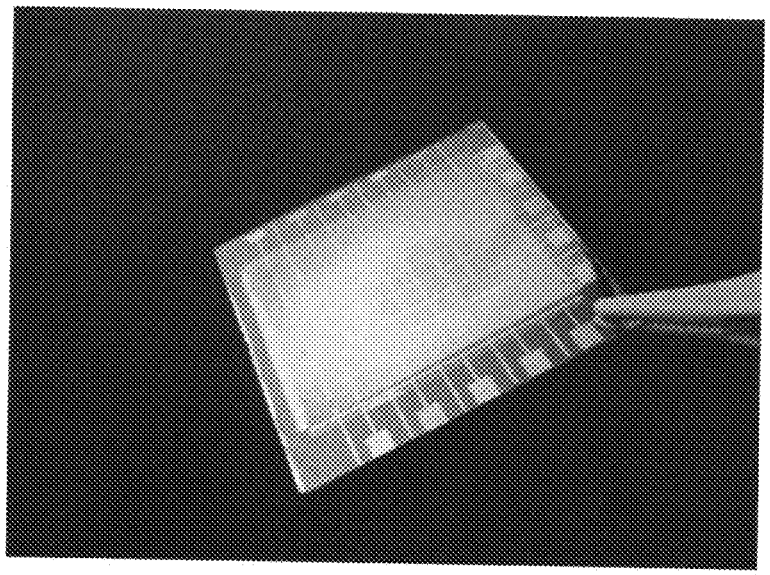
FIG. 6 is a 10×10 cell memory array fabricated by depositing a gradient of varying Ga:La:S illustrating (a) top view and (b) bottom view.
Figure 6B:
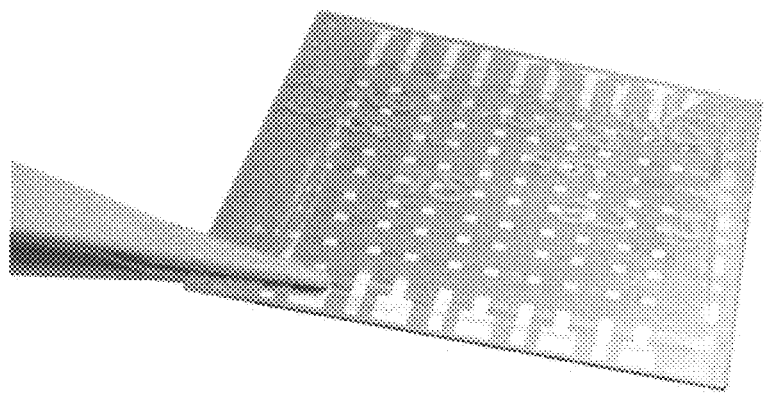

FIG. 6 is a photograph of this memory array.

Figure 7A:
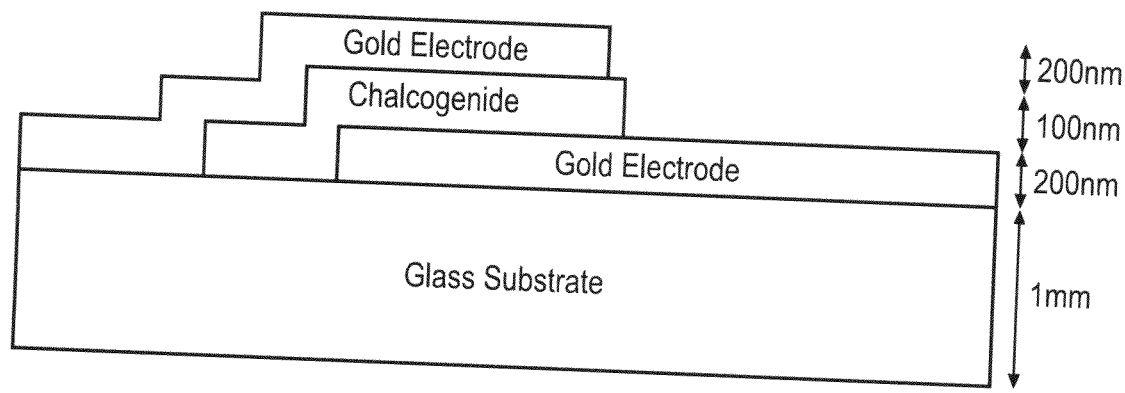
FIG. 7 illustrates schematically the structure of the 10×10 memory cell of FIG. 6 where (a) is the side view of an individual memory cell and (b) is a three dimensional view detailing the electrode configuration.
Figure 7B:
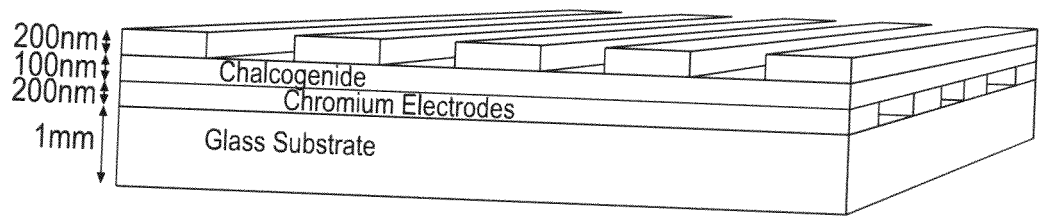
Figure 8A:
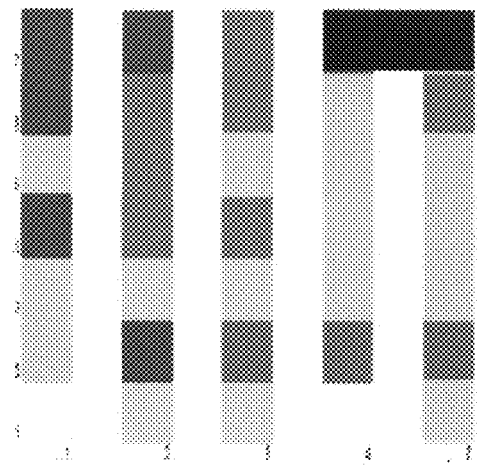
FIG. 8 shows the experimentally measured composition of the graded GLS alloy across the 10×10 memory cell array of FIG. 6 where (a) shows schematically the position of and numbering of each memory cell and (b), (c) and (d) show the experimentally measured atomic percent of the elements Ga, La and S, respectively.
Figure 8B:
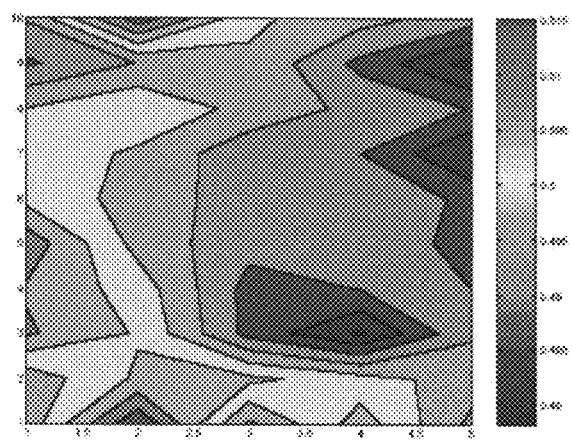
Figure 8C:
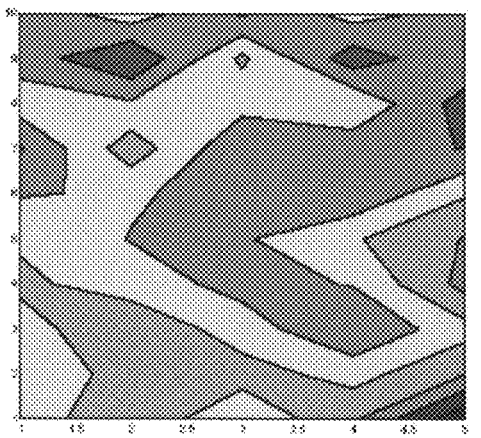
Figure 8D:
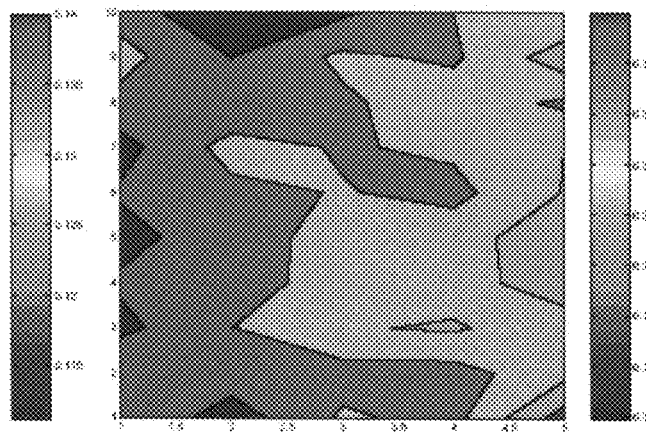

FIG. 7 illustrates schematically the structure of the 10×10 memory cell. Here (a) is the side view of an individual memory cell and (b) is a three dimensional view detailing the electrode configuration. Electrical energy is delivered through a first contact and a second contact to an individual programmable volume of the GLS phase change alloy. Using techniques such as pulsed laser deposition the films composition can be made to vary widely across the substrate. Compositional analysis can then be performed on the sample to analyse the composition at each memory intersection.

FIG. 8 shows the compositional range measured for the individual cells. Here we have used energy dispersive X-ray spectrometry (EDX or EDS) to experimentally measure the atomic percentage of each of the elements Ga, La and S across the entire memory cell array. From the variation of composition so measured we verify that each of the contacts is adjoining a volume of memory material of different alloy composition. The individual cells have been analysed electrically by their IV characteristics.

Figure 9:
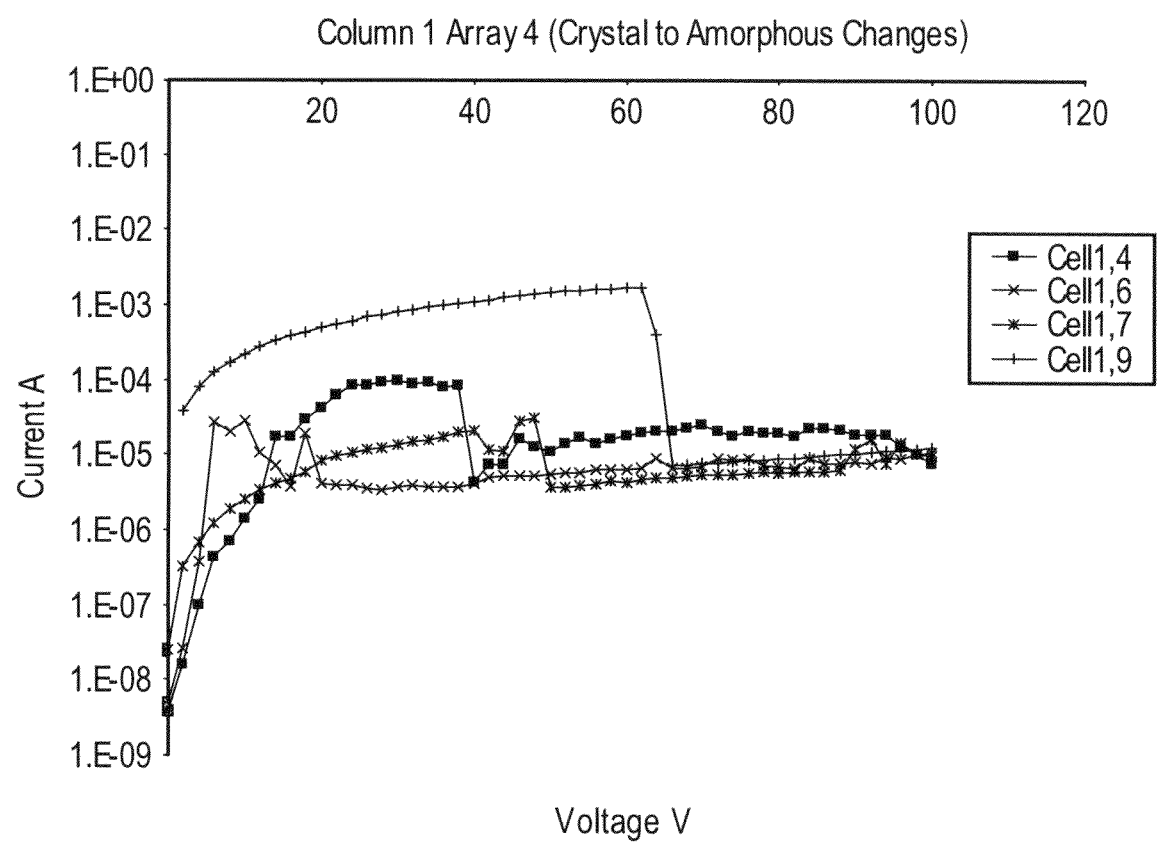
FIG. 9 shows the operation of four cells within the 10×10 cell memory chip of FIG. 6 illustrating the I-V characteristics.

FIG. 9 shows the IV characteristics of four cells within the 10×10 cell memory chip array. Some of the cells appeared to be initially highly conductive, indicating a crystalline film. By increasing the voltage, and thus the current across the film, some of the cells showed phase change behaviour. Some of the cells analysed showed the potential for multi-bit storage.

Figure 10:
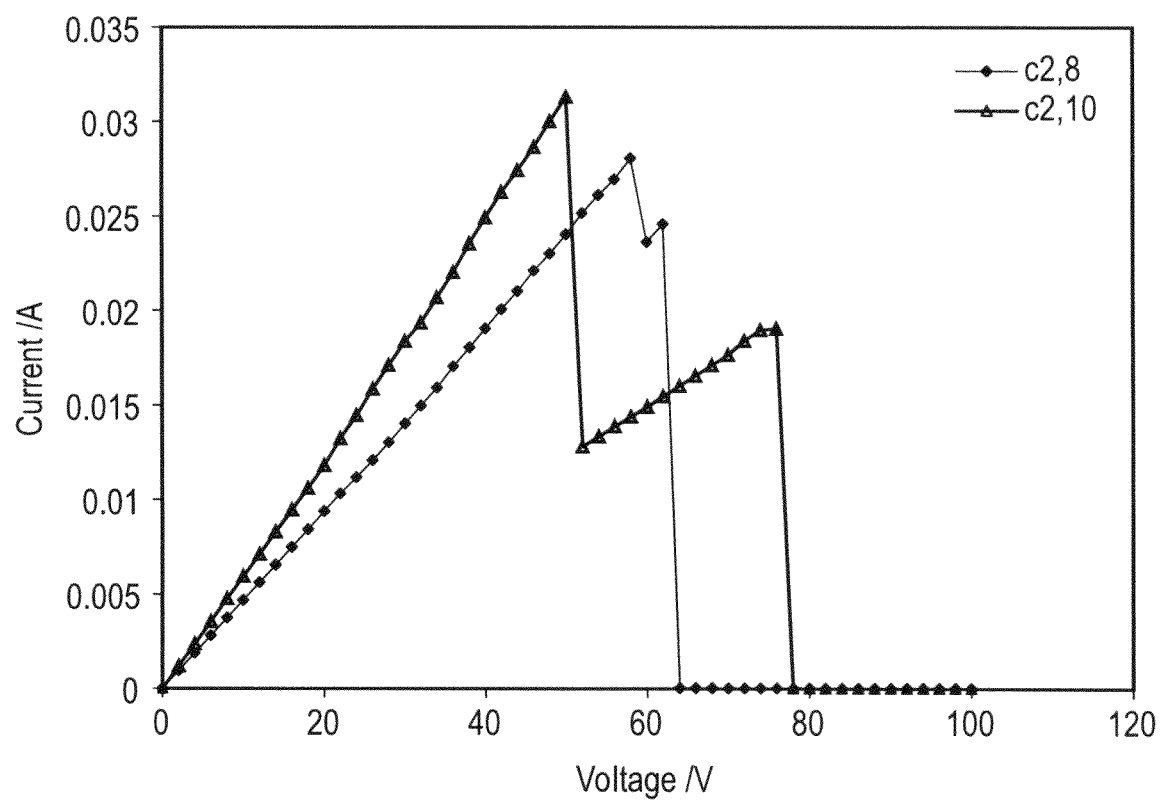
FIG. 10 shows the operation of two cells within the 10×10 cell memory chip of FIG. 6. One curve representing cell (2,10) illustrates 3-state multi-bit storage.

FIG. 10 shows IV characteristics for two of the cells which displayed three discrete levels of resistance.

Example 3

GLS Alloy Optimisation

In order to optimise the Ga:La:S glass system for phase change applications, an experimental study was made to analyse the crystallisation kinetics of a series of glasses with varying Ga to La ratio. Small deviations from the eutectic composition cause a great increase in the crystallisation time. At the eutectic composition it is possible to crystallise traditional phase change materials in just 30 ns, but if one deviates from this eutectic by only 10% the crystallisation time increases to over 1 μs. This underlies the need to design a phase change material at the eutectic composition.

Early studies to measure the eutectic of Ga:La:S based glasses were flawed due to the lack of phase-pure raw materials, in particular phase-pure gallium sulphide. To avoid this problem, phase-pure materials were synthesised and verified using the method described in U.S. Pat. No. 6,803,335 [79].

The synthesis of phase-pure GaS was achieved by batching equal molar quantities of pure Gallium (99.99999%) and sulphur (99.999%) into a $SiO_2$ ampoule. Roughing and oil diffusion pumps were used to create a vacuum of $4\times10^{-5}$ mB in the ampoule and it was then sealed with a hydrogen/oxygen torch. The ampoule was then placed in a rotating furnace and heated at a rate of 15° C./min to 1100° C. After 6 hours at 1100° C. the furnace was allowed to naturally cool to room temperature. The result was a leafy, yellow material. A similar procedure allowed the synthesis of phase-pure $Ga_2S_3$.

The materials synthesised were analysed by powdered X-Ray diffraction which verified their purity and the existence of a single phase material. Differential Thermal Analysis (DTA) was also performed on the compounds in order to measure their melting points. The $Ga_2S_3$ melted at 978° C. whilst the phase-pure GaS sample prepared by sealed ampoule synthesis melted at 940° C. Similar non-phase-pure compounds prepared by other techniques such as sulphurisation of gallium (GaS 1:4) had two melting events at 876° C. and 903° C. The single unique melting point of our compounds indicated phase purity.

A series of pure GaLaS glass samples each approximately 10 g in weight were then fabricated from the phase-pure raw materials. The precursor materials are loaded into vitreous carbon crucibles whilst in a controlled nitrogen environment. They are then transferred into a dry argon purged furnace. At this point the furnace is heated from room temperature to 1150° C. at a temperature increase of 15° C. per minute. The samples are held at 1150° C. for 24 hours. They're then pushed into a water cooled jacket were they are rapidly quenched to form a glass. Once the glass has cooled to room temperature it was then annealed. The GLS is removed from the crucibles and placed in vitreous carbon boat. Once again this is placed into the furnace and heated to 550° C. at a rate of 0.5° C. per minute and then held at 550° C. for 6 hours before being cooled down to room temperature at 0.5° C. per min.

Differential Thermal Analysis (DTA) was also performed on the samples to measure their melting points. In this way, the transition from a solid to liquid phase could be determined.

Figure 11:
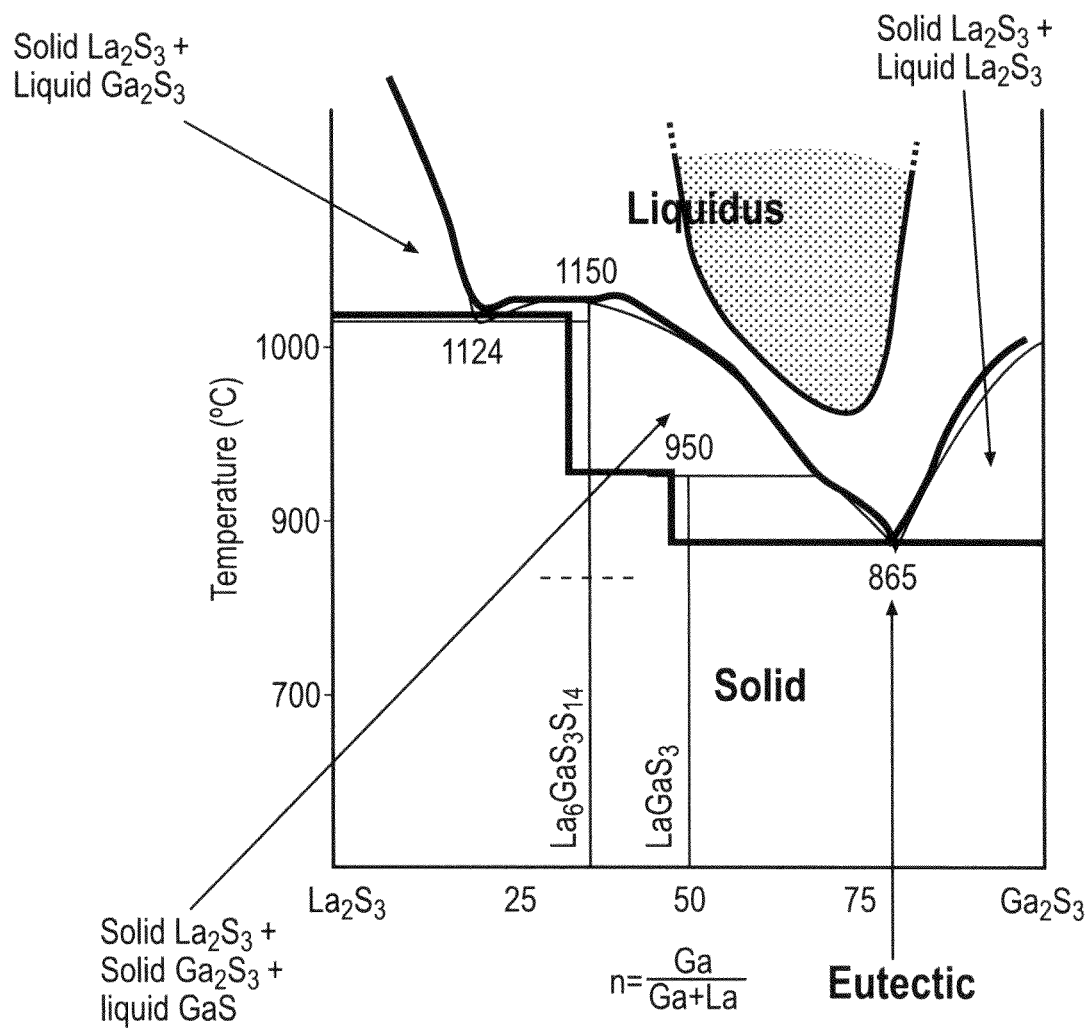
FIG. 11 is a eutectic diagram illustrating the solid and liquid phases of the GLS phase change alloy, indicating the existence of a eutectic point when n=75, that is at 75% atomic percent of gallium, taken from J. Flahaut, M. Guittard, A. M Loireau-Lozac'h. 1983. Rare Earth Sulphide and Oxysulphide Glasses. Glass Technology, volume 24, pages 149-155 [80].

FIG. 11 is a eutectic diagram illustrating the solid and liquid phases of the GLS phase change alloy, indicating the existence of a eutectic point when n=75, that is at 75% atomic percent of gallium (see J. Flahaut, M. Guiffard, A. M Loireau-Lozac'h. 1983. Rare Earth Sulphide and Oxysulphide Glasses. Glass Technology, volume 24, pages 149-155 [80]). It is well known in the art that this eutectic diagram in the literature was obtained with impure raw materials, contaminated by both lanthanum oxide and by mixed phases.

Figure 12:
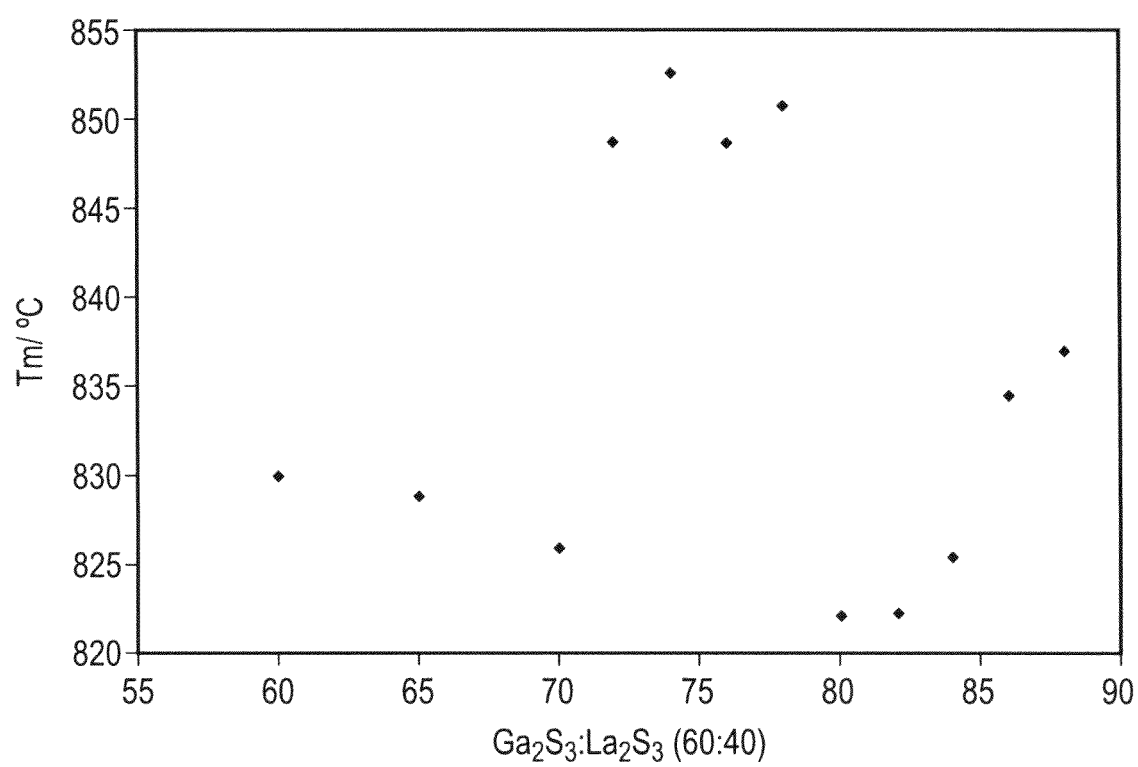
FIG. 12 is an experimental measurement of the onset of melting temperature for a Ga:La:S alloy in which the Ga:S and La:S ratio is fixed at 40:60 respectively and the Ga to Ga+La ratio is varied between 55 and 90%. This discontinuity in the melting temperature at around n=75% experimentally confirms the presence of a eutectic composition. The higher melting temperatures for the four experiment points between n=70 and 80 represent the liquidus or temperature of complete melting.

FIG. 12 is an experimental measurement plotting the temperature of onset of melting for a Ga:La:S alloy in which the Ga:S and La:S ratio is fixed at 40:60 respectively and the Ga to Ga+La ratio is varied between 55 and 90%. The observed discontinuity in the melting temperature at around n=75% experimentally confirms the presence of a eutectic composition with a higher melting temperature, as evidenced by the four experiment points between n=70 and 80 representing the liquidus, i.e. temperature of complete melting.

Example 4

GLS Alloy Crystallisation Activation Energy

By way of experimental analysis we show that one of the optimised phase-change alloys comprising Ga, La, and S has favourable characteristics for electrical and optical phase change memory devices. Here we show experimentally that the Ga to La to S ratio can be chosen to minimise the activation energy for crystallisation thereby optimising one of the key specifications of a phase change memory device, namely its power consumption.

For a series of identical samples, the thermal characteristics of the glass were measured using differential thermal analysis.

| Glass | Glass Composition | | |
|---|---|---|---|
| Code | GaS1:6 | $La_2S_3$ | $La_2O_3$ |
| LD1207(1) | 65 | 29 | 6 |
| LD1209(1) | 70 | 0 | 30 |

Glasses were prepared by the method outlined in Example 3. Two glasses were analysed; their compositions are listed in table 4.1. A TA Instruments SDT Q6000 DSC was used to analyse the thermal properties of the glasses. The glasses were quickly heated to 450° C. Once the temperature of the two arms of the DSC had equalised at 450° C., the DSC was programmed to increase the sample's temperature at a constant rate to 900° C. (below the melting point of the glass). For each run a new sample of glass, typically 15 mg, was placed in the DSC. Care was taken not to disturb the placement of the sample holder in the instrument. The instrument was calibrated for heating rates of 5; 10; 20; 30; 40 and 50° C. per min and then the samples were examined for these pre-calibrated rates.

Figure 13:
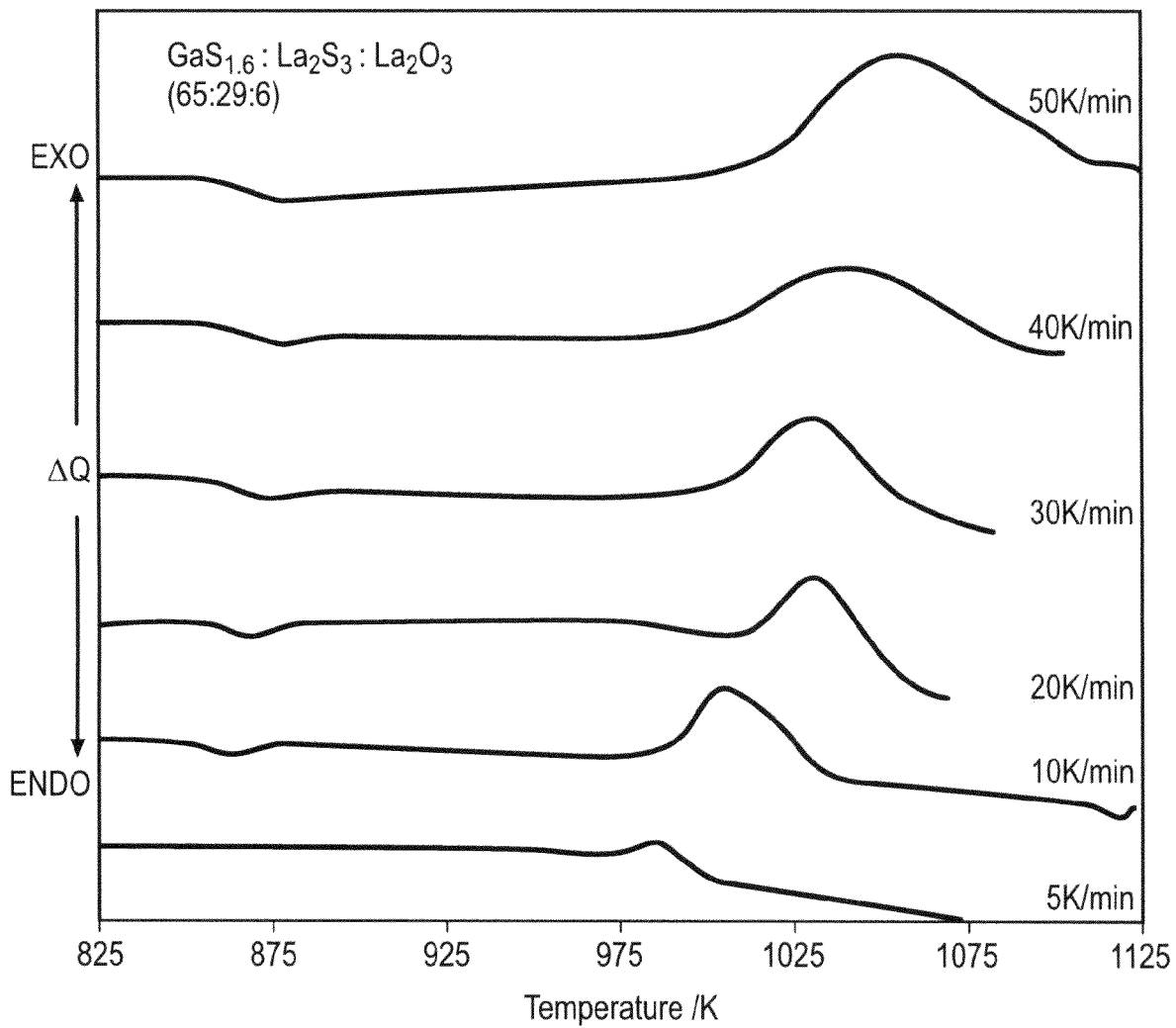
FIG. 13 shows the DTA traces for each of the series of glasses heated at varying rates from 5 to 50 K min$^{-1}$.

FIG. 13 shows the DSC plots for the heating rates listed above. Non-isothermal analysis of these crystallisation kinetics can be performed using the Kissinger method to determine the crystallisation activation energy.

Kissinger (Kissinger, Horner E. 1957. Reaction Kinetics in Differential Thermal Analysis. Analytical Chemistry, 29, 1702-1706 [82]) suggested the formula:

$$\ln(\alpha/T_p^2) = \ln(C) - E_c/RT_p$$

where $\alpha$ is the heating rate, $T_p$ is the peak of the crystallisation temperature, C is a constant, R is the molar gas constant, and $E_c$ is the crystallisation activation energy. It is the crystallisation activation energy $E_c$ which we are determining in this analysis. From this equation, one can see that a graph of $\ln(\alpha/T_p^2)$ against $1/Tp$ would reveal the crystallisation energy through the gradient of the plot.

Figure 14:
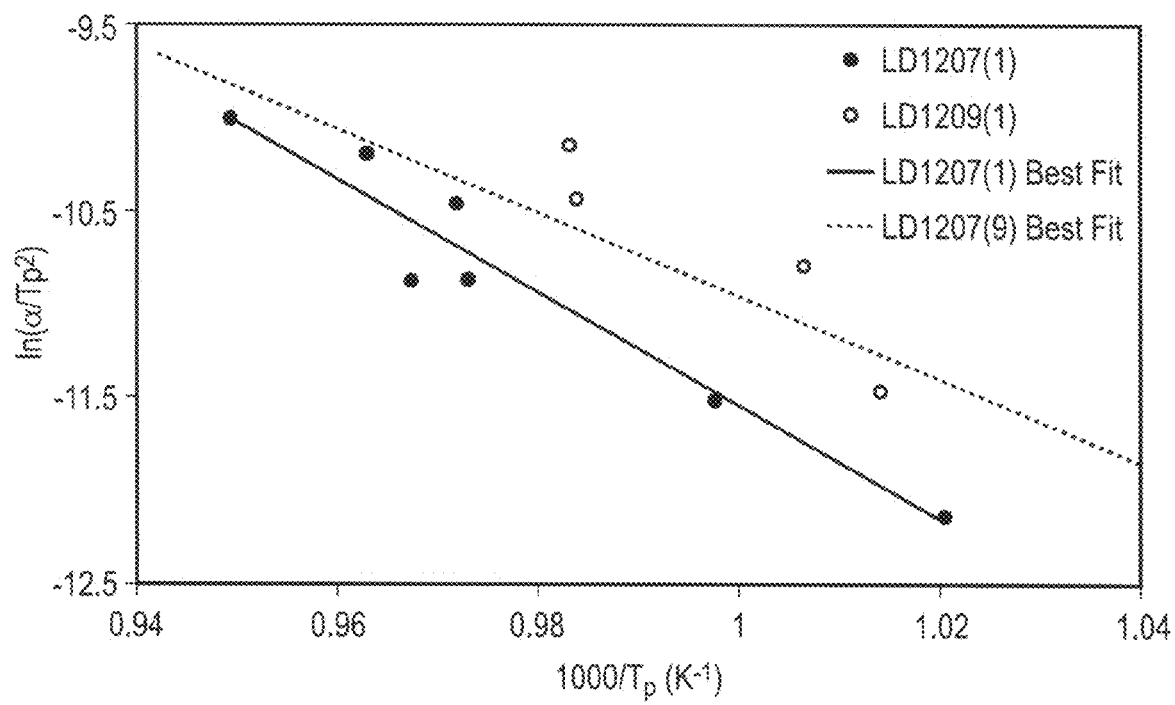
FIG. 14 is an experimentally determined measurement of the activation energy for crystallisation in two GLS alloys through application of the Kissinger method. Sample LD1207(1) has an activation energy for crystallisation, taken from the slope of the line, equal to 265 kJ mol$^{-1}$. Sample LD1209(1), which contains a higher fraction of oxide substituted for sulphur, has the lower activation energy of 186.8 kJ mol$^{-1}$.

FIG. 14 is a plot of this kind, namely $\ln(\alpha/T_p^2)$ against $1/Tp$, for the two samples, LD1207(1) and LD1209(1). The crystallisation activation energies were calculated from the gradients and found to be 265 kJ/mol and 186.8 kJ/mol respectively.

In comparison, applying the Kissinger method to determine the activation energy for crystallisation to the hexagonal phase of 2:2:5 Ge:Sb:Te phase change materials has been previously shown to reveal an activation energy of 215.2 kJ/mol (see Kyratsi et al Advanced Matter 2003, 15(17) $3^{rd}$ September [83])

Example 5

Thin Film Fabrication

Formation of electrical phase change memory devices or optical recording media requires deposition of individual layers of the phase change alloy in thin film by reliable and reproducible methods.

By way of experimental demonstration, we show that evaporative deposition, chemical vapour deposition, plasma deposition including sputtering, glow discharge, and plasma assisted chemical vapour deposition and spin-coating techniques can be readily used with the phase change materials disclosed herein.

Trial thermal evaporation of GLS glass was performed with an Edwards coater. A glass sample (70GaS1:4:24$La_2S_3$: 6$La_2O_3$) was ground with a mortar & pestle to form a GLS glass powder. The powder was then weighed and loaded into a tungsten holder. Once placed in the evaporation chamber, the chamber was pumped down to a vacuum of $5.0 \times 10^{-6}$ mBar. A current of between 1 and 3 Amperes was used to heat the tungsten holder and the glass powder was evaporated onto both borosilicate and calcium fluoride slides. Film thickness on the order of 100 nm were deposited.

Figure 15:
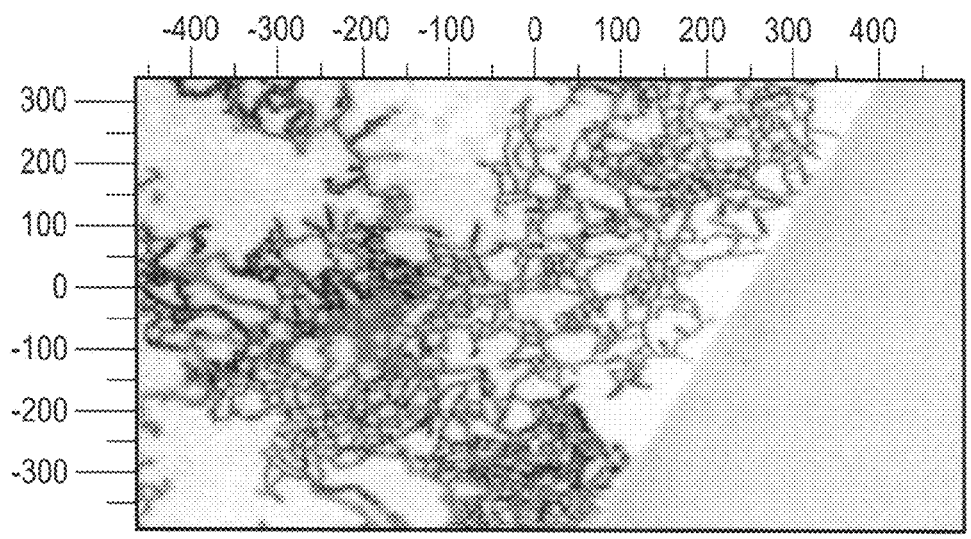
FIG. 15 is of a thin film of 100 nm thickness showing crystalline and glassy phase on thermally evaporated GLSO (scale in micrometers).

FIG. 15 illustrates a slide of the evaporated material. Here the thin film of 100 nm thickness shows crystalline and glassy phases. It will be readily apparent to those skilled in the art that there are two common ways of heating the source, namely by passing a large electric current through a tungsten holder or wire which is in thermal contact with the source, or by directing a beam of electrons (e-beam) onto the source material. The electron beam causes highly localised heating of the source material due to the bombardment of the electrons on the source's surface.

A second, more preferred method of deposition is through the use of physical vapour deposition techniques such as sputtering. Here a glass target of diameter 65 mm, with a molar composition of 70GaS:24LaS:6LaO was prepared and loaded in an Oxford Instruments RF sputterer. The sputtering technique allows very thin films to be deposited onto a wide variety of substrates and can be used to create very thin, uniform films in a most cost effective way. It can also be used to apply both conductive and insulating materials to any type of substrate including heat sensitive plastics, since sputtering is a cold momentum transfer technique.

Figure 16:
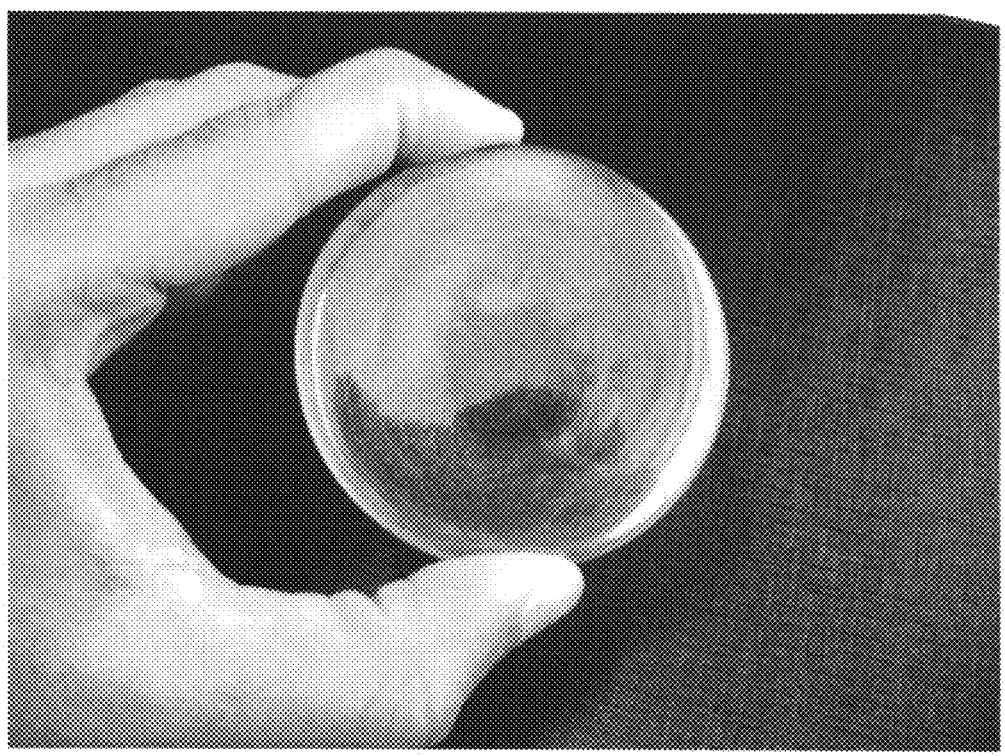
FIG. 16 illustrates a 2.5 inch (approx. 62.5 mm) sputtering target fabricated by melting gallium, lanthanum and sulphur compounds for use in thin film deposition by radio frequency (RF) sputtering.

FIG. 16 illustrates a sputtering target fabricated by melting gallium, lanthanum and sulphur compounds.

Figure 17:
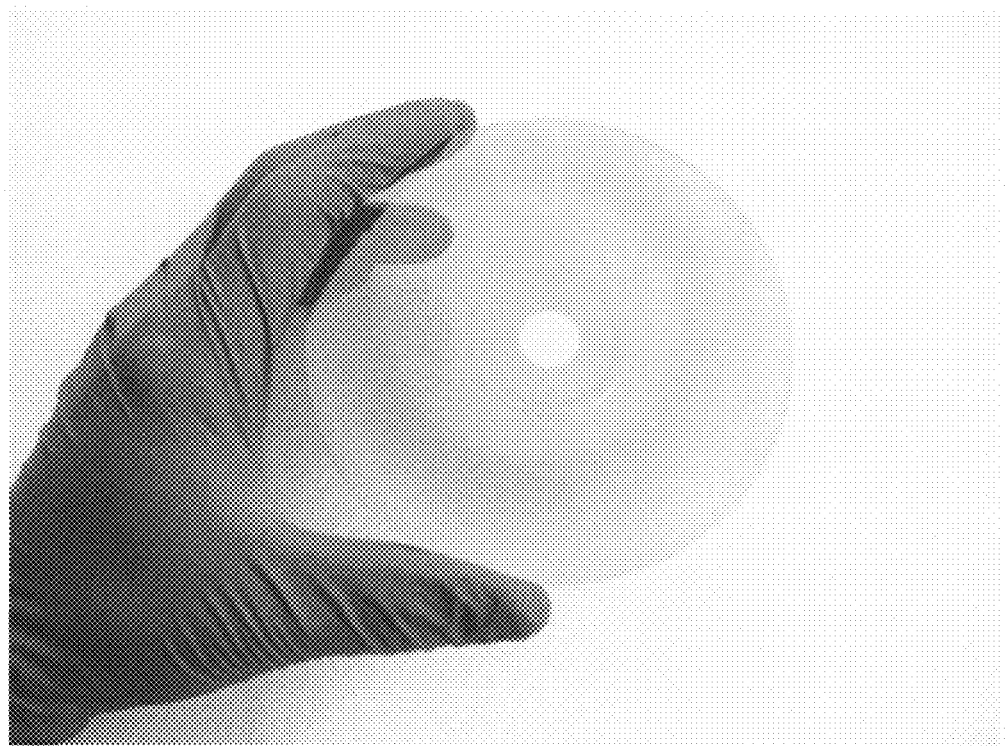
FIG. 17 shows a Ga:La:S thin film deposited on a plastic substrate to a thickness of up to 2000 nm at a deposition rate of 5 nm per minute.

FIG. 17 shows the resulting thin film, deposited in this case on a plastic substrate.

As part of this work, an experimental study into the characteristics of gallium lanthanum sulphide films deposited by pulsed laser deposition was also undertaken. Pulsed Laser Deposition (PLD) uses a short pulse of laser radiation to ablate the surface of a target thus creating a plasma plume of the target material. If the plume comes into contact with a substrate, it is possible to coat the substrate with the contents of the plume.

A stainless steel vacuum chamber at pressures $10^{-4}$ mbar was used to contain the borosilicate substrates and a target of atomic composition was 72.5$GaS_{1.4}$: 27.5$La_2O_3$. A KrF excimer laser which operates at a wavelength of 248 nm was used to ablate the surface of target and the plume was directed perpendicular to the substrate. It is also possible to heat the substrate using a $CO_2$ laser during deposition. The properties of the resultant thin film can be altered through careful control of the background gas and its pressure, the pulse energy, laser wavelength, pulse duration, substrate temperature and target-to-substrate distance.

Figure 18:
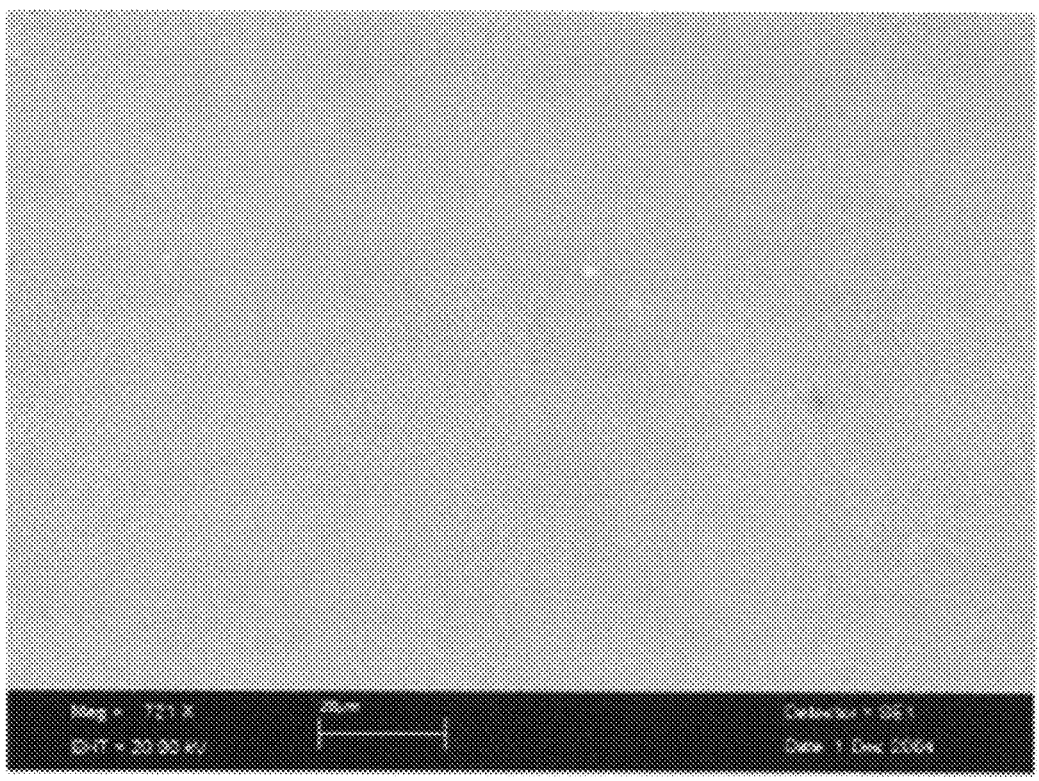
FIG. 18 is an SEM image illustrating the surface uniformity of a thin film deposited by pulsed laser deposition from a target composed of $72.5GaS_{1.4}: 27.5La_2O_3$.

FIG. 18 illustrates a thin film grown by pulsed laser deposition under the conditions of a pulse energy of 120 mJ, pulse duration of 20 ns, target substrate separation of 20 mm and $N_2$ background gas at $3.5 \times 10^{-4}$ mbar.

Scanning Electron Microscopy (SEM) was also performed on the films to reveal the morphology and composition. It was verified that the resulting films contained $N_2$ doping as a consequence of the background gas within the chamber and it would be apparent that similar doping with oxygen or other process gases would be possible.

Another advantage of PLD is the ease at which multi-layered structures can be fabricated by simply moving different targets into the laser's beam.

Chemical Vapour Deposition (CVD) is a process of reacting gasses on the surface of a heated substrate. The heat from the substrate supplies energy which can activate the chemical reactions which forms the solid film and the reaction by-products. We have synthesised high purity germanium and antimony sulphide through reaction of $GeCl_4$ and $SbCl_4$ respectively with $H_2S$ at temperatures of 450° C.-600° C.

Figure 19:
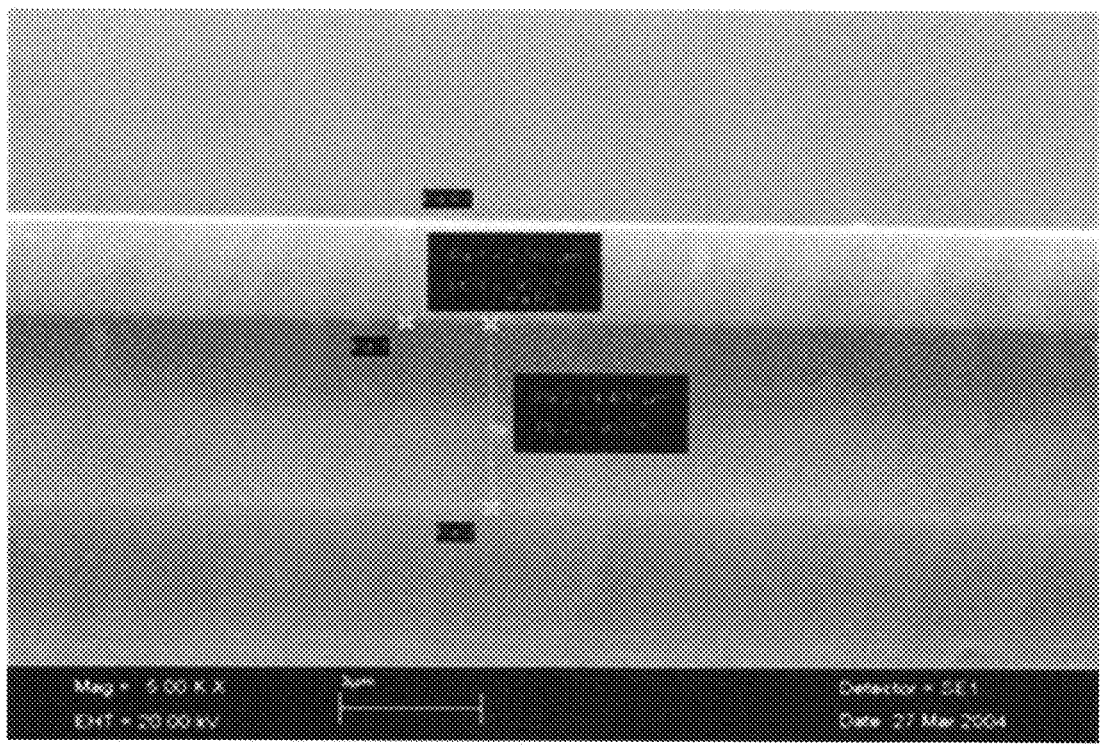
FIG. 19 is an SEM image illustrating high purity germanium and antimony sulphide through reaction of $GeCl_4$ and $SbCl_4$ with $H_2S$. Film thickness was measured to be 2.4 and 4.4 micrometers respectively

FIG. 19 illustrates a cross-section through such a sample. Experimentation has shown that factors such as chalcogenide composition, thin film thickness, stoichiometry, and impurity levels can be controlled in a reproducible manner. In addition, multilayered structures can be deposited. Through standard techniques well known to those skilled in the art, shapes and designs within the thin films can be achieved.

The composite memory material may also be formed by a spin coating process. The phase-change material may be a heterogeneous mixture of a phase-change material and a dielectric such as an organic-polymer-like polyamide. The resulting mixture may then be spin coated onto a silicon substrate forming a composite memory material with the desired properties. Alternatively, the glass compound itself can be heated to its liquidus and deposited on a suitably heated substrate to directly form a glass thin or thick film.

Figure 20:
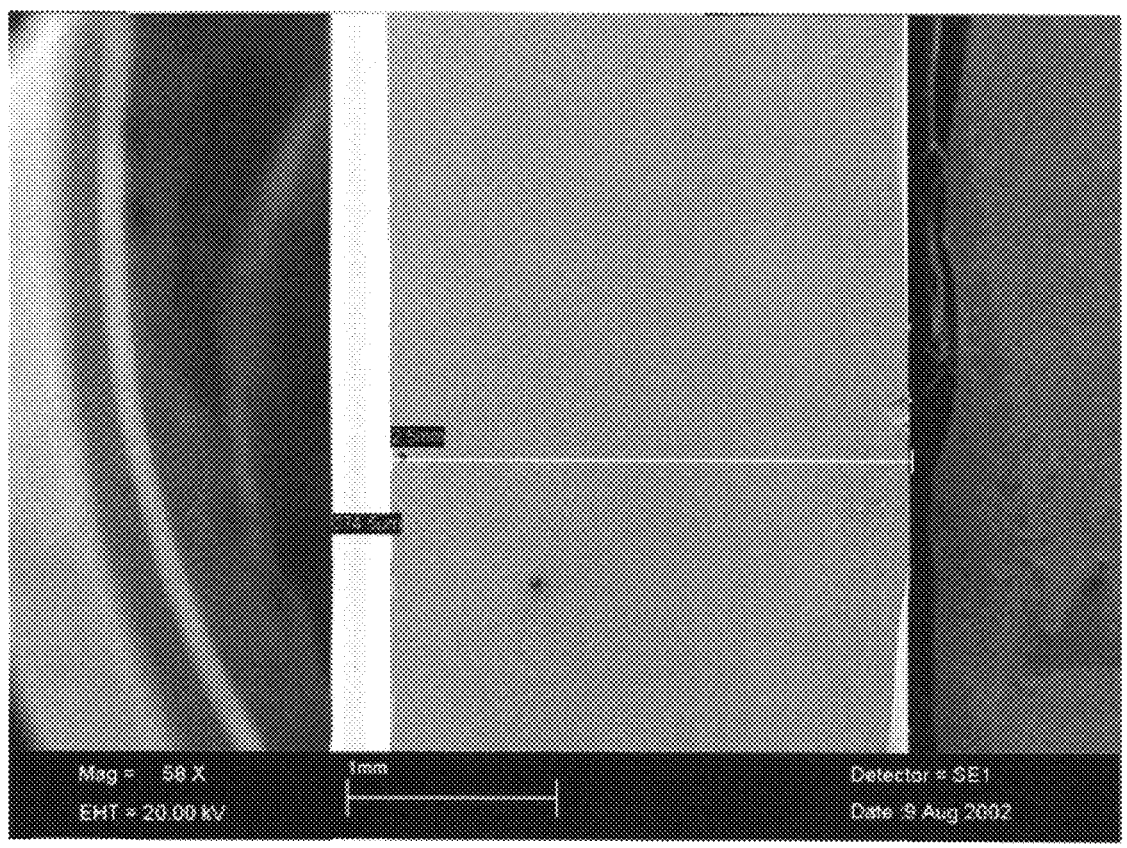
FIG. 20 is an SEM image of a 275 micrometer thick film of Ga:La:S glass deposited by spin coating on a 2.5 mm thick Ga:La:S substrate.

FIG. 20 illustrates such a film.

Example 6

Optical Phase Change

Experiments have been performed on a GLS thin film to demonstrate the suitability of these materials for optical data storage. A disc structure having a substrate, and a gallium lanthanum sulphide recording layer was fabricated using the method of Example 5.

Figure 21:
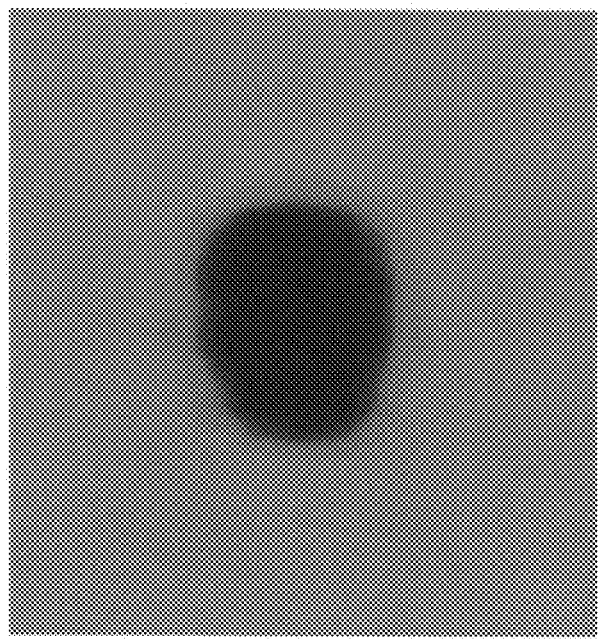
FIG. 21 illustrates the result of exposure of a gallium lanthanum sulphide based glass to pulsed laser illumination at 830 nm. A permanently photodarkened area is clearly visible, by which single bits or multiple bits of information can be optically stored and read.

FIG. 21 illustrates such a sample of gallium lanthanum sulphide glass after it was exposed to pulsed laser illumination at 830 nm. A permanently photodarkened area is clearly visible, by which a single or multiple bits of information could be optically stored or read.

In this particular example, the glass composition was $70Ga_2S_3:30La_2S_3$ and was exposed to the 830 nm wavelength for 5 seconds at a power density 38 $kW/cm^2$. The power was delivered as a series of 150 femtosecond pulses at a frequency of 250 kHz. It is to be understood that this example is not intended to limit either the wavelength, time or intensity of the laser illumination. More importantly, the realisation of a photodarkened area, rather than a crystallised area, presents a significant and novel feature not previously exploited for data storage.

Figure 22:
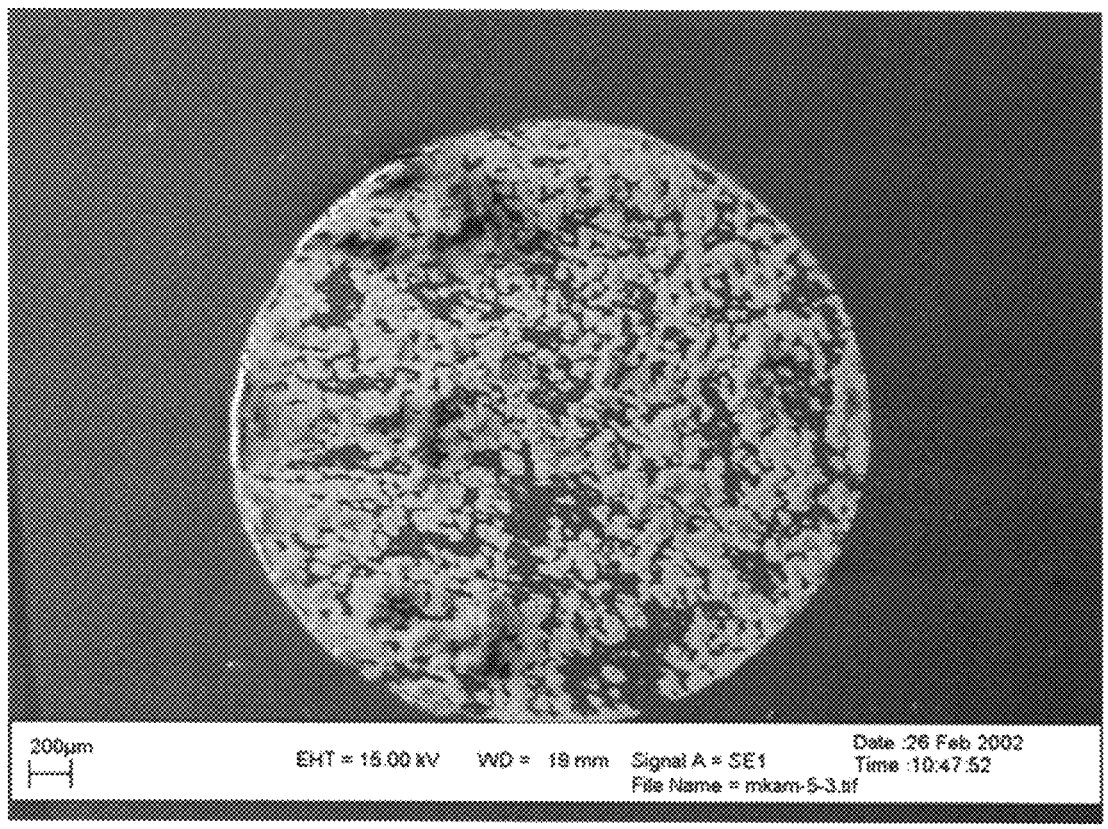
FIG. 22 is an SEM image illustrating the result of exposure of a gallium lanthanum sulphide based glass to pulsed laser illumination at 248 nm. A permanently crystallised area is clearly visible, by which single bits or multiple bits of information can be optically stored and read.

FIG. 22 illustrates a variation to this experiment in which a gallium lanthanum sulphide glass was exposed to pulsed laser illumination at 248 nm. A permanently crystallised area is clearly visible, by which single or multiple bits of information could be optically stored or read.

In this case the laser radiation at 248 nm was delivered at the much lower frequency of 10 Hz, and a total of 30,000 pulses were delivered at an energy density of 9.1 $mJ/cm^2$. In this wavelength regime, the phase change mechanism is a thermal change.

The optical recording medium may have one, two or more recording layers.

The recording layer(s) is preferably formed from GLS material that has been modified with the addition of at least one modifier element. Preferably, this optical recording medium has an erasability that is at least 3 dB, or 5 dB, greater than the erasability of an unmodified optical recording medium (with the same structure) wherein said recording layer is formed from the corresponding unmodified phase-change alloy.

In other embodiments, additional dielectric layers are introduced. For example, a structure may be provided comprising a first dielectric layer, a recording layer, and a second dielectric layer having respective optical thicknesses equal to ¼, ½ and ½ of the wavelength of the laser beam used as the source of optical energy. The first and second dielectric layers are formed from a mixture of a high refractive index material (e.g. ZnS) and a low refractive index material (e.g. $SiO_2$)

In all cases, it is understood that the optical power is above the threshold power for the desired phase change effect, whether it is a thermal or optical change, and below the ablation power or damage threshold of the material.

Example 7

Silver Doping

In this example Ga:La:S based glasses are Ag-doped. We have prepared a silver thin film. This metallic layer is then introduced into the GLS phase change materials by photodissolution to create Ag-doped GLS material.

These Ag coatings were prepared by thermal evaporation deposition directly on the film. An Edward coater E306A was used to carry out this deposition process. The raw material, Ag wire, with a purity of 99.99% was obtained from Agar Scientific. The Ag wire was wound around the tungsten filament and the Ga:La:S glass thin film was situated just above the Ag source in the vacuum chamber. Deposition took place under vacuum with a pressure about $1 \times 10^{-6}$ mbar. The deposition was controlled by a film thickness monitor (gold coated quartz sensor, Z value=16.7 and density=10.5 for Ag) at a rate of 0.1 nm/sec. In this way we were able to deposit a 10 nm thick layer in about 100 seconds. This Ag layer could then be diffused thermally or optically into the recording layer.

The refractive index change following dissolution of 42 nm of Ag doped into the recording layer film has been measured to be in the range between 0.14 and 0.18. This corresponds to a change in reflectivity of between 2 and 2.5%.

Example 8

Modification of Thermal Properties

In another embodiment of the present invention, the phase-change alloy comprises Ga, La, and S in which some or all of the La is substituted with one or more other lanthanide elements Ce, Pr, Nd, Pm, Sm, Eu, Gd, Tb, Dy, Ho, Er, Tm, Yb and/or Lu to provide a doped GLS phase-change alloy.

In one embodiment, the ratio of lanthanide atoms to La atoms (i.e., Pr:La) is chosen as approximately 1:4 representing a substitution of approximately 20% of the La by another lanthanide. In another embodiment, the ratio of lanthanide atoms to La atoms (i.e., Er:La) is chosen as approximately 1:1 representing a substitution of approximately 50% of the La by another lanthanide. More preferably, the phase-change alloy comprises Ga, La, S and doped with one or more of the lanthanides in the ratio Gaw (La+lanthanide)x Sy where $5<w<35$, $5<x<35$, $50<y<70$. More preferably, $w+x+y=100\%$. More preferably, the ratio of 2Ga:3S to 2La:3S is chosen to be 3:1. The combination of these elements form the optical and/or electrical phase-change memory material of the present invention.

Changes in the atomic number, electronic ground state and ion size all contribute to variations in the optical, thermal and electrical properties of the phase change material.

Example 9

Metal Dopants

In another embodiment of the present invention, the modifying elements may be one or more transition metals taken from elements 21 to 30, 39 to 48, 57 and 72 to 80 of the periodic table. Preferably, the transition metal element is selected from the group consisting of Na, Ca, Sc, Ti, V, Cr, Mn, Fe, Co, Ni, Cu, Zn, Sr, Y, Ag, In, Sn, Sb, Cs, Au, Pb, Bi, and mixtures or alloys thereof. More preferably the metal is a transition metal Ti, V, Cr, Mn, Fe, Co, Ni, Cu, Zn. Specific examples of such multi-element systems are set forth hereinafter with respect to the Ga:La:S system with or without any other modifying elements. Table 9.1 shows the variation in glass transition temperature (Tg), onset of crystallisation (Tx) and melting temperature (Tm) that is achieved through doping with a series of transision metals

| Sample | $Ga_2S_3$ (mol) | $La_2S_3$ (mol) | Dopant | Dopant (wt %) | Tg (° C.) | Tx (° C.) | Tm (° C.) |
|---|---|---|---|---|---|---|---|
| LD541 | 70 | 30 | none |     | 558 | 687 | 828 |
| LD542 | 70 | 30 | boron | 5.2 | 559 | 678 | 840 |
| LD542 | 70 | 30 | germanium | 5.2 | 556 | 685 | 822 |
| LD544 | 70 | 30 | antimony | 5.2 | 554 | 678 | 836 |
| LF546 | 70 | 30 | silver | 5.2 | 542 | 666 | 795 |
| LD547 | 70 | 30 | tin | 5.2 | 553 | 680 | 816 |
| LD551 | 70 | 30 | bismuth | 5.2 | 551 | 682 | 814 |
| LD552 | 70 | 30 | indium | 5.2 | 548 | 672 | 804 |
| LD553 | 70 | 30 | cerium | 5.2 | 556 | 691 | 817 |
| LD554 | 70 | 30 | sodium | 5.2 | 546 | 655 | 821 |
| LD557 | 70 | 30 | calcium | 5.2 | 557 | 685 | 843 |
| LD558 | 70 | 30 | yttrium | 5.2 | 558 | 689 | 843 |

Example 10

Other Dopants

In another embodiment of the present invention, the phase-change alloy comprises Ga, La, and S in which some or all of the S is substituted with Se or Te. This is defined herein as GLSSeTe phase-change alloy. We have demonstrated that by substituting some or all of the S by Se, the characteristic temperatures for the phase-change alloy can be reduced and controlled in a reproducible way. Furthermore substitution of S or Se by Te allows further reduction in the characteristic temperatures.

In one embodiment, the ratio of S atoms to Se atoms is chosen as approximately 1:19 representing a substitution of approximately 5% of the S by Se. In another embodiment, the substitution of S by Te is complete, whereby the phase change alloy is represented by the ratio of Ga atoms to La atoms to Te atoms (i.e., Ga:La:Te) is chosen as approximately 3:1:6. More preferably, the optical phase-change alloy comprises Ga, La, S in the ratio Gaw Lax Sy where $25<w<35$, $5<x<10$, $50<y<70$. More preferably, $w+x+y=100\%$. More preferably, the ratio of both Ga atoms to S atoms and La atoms to S atoms is chosen as 2:3 and the ratio of 2Ga:3S to 2La:3S is chosen to be 3:1. Similarly, the ratio of 2Ga:3Te to 2La:3Te is chosen to be 1:1 or 1:3. Similarly, complete substitute of S by Se in similar ratios can be performed to obtain a phase-change allow with higher characteristic temperatures.

In another embodiment of the present invention, the modifying elements F, Cl, Br and/or I may be added to the phase-change alloy to form a halide modified phase-change memory material. As discussed, the atomic percentage of the halide element is preferably between 1.0 and 30 percent, more preferably between 20 and 30 percent. The halide may be conveniently introduced to the alloy by substitution of LaF, LaCl, LaBr or LaI for $La_2S_3$ or by GaF, GaCl, GaBr or GaI for $Ga_2S_3$. Alternatively, other metallic halides, such as Na, K, Rb, Cs may be added to the alloy. Specific examples of the phase-change memory material comprising the above-mentioned phase-change alloy include, but are not limited to, $(30Ga_2S_3\ 70La_2S_3)\ 10LaF_3$; $(30Ga_2S_3\ 70La_2S_3)\ 30CsCl$; $(30Ga_2S_3\ 70La_2S_3)\ 10NaCl$; $(40Ga_2S_3\ 60La_2S_3)\ 10LaF_3$; $(50Ga_2S_3\ 50La_2S_3)\ GaF_3$ $(30Ga_2S_3\ 70La_2S_3)\ GaCl_3$.

Preferably, the phase-change material of the invention includes one or more elements selected from the elements consisting of B, Al, In, Si, Ge, Sn, As, Sb, Bi and mixtures or alloys thereof. The phase-change material preferably includes one chalcogenide and at least Ga or La element and may include a transition metal, oxide, or halide modifying element. More preferably, the chalcogen element is a mixture of S, Se and/or Te.

Example 11

Improved Stability

In another embodiment of the present invention, the phase-change alloy comprises Ga, La, and S in which some or all of the S is substituted with O to form oxide-doped GLS phase-change alloy. In one embodiment, the ratio of O atoms to S atoms is chosen as approximately 1:19 representing a substitution of approximately 5% of the S by O. In another embodiment, the substitution of S by O is equal to the Ga:La ratio, whereby the phase change alloy is represented by j(2Ga:3S) to k(2La:3O) where $1<j<3$ and $1<k<3$. Through this controlled compositional modification, we can achieve for example, specific crystalline features.

Figure 23:
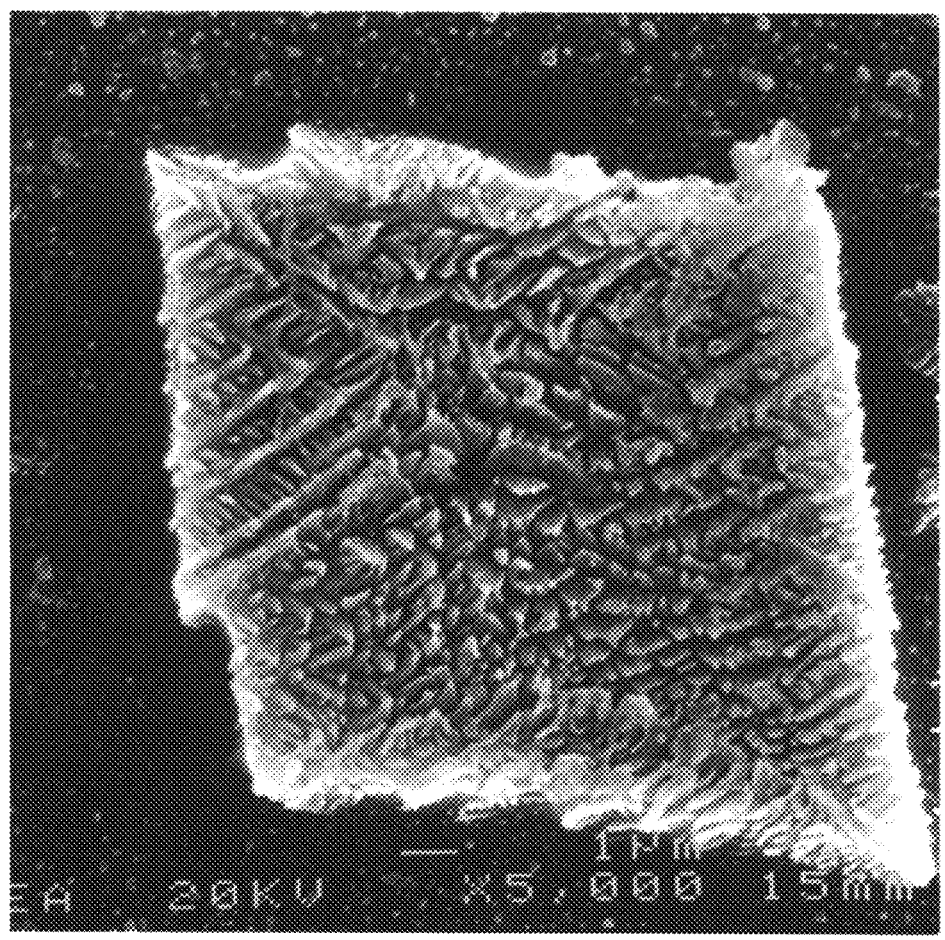
FIG. 23 is an SEM image showing a $Ga_3La_{10/3}S_{12}O_2$ sample crystallised in the tetragonal (melilite) structure.

FIG. 23 shows a $Ga_3La_{10/3}S_{12}O_2$ crystallised in the tetragonal (melilite) structure. The similarity between the crystal and glass composition ensures long term reliability.

Figure 24A:
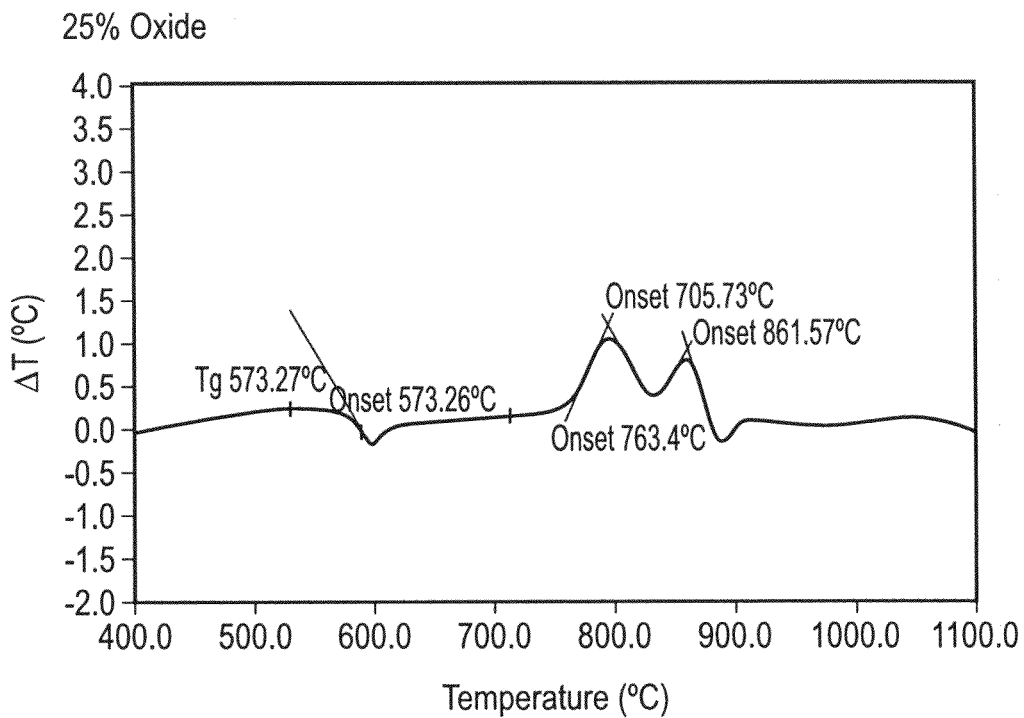
FIG. 24 shows Differential Thermal Analysis (DTA) scans (Perkin Elmer DTA7) illustrating the crystallisation behaviours as a function of temperature for (a) 25% doping with $La_2O_3$ oxide and (b) 5% doping with $La_2O_3$ oxide.
Figure 24B:
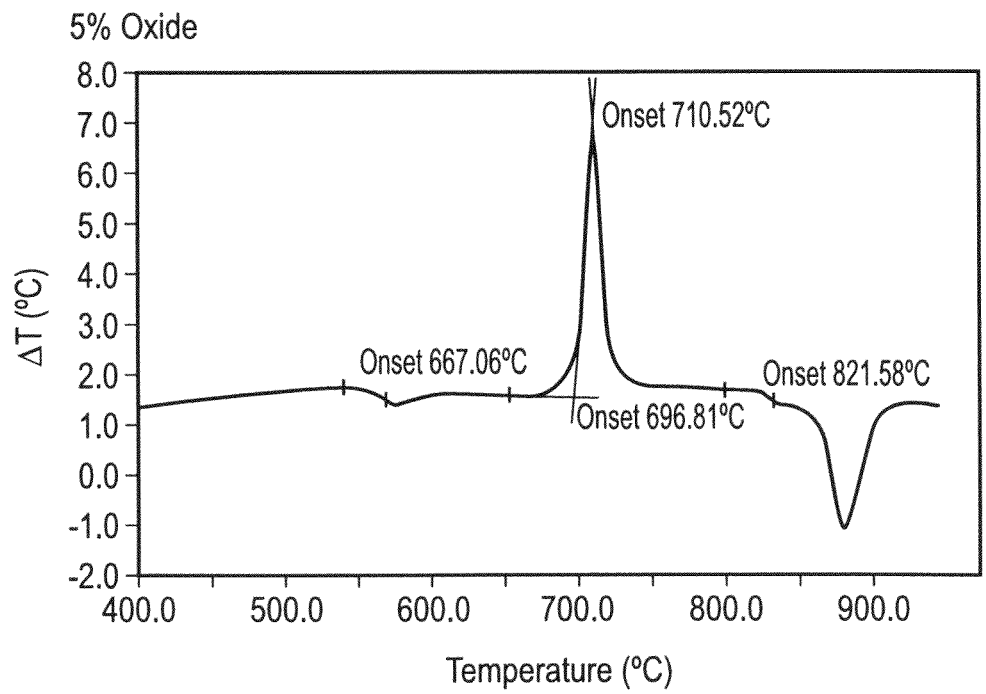

FIG. 24 shows Differential Thermal Analysis scans (Perkin Elmer DTA7) illustrating the crystallisation behaviours as a function of temperature for (a) 25% doping with $La_2O_3$ oxide and (b) 5% doping with $La_2O_3$ oxide. Here, competition between $Ga_4La_2S_9$ & $Ga_3La_{10/3}S_{12}O_2$ and the single dominant crystalline phase—$Ga_4La_2S_9$—gives improved stability of the phase change material. Such a system could be used for grey scale storage. By inducing the two phases independently of one another and provided that their electrical or optical properties are notably different, then a three level (glass, crystal phase A, crystal phase B) coding system is possible.

Example 12

Optical Disc

There are many examples of structures of optical recording media.

Figure 25:
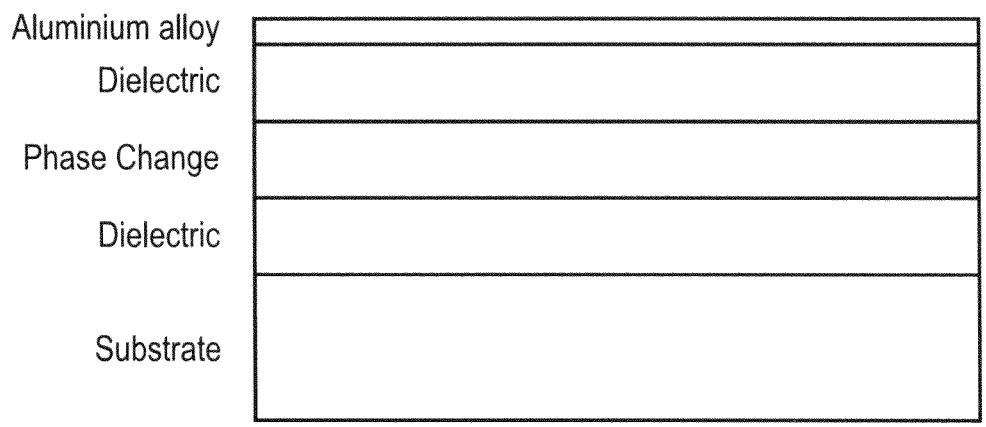
FIG. 25 is a schematic cross-section through an optical recording device consisting of a multilayer stack of a thin film Ga:La:S phase change material sandwiched between two dielectric layers and capped with an aluminium alloy reflective film. The recording laser is focussed upon the phase change layer through the substrate.

FIG. 25 shows one type of optical recording medium, in which the recording layer is sandwiched between a first dielectric layer and a second dielectric layer. In this example, the storage medium consists of a substrate, typically polycarbonate or glass, a first dielectric layer, for example, ZnS—$SiO_2$, a recording layer consisting of the phase change medium, for example, Ga:La:S based glass with or without additional dopants, a second dielectric layer deposited on top of the recording layer and a reflective layer, in this example, an aluminium alloy, deposited on top of the second dielectric. Not illustrated is a protective layer on top of the reflective layer, which could be made of, for example, a second polycarbonate material or other organic material which could be used to protect against moisture or contamination. As described in example 5, there are a variety of methods which could be used to deposit these individual layers.

The substrate may be formed from polycarbonate, glass or other similar material. Preferably the substrate is a substantially optically isotropic and transparent material. The preferred thickness is between about 0.5 to 5 mm. The substrate can be injection moulded, extruded, hot pressed or formed by other methods conducive with the material chosen. Grooves may be placed in the substrate for guiding the light delivered by a laser source. The grooves may be polymerised, moulded, injection moulded or cast moulded into the substrate. Preferably, the thickness of the grooves may be from about 10 nm to about 250 nm.

A primary function of the first and second dielectric layers is to optimise the reflectivity of the optical source so as to maximise the amount of optical energy delivered to the memory material from the source. Optimisation requires an appropriate index of refraction of the material and physical thickness of the layer.

Preferably, the first and second dielectric layers are chosen from a dielectric material having an optical index of refraction between 2.0 and 2.8. Materials which may be used for the first and second dielectric layers include, but are not limited to, germanium oxide ($GeO_2$), germanium sulphide, ($GeS_2$), zinc sulphide (ZnS) or a chalcogenide element combined with oxygen and/or sulphur or a metallic element combined with a chalcogenide element. The materials may be used individually or in combination. One or both of the dielectric layers may be layered or graded to avoid diffusion into the recording layer.

As well as optimising the reflectivity of the optical source, the first and second dielectric layers provide a means for thermally insulating the recording layer. Moreover, they may also act to prevent agents which could chemically change the memory material from penetrating the recording layer. Further, they may also prevent the substrate from deforming when the memory material is heated by the optical source during recording or erasing.

A reflective layer may be deposited on top of the second dielectric layer. The reflective layer increases the quantity of reflected light entering the memory layer. It also influences the thermal environment of the memory layer by providing a thermal sink that encourages rapid cooling. In general, the reflective layer is formed from a thin-film metal. Preferred are high reflectance materials such as Al, Au, Ag, Pt, Cu, Ti, Ni, Pd or alloys thereof. The reflective layer is preferably about 10 nm to about 500 nm thick. The reflective layer is preferably formed by physical deposition methods such as sputtering and evaporation.

A protective layer may be deposited on top of the reflective layer for the purpose of improving scratch and corrosion resistance. It is preferably formed from organic materials such as acrylates. More preferably, the protective layer is formed from radiation-curable compounds and compositions which are cured by exposure to radiation (typically electron radiation and ultraviolet radiation). The protective layer is preferably about 1 μm to about 150 μm thick. It may be formed by any desirable one of conventional coating methods including spin coating, coating, or spray coating.

The optical recording medium of the present invention comprises one or more recording layers.

Figure 26:
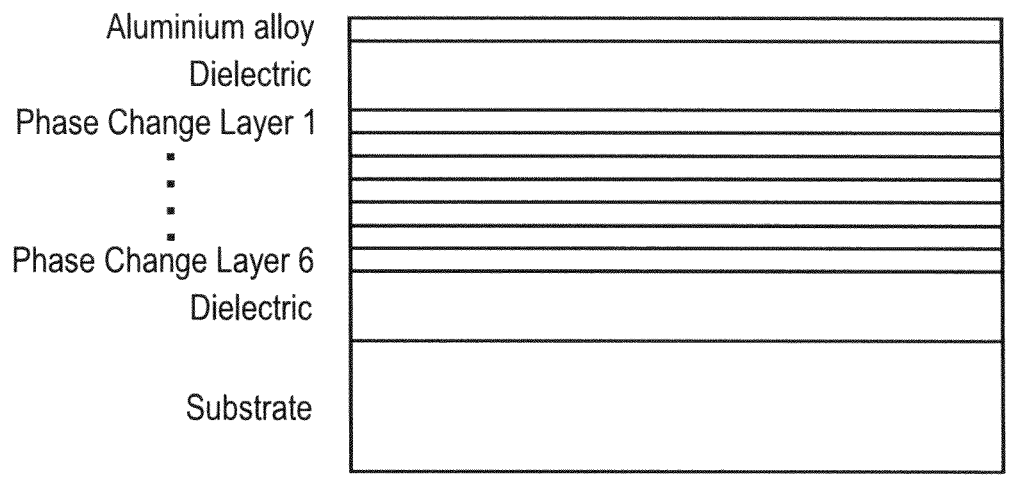
FIG. 26 is a schematic cross-section through an optical recording device consisting of a multilayer phase change stack of a series of thin film Ga:La:S phase change materials. In this example, 6 individual phase change layers, each doped with a unique identifying taggant, are sandwiched between two dielectric layers and capped with an aluminium alloy reflective film. The recording laser is focussed upon the individual phase change layer selected through active identification of its taggant.

FIG. 26 shows another example optical recording device made up of a multilayer phase change stack of a series of thin film Ga:La:S phase change materials. In this example, 6 individual phase change layers, each doped with a unique identifying taggant, are collectively sandwiched between two dielectric layers and capped with an aluminium alloy reflective film. The recording laser can be focussed upon the individual phase change layer selected through active identification of its taggant to provide higher density data storage per unit area.

The optical phase-change memory material comprises an optical phase-change alloy, and preferably at least one modifier element added to the phase-change alloy. The optical phase-change alloy may be any material described herein that (1) has multiple discrete states selected from an amorphous state and one or more crystalline states, (2) is capable of being switched between its discrete states in response to optical energy, and (3) undergoes a detectable change in either index of refraction, optical absorption, or optical reflectivity when switched between the discrete states.

In this example, the modifier element is selected from the group consisting of Ce, Pr, Nd, Pm, Sm, Eu, Gd, Tb, Dy, Ho, Er, Tm, Yb and/or Lu, also referred to as the lanthanides. More preferably, the modifier element is selected from the group consisting of Pr, Nd, Sm, Tb, Dy, Ho, Er, Tm and/or Yb. Each of these modifying elements has a characteristic fluorescence spectrum which can be used to identify the recording layer and thereby track, identify and index the recording layer in active use. Table 11.1 identifies as example of this characteristic emission for each modifying element, when illuminated with light from a suitable source.

TABLE 11.1

Modifying elements for a single or multilayer optical recording disc in which the modifying elements are used to enhance, control, track, identify and/or index the recording of data.

| Modifying Element | Approximate Characteristic Emission Wavelengths (nm) |
|---|---|
| Pr | 520, 550, 635, 650, 1310 |
| Nd | 410, 440, 1080, 1310 |
| Sm | 590, 625, 670 |
| Tb | 465, 520, 570, 610, 650 |
| Dy | 500, 605 |
| Ho | 570, 765 |
| Er | 580, 1580 |
| Tm | 490, 510 |
| Yb | 1020 |

Those skilled in the art will understand that these emission wavelengths are approximate and will vary with the excitation wavelength and glass properties.

In another embodiment of this example, each of the above modifying elements, taken from the lanthanide series, offers, as described in example 5, provides the capability of a unique refractive index, density and thermal characteristics, each of which, independently or taken together, enhance the functionality of the recording medium.

Figure 27:
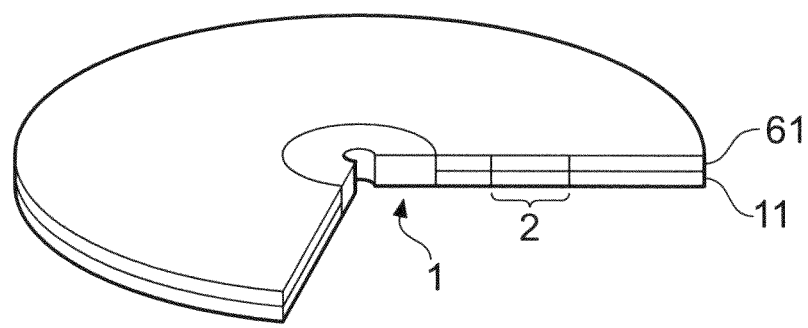
FIG. 27 is a partially cut-away view, not to scale, of an optical memory disk incorporating phase change material embodying the invention.

FIG. 27 is a partially cut-away view, not to scale, of an optical memory disk incorporating the novel chalcogenide material of the present invention. The disk has a spindle 1 by which it can be spun. The disk comprises a substrate 11 and a phase change material layer 61 arranged on the substrate 11.

Example 13

Electrically Operated Memory Element

Figure 28A:
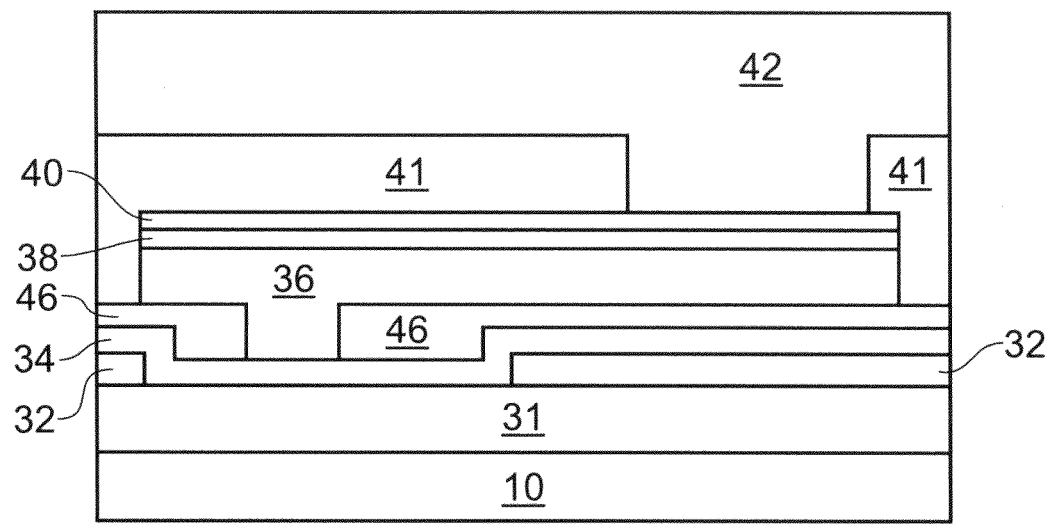
FIG. 28a is a stylised cross-sectional view of a single memory element specifically illustrating heating layers and thermal insulation layers.

FIG. 28*a* is a stylised cross-sectional view of a single memory element illustrating upper and lower heating layers 34 and 38, and upper and lower thermal insulation layers 41 and 31.

Figure 28B:
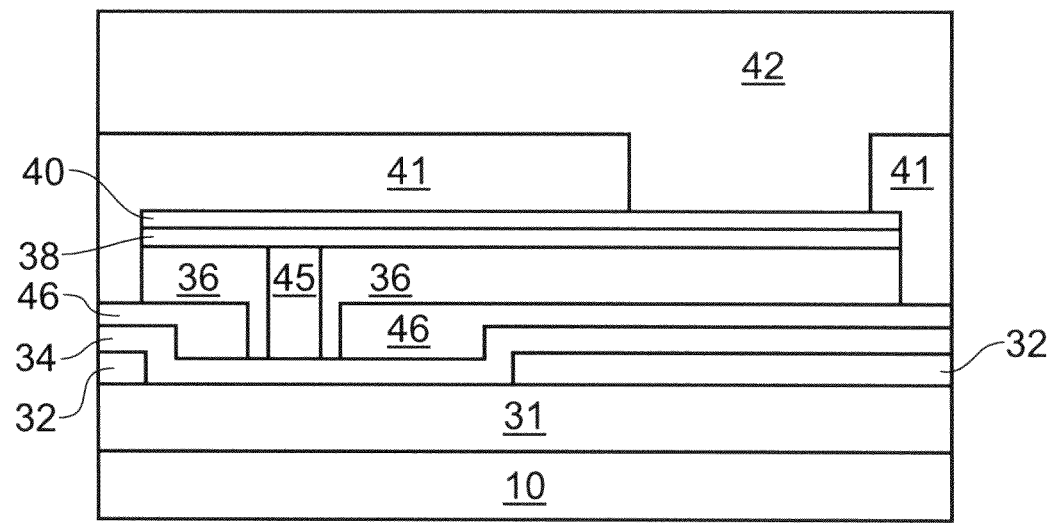
FIG. 28b is a stylised cross-section view of a single memory element specifically illustrating a thermal plug.

FIG. 28*b* is a stylised cross-section view of a single memory element illustrating the thermal plug.

FIG. 28*a* shows a cross-sectional view of a memory element formed on a substrate of single crystal silicon semiconductor wafer 10. The memory element 30 includes the memory material 36 which has been described above.

The memory element further includes a pair of electrical contacts arranged to supply the electrical input signal to the memory material.

Preferably, at least one of the electrical contacts is a thin-film electrical contact layer. In FIG. 28*a*, each of the electrical contacts is embodied as an electrical contact layer in the form of a lower thin-film layer 32 and an upper thin-film layer 40.

Generally, each of the thin-film electrical contact layers is deposited to be sufficiently thin so that the thermal conducting properties of the layers will not dominate the thermal environment of the memory material. Preferably, at least one of the electrical contact layers is deposited to a thickness between about 5 nm to about 200 nm. More preferably, at least one of the electrical contact layers is deposited to a thickness between about 10 nm to about 100 nm. Most preferably, at least one of the electrical contact layers is deposited to a thickness between about 15 nm to about 75 nm.

Generally, each of the electrical contact layers is formed from an electrically conductive material. Preferably, at least one of the electrical contact layers may be comprised of one or more elements from the group consisting of Ti, W, Mo, and mixtures or alloys thereof. More preferably, at least one of the electrical contact layers is comprised of Ti and W. Most preferably, at least one of the electrical contact layers are comprised of a compound, in atomic percent, of 5% to 30% titanium and 70% to 95% tungsten.

In the embodiment shown in FIG. 28*a*, each of the electrical contact layers 32 and 40 is a Ti—W layer that is preferably deposited using a DC sputtering deposition process. The Ti—W electrical contact layer 32 and 40 have excellent ohmic contact properties. Moreover, they have the barrier properties necessary to prevent both the electromigration and diffusion of foreign electrode material into the memory material.

To programme the memory devices, electrical energy is applied in a pulse of current.

At least a portion of the energy entering the volume of memory material is in the form of heat energy which is sufficient to reduce its viscosity during the programming interval to below about $10^{14}$ Poise. This reduced viscosity allows for the atomic rearrangement which results in memory programming.

Generally, the electrical resistivity of the heating layers 34 and 38 is chosen to provide adequate Joule heating. Preferably, at least one of the heating layers has an electrical resistivity greater than about $10^{-5}$ ohm-cm. More preferably, at least one of the heating layers has an electrical resistivity greater than about $10^{-3}$ ohm-cm. Most preferably, at least one of the heating layers has an electrical resistivity greater than about $10^{-1}$ ohm-cm.

The rate at which energy appears as Joule heat is also directly proportional to the square of the current density at a particular location of the material. At least a portion of the heat energy created within the heating layers as a result of Joule heating flows into at least a portion of the volume of the memory material, thereby heating the memory material.

Other configurations for the heating layers are also possible. The memory element may include only a single heating layer deposited adjacent or remote to the memory material, and either above or below the memory material. As well, heating layers may be positioned laterally from at least a portion of the volume of memory material.

At least one of the heating layers may include one or more elements selected from the group consisting of Ti, V, Cr, Zr, Nb, M, Hf, Ta, W, and mixtures or alloys thereof, and two or more elements selected from the group consisting of B, C, N, O, Al, Si, P, S, and mixtures or alloys thereof.

Alternatively, at least one of the heating layers may include titanium silicon nitride, amorphous carbon, amorphous silicon or a dual amorphous carbon/amorphous silicon structure.

The heating layers may be deposited by such methods as physical vapour deposition including evaporation, ion plating as well as DC and RF sputtering deposition, chemical vapour deposition, and plasma assisted chemical-vapour deposition. The exact method used depends upon many factors, one of which being deposition temperature constraints imposed by the composition of the chalcogenide target material.

The thermal control may further include thermal insulation for controlling the transfer of heat energy out of at least a portion of the memory material 36. The thermal insulation may be realised by one or more thermal insulation layers which partially encapsulate the memory material 36 and which reduce the transfer of heat energy from at least a portion of the volume of memory material.

FIG. 28*a* illustrates using two thermal insulation layers, namely a first lower thermal insulation layer 31 deposited remote to and below the memory material 36 and a second upper thermal insulation layer 41 deposited remote to and above the memory material 36. As shown in FIG. 28*a*, thermal insulation layer 41 has been appropriately etched to permit electrical contact between electrode 42 and electrical contact layer 40. Moreover a layer 46 below the memory material 36 is also shown which has been etched away to form a channel in a central region thereof prior to deposition of the memory material. The subsequent deposition of the memory material has thus filled the channel as well as covering the upper surface of layer 46 with a thin film.

In the structure shown in FIG. 28*a*, thermal insulation layer 41 has been etched so that electrode 42 is laterally displaced from the volume of memory material proximate the region of contact between thermal insulation layer 34 and memory material 36. Such lateral displacement further reduces the transfer of heat out of at least a portion of the volume of memory material by reducing the effect of the thermal conducting properties of layer 42.

Other configurations for the positioning of the thermal insulation layers are also possible. Generally, the thermal insulation layers may be deposited either adjacent or remote to the memory material. A single thermal insulation layer may be used (deposited either above or below the memory material, and either adjacent or remote to the memory material). The thermal insulating material may also be deposited to surround at least a portion of the lateral periphery of the memory material.

Generally, the thermal insulation layers at least partially encapsulate the memory material with a blanket of thermally insulating material. This blanket of insulation increases the amount of heat energy retained within at least a portion of the volume of memory material 36. It also decreases the rate of heat transfer from the memory material, thereby decreasing the rate of cooling of the memory material.

The thermal insulation layers are chosen to have good thermal insulating properties. The insulating properties of the thermal insulation layers depend upon the specific heat and thermal conductivity of the thermal insulation layer material. Decreasing the specific heat and/or the thermal conductivity of the material increases the insulating properties of layers thereby slowing the rate of heat loss from the volume of memory material. Hence, manipulation of these material properties may be used as a means of controlling and optimising the cooling rate of the memory material.

Preferably, at least one of the thermal insulation layer has a thermal conductivity less than about 0.2 joule-cm per $cm^2$—Kelvin—second. More preferably, at least one thermal insulation layer has a thermal conductivity less than about 0.01 joule-cm per $cm^2$—Kelvin—second. Most preferably, at least thermal insulation layer has a thermal conductivity less than about 0.001 joule-cm per $cm^2$—Kelvin—second.

Preferably, at least one thermal insulation layer has a specific heat capacity less than about 3 joule per $cm^3$—Kelvin. More preferably, at least one thermal insulation layer has a specific heat capacity less than about 1 joule per $cm^3$—Kelvin. Most preferably, at least one thermal insulation layer has a specific heat capacity less than about 0.1 joule per $cm^3$—Kelvin.

At least one thermal insulation layer may include one or more materials selected from the group consisting of oxides, nitrides, oxynitrides, carbonites, carbo-nitrides, fluorides, sulphides, chlorides, carbides, borides, phosphides, and mixtures or alloys thereof. Alternately, at least one thermal insulation layer may include an organic dielectric material.

Further examples of thermal insulation layer materials include spin-on glass and spin-on polymer. Still other examples of thermal insulation layer materials include silica and diamond.

The thickness of each of the thermal insulation layers affects the insulating properties of the layers (and hence the cooling rate of the memory material). Generally, increasing the thickness of the insulation layers increases the insulating properties, further slowing the cooling of the memory material. Preferably, at least one of the thermal insulation layers has a thickness between about 10 nm to about 1000 nm. More preferably, at least one the thermal insulation layers has a thickness between about 50 nm to about 750 nm. Most preferably, at least one of the thermal insulation layers has a thickness between about 100 nm and about 500 nm.

To provide additional control of the thermal environment of the volume of memory material, the thermal control may include a volume of thermal insulating material that is at least partially encapsulated within the volume of memory material. This volume of thermal insulating material is referred to herein as a thermal plug. The thermal plug provides a means of controlling the distribution of the heat energy within the volume of memory material. The thermal plug may be formed from the same materials selected for the thermal insulation layers described above.

FIG. 28b shows an embodiment of a memory element using a thermal plug 45 arranged within the volume of memory material 36 extending from the upper surface to the lower surface of the memory material layer 36 abutting the upper and lower heating layers 38 and 34.

The layer of memory material 36 may be formed of a multi-element semiconductor material, such as the chalcogenide materials disclosed herein. The layer 36 may be deposited by methods such as sputtering, evaporation or by chemical vapour deposition (CVD), which may be enhanced by plasma techniques such as RF glow discharge. The chalcogenide memory materials are most preferably made by RF sputtering and evaporation.

The layer of memory material 36 is preferably deposited to a thickness of about 20 nm to 500 nm, more preferably of about 25 nm to 250 nm and most preferably of about 40 nm to 125 nm in thickness.

Generally, the term "pore diameter", as used herein, means the average cross-section of the smallest region of contact between the memory material 36, and memory element layers adjacent to the memory material 36. In the embodiment shown in FIG. 28a, the pore diameter is the average cross-section of the smallest region of contact between the memory material 36, and the heating layers 34, 38. The pore diameter of memory material 36 is less than about one to two micrometers, although there is no practical limit on the lateral dimension. It has been determined that the diameter of the conductive path of the high conductivity material is significantly less than a micrometer. The pore diameter can thus be as small as lithography resolution limits will permit and, in fact, the smaller the pore, the lower the energy requirements for programming.

It is preferred, that the pore diameter be selected such that it conforms substantially with the cross-section of the memory material whose resistance is altered when the material is programmed to a different resistance. The pore diameter of the memory material 36 is therefore preferably less than about one micrometer so that the volume of the memory material 36 is limited, to the extent lithographically possible, to that (sub-)volume of material 36 which is programmed, i.e. the programmable volume.

We observe a trend in performance of the memory elements that is generally related to pore diameter. When the device is used in the binary mode (i.e. with switching between an amorphous state and one crystalline state), we see a general increase in the off-to-on resistance ratio as we test devices across a wafer in which pore diameters range systematically from just over one micron to not open at all. If the pore diameter is controlled within the range of, for example, from one micron to about one-sixth of a micron, there is an opportunity to improve the performance of the devices. Since factors such as current density and energy density are important in the programming of these devices, reduction in device volume, resulting from reduction in pore diameter, should result in an increase in sensitivity and speed. To minimise the parameters of set energy, current and voltage, it is proposed to employ pore diameters of as small as 150 nm, or even as small as 10 nm.

The energy control discussed above may include electrical control for controlling the distribution of electrical current within at least a portion of the volume of memory material. Specifically, the electrical control may be implemented by one or more resistive layers. Preferably, at least one of the resistive layers is deposited adjacent to the volume of memory material. Each resistive layer is formed from material having sufficient electrical resistivity to spread the distribution current within at least a portion of the volume of memory material, thereby reducing electromigration within the material. Preferably, at least one resistive layer has a resistivity greater than about $10^{-5}$ ohm-cm. More preferably, at least one resistive layer has a resistivity greater than about $10^{-3}$ ohm-cm. Most preferably, at least one resistive layer has a resistivity greater than about $10^{-1}$ ohm-cm.

Further details of suitable fabrication steps to produce the epitaxial structure shown in FIGS. 28a and 28b are described in U.S. Pat. No. 5,933,365 [84] the contents of which are incorporated herein by reference.

Example 14

Demonstration of Optical Data Storage in Ga:La:S Films

Thin films of Ga:La:S Cu doped glass were deposited by RF sputtering from a 65 mm diameter target onto a glass substrate. The sputtering target was prepared by melt quenching a Ga:La:S glass melt at 1100° C. in a 3 inch diameter mould and then annealing the glass at 500° C. for 24 hours. The glass disc was cooled at 1° C. per minute and then mounted on a copper backing plate. The sample and target were sealed within an evacuated chamber and a partial pressure of argon gas introduced. RF sputtering took place for up to 6 hours depositing a uniform film up to 2000 nm in thickness.

Figure 29:
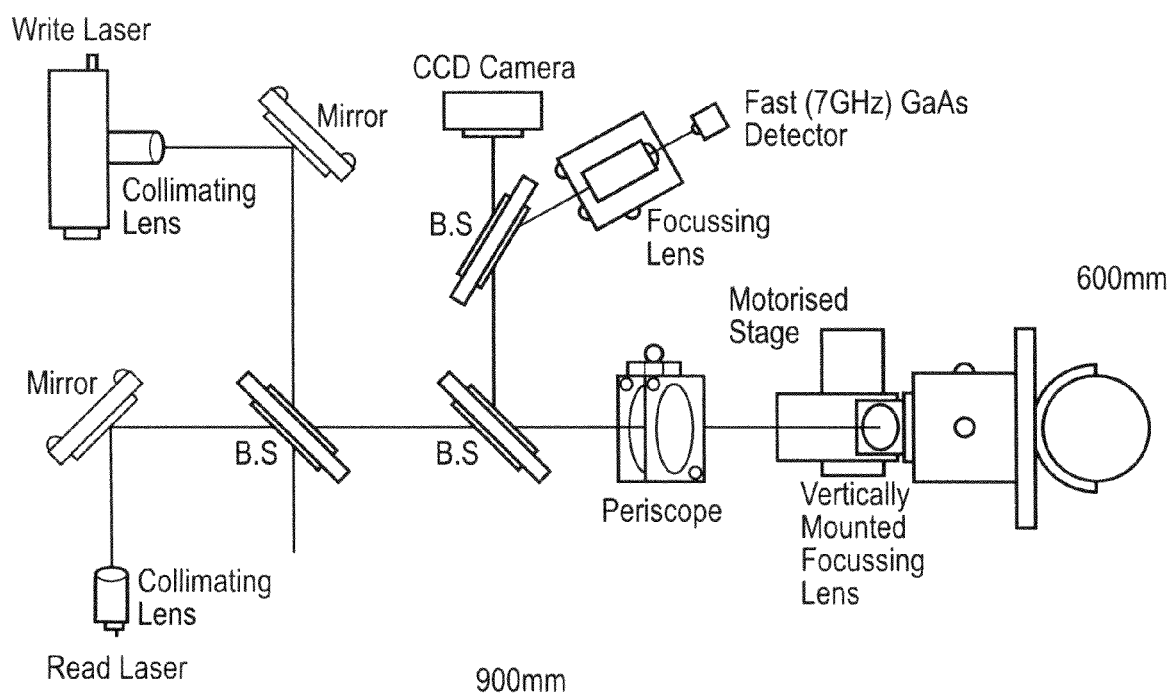
FIG. 29 is a schematic diagram of the static tester used to demonstrated optical phase change switching in GaLaS films. Laser pulses at a wavelength of 658 nm and as short as 6 nsec were generated with an Avtech pulse generator (AVIR4B-UoS1) operating at up to 1000 Hz. The laser has a CW maximum power of 90 mW and for 50 nsec pulses up to 240 mW. The sample was manipulated with a computer controlled x-y-z motorized stage to allow a series of data points, with varying pulse power and length to be recorded in the glassy film. A GaAs detector with a bandwidth of 7 GHz was used to monitor pulse recording and allow read out through the change in reflectivity from the laser written spot.

Optical data storage, writing and reading was performed using a custom build static tester shown schematically in FIG. 29. The static tester is a device allows phase changes to be optically induced in a thin film at a series of positions on a sample. A pulsed focussed laser is used heat the sample and locally crystallize the glassy film. It also allows interrogation of the film and reading of the information stored from a measure of the power of laser light reflected from a phase change alloy. Changes in phase are detected as small changes in the intensity of the reflected light. The material's phase is changed by heating above its crystallisation temperature to crystallise it or above the melting temperature and cooling/quenching quickly to vitrify the film. A series of pulses of different lengths and powers is used to write a series of phase change marks into the film. A plot of pulse energy, pulse time, and % change in reflectivity is made from these measurements. This plot is commonly known as a Phase Transform Kinetics (PTK) plot.

Figure 30:
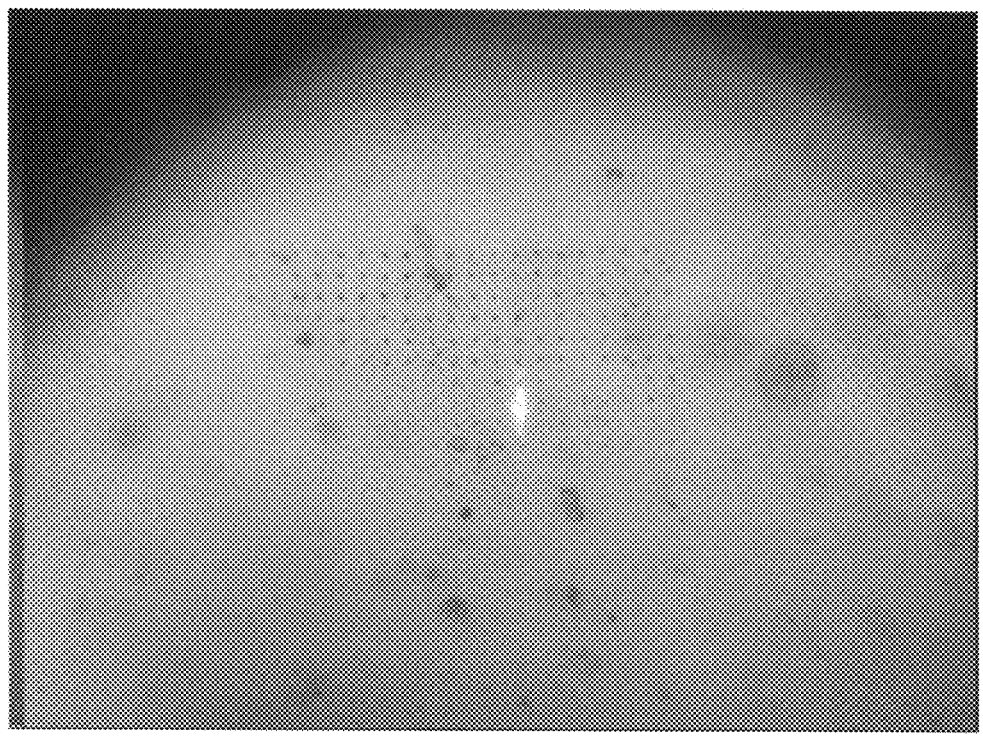
FIG. 30 shows a series of data points written into a GaLaS glass film using laser pulses at a wavelength of 658 nm. The pulses varied in length up to 200 nsec and in power up to about 200 mW.
Figure 31:
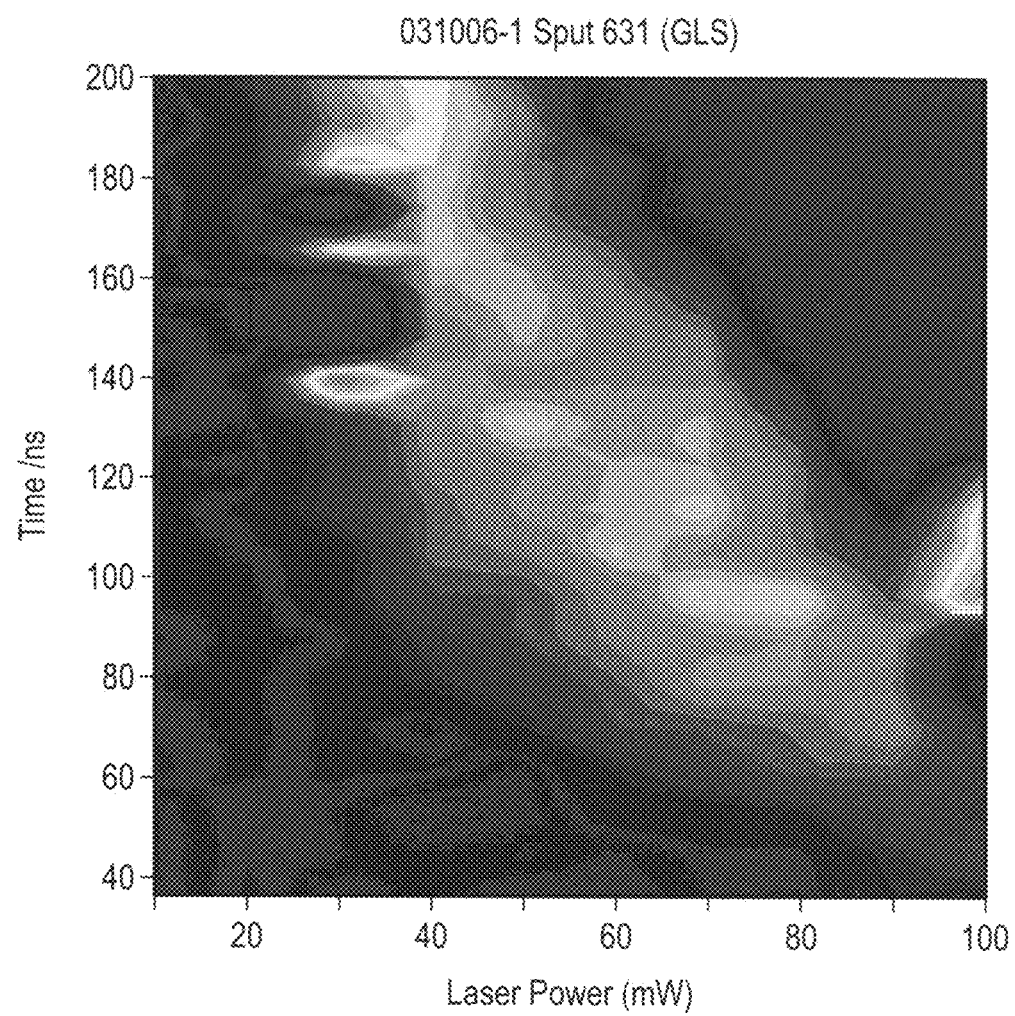
FIG. 31 is a Phase Kinetics Transform plot for a Cu-doped Ga:Ls:S glass film. A minimum switching time of about 40 nsec for the glassy to crystalline phase change was experimentally verified.
Figure 32:
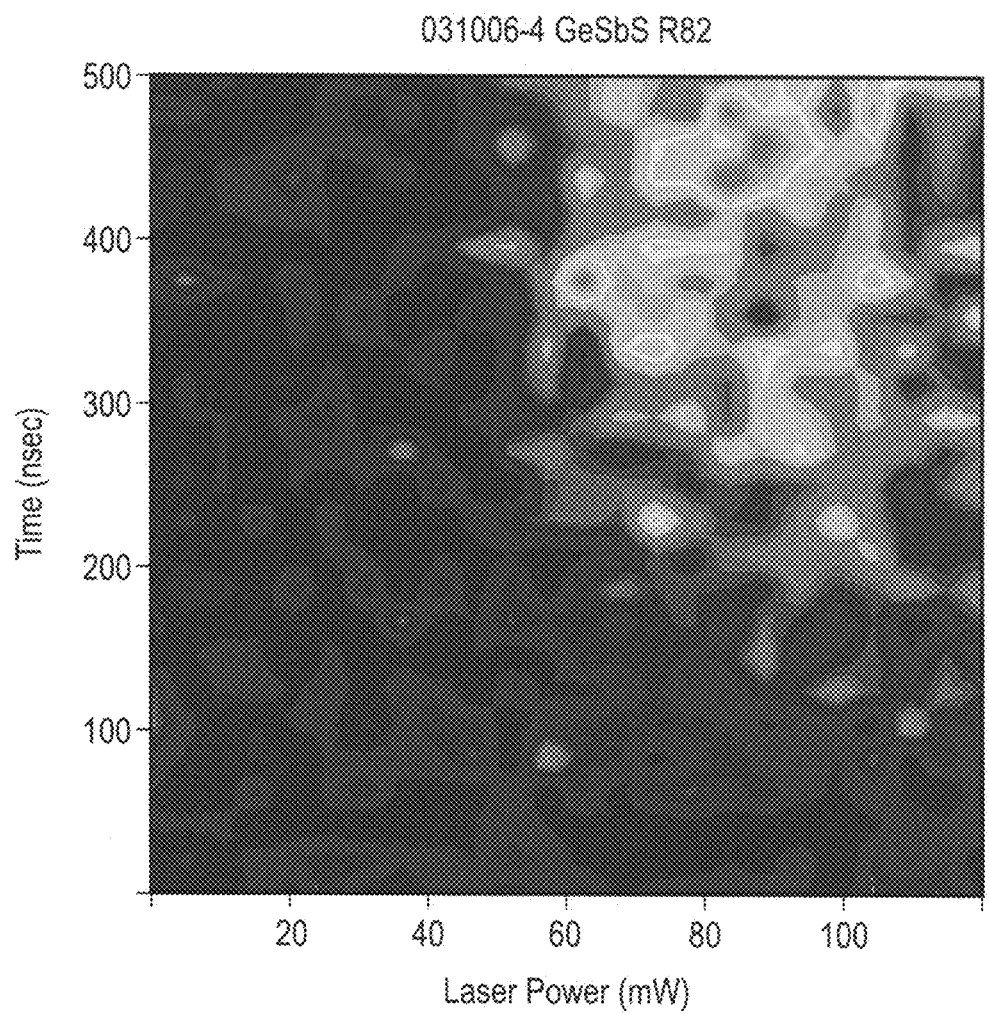
FIG. 32 is a Phase Kinetics Transform plot for a Ge:Sb:S glass film deposited by chemical vapour deposition. A minimum switching time of about 120 nsec for the glassy to crystalline phase change was experimentally verified.
Figure 33:
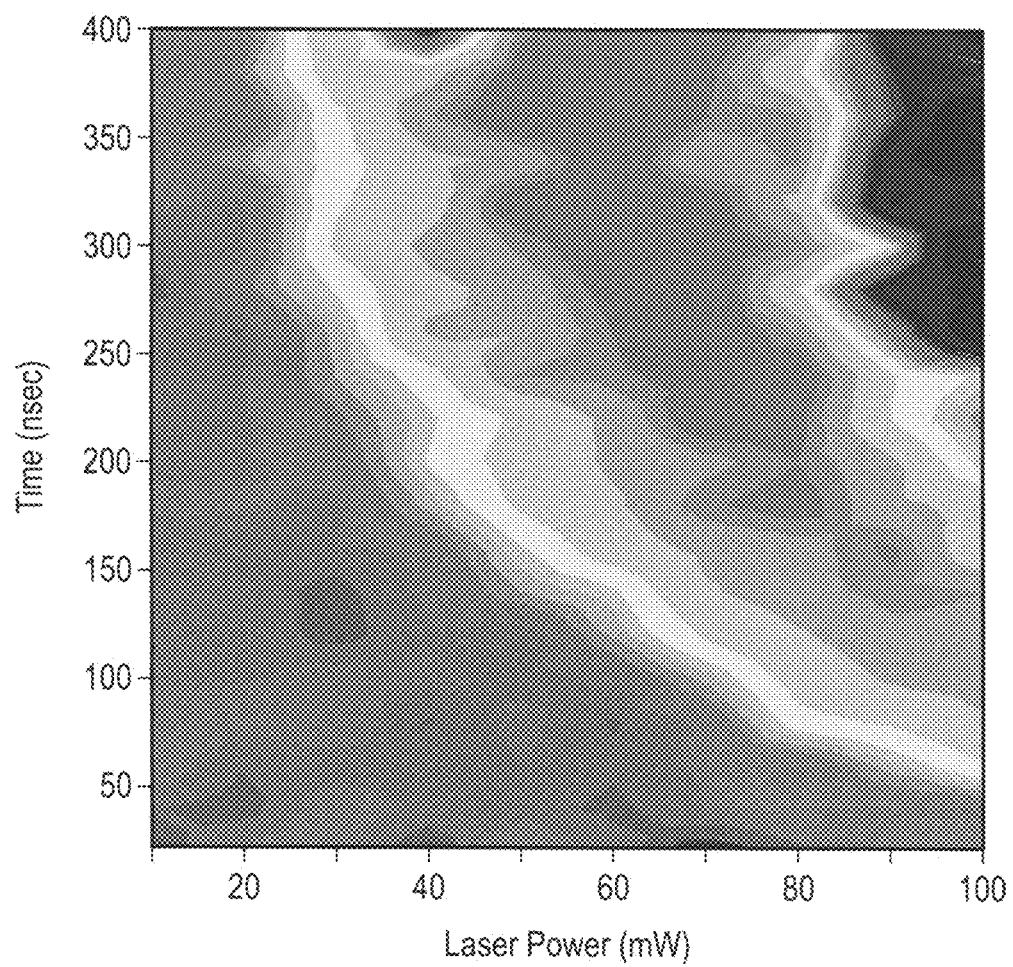
FIG. 33 is a Phase Kinetics Transform plot for a Ge:Sb:S glass film. A minimum switching time of about 40 nsec for the glassy to crystalline phase change was experimentally verified.

FIG. 30 shows an optical microscope image of a series of laser writing spots formed on a GaLaS film doped with Cu. A minimum switching time of 40 nsec is observed for pulse powers on the order of 100 mW. For comparison, measurements were made on the films of Ge:Sb:S, deposited by chemical vapour deposition. The results shown in FIG. 31 show a minimum switching time of 50 nsec.

Example 15

Optimization of the Ga:La:Te Family of Materials for Optical and/or Electronic Data Storage: Phase Change in the Complete Ga:La:Te Glass System Conventional chalcogenide thin films can be synthesized via a number of methods most of which require a target or charge material of identical composition to the required film to be analyzed on a sample by sample basis. This in turn requires fabrication of a suitable target or bulk glass, thermal analysis, typically by differential thermal analysis (DTA) and X-ray diffraction to determine amorphicity. This process is very time consuming and if one is required to study a whole host of different materials it can also be expensive and impractical.

To fully explore new compositions for phase change applications, a new technique was exploited which had increased control and provided a wider composition range [85]. A physical vapour deposition system that allows simultaneous "wedge" growth of elements based on ultra high vacuum molecular beam epitaxy technologies was exploited to allow us to explore simultaneously several hundred different phase change material compositions and analyze individually the suitable of each composition. The system is designed to allow graded composition and morphologies of alloys, mixed and doped oxides, alloys, mixed and doped oxides, nitrides and hydrides to be deposited using a combination of both e-beam and Knudson sources and a Plasma Atom Source.

Two high throughput physical vapour deposition (HT-PVD) synthesis chambers, one allowing up to six individual elemental sources, the other four, are used with an ultra high vacuum (UHV) transfer line between systems and to UHV characterization chamber. A glove box and fast entry chamber allow clean transfer of samples in and out of the system. It is possible to create both continuous films and with the use of a contact mask, discrete arrays. Combined control of the gradient of material across the sample using wedge shutters for the individual sources, and the rate of deposition from each source, allows complete control of the compositional range of the material. Initial broad composition ranges can be synthesized, with concentrations of individual elements covering ranges from 0 to almost 100%. Following preliminary screening, one can synthesize a much narrower composition range at higher resolution close to regions of interest.

Figure 34:
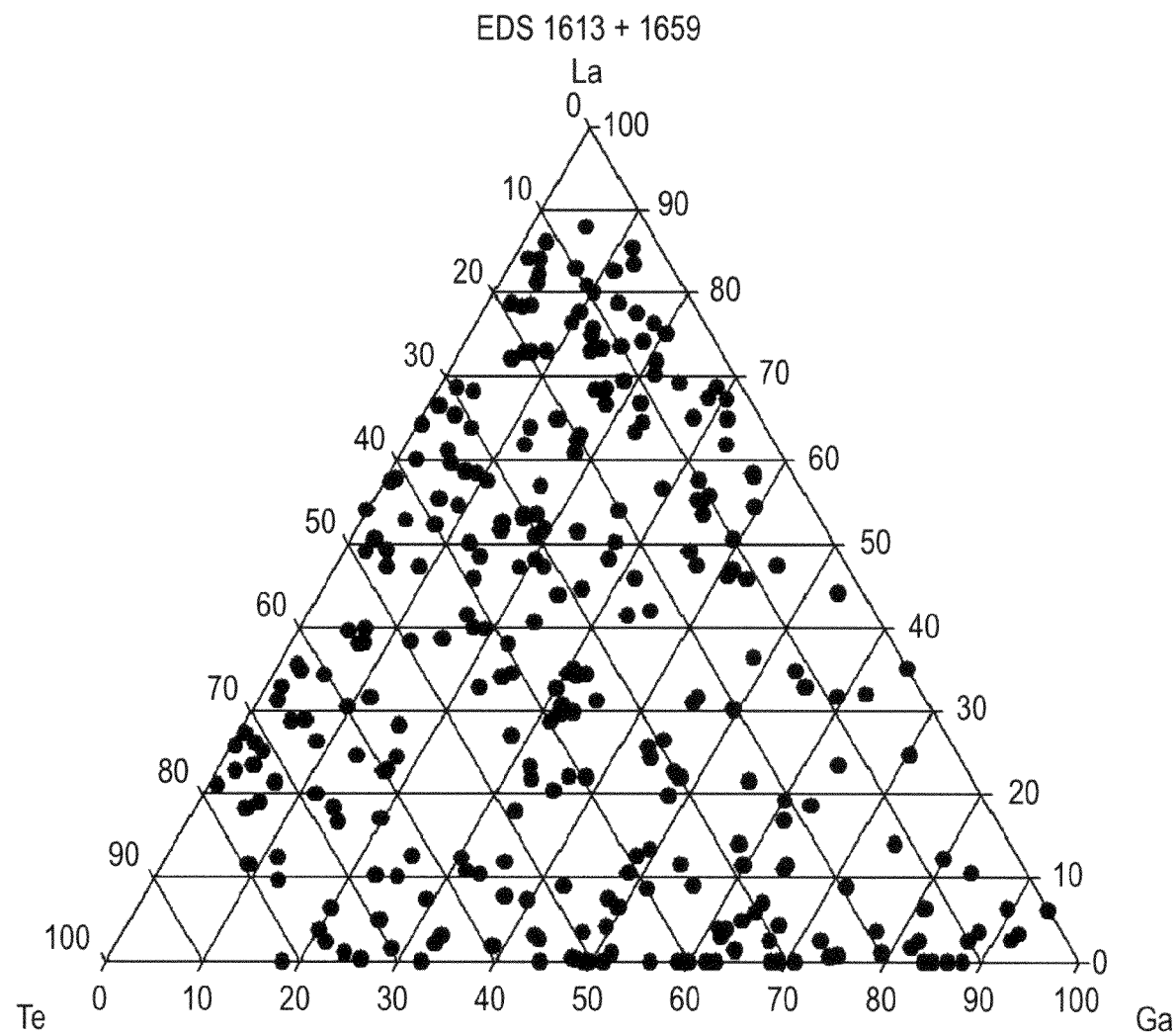
FIG. 34 is a Phase Diagram showing the range of Ga:La:Te samples synthesized by high throughput physical vapour deposition

In this example we have deposited a broad Ga:La:Te composition range, using elemental gallium, lanthanum and tellurium with a purity of 99.9999% (metals basis) or better. Substrates were glass, silicon or thermally oxidized Si with a 32 mm×32 mm footprint. A total of 36 depositions took place, a representative sample of which is presented in table 1. These samples, and in particular sample 1613 and 1659 provided almost complete screening of the Ga:La:Te phase diagram, with a continuous range of samples from 0-100% Ga, 0-90% La, 0-80% Te. Representative points samples and confirmed by compositional analysis using energy dispersive X-ray spectroscopy (EDS) are shown in FIG. 34.

TABLE 1

Ga:La:Te films deposited by high throughput physical vapour deposition

| Sample | Substrate | La | wedge % | Deposition Rate | Ga | wedge % | T° C. | Te | wedge % | T° C. |
|---|---|---|---|---|---|---|---|---|---|---|
| 1582 | Si | La | 75 | 1 | Ga | 76 | 1040 | Te | 78 | 420 |
| 1592 | Si | La | 75 | 1 | Ga | 76 | 1040 | Te | 78 | 420 |

TABLE 1-continued

Ga:La:Te films deposited by high throughput physical vapour deposition

| Sample | Substrate | La | wedge % | Deposition Rate | Ga | wedge % | T° C. | Te | wedge % | T° C. |
|---|---|---|---|---|---|---|---|---|---|---|
| 1605 | Si | La | 75 | 0.9 | Ga | 76 | 1040 | Te | 80 | 420 |
| 1611 | Si | La | 75 | 0.9 | Ga | 76 | 1045 | Te | 80 | 420 |
| 1612 | SiO2 | La | 75 | 0.9 | Ga | 76 | 1045 | Te | 80 | 420 |
| 1613 | Si | La | 75 | 0.9 | Ga | 76 | 1045 | Te | 80 | 420 |
| 1615 | SiO2 | La | 75 | 0.9 | Ga | 76 | 1045 | Te | 80 | 420 |
| 1617 | Si | La | 75 | 0.9 | Ga | 76 | 1045 | Te | 80 | 420 |
| 1620 | Si | La | 75 | 0.9 | Ga | 76 | 1045 | Te | 80 | 420 |
| 1654 | Si | La | 75 | 0.9 | Ga | 76 | 1045 | Te | 80 | 410 |
| 1659 | Si | La | 75 | 0.9 | Ga | 76 | 1045 | Te | 80 | 410 |
| 1660 | Si | La | 75 | 0.9 | Ga | 76 | 1045 | Te | 80 | 410 |
| 1661 | Si | La | 75 | 0.9 | Ga | 76 | 1045 | Te | 80 | 410 |
| 1664 | SiO2 | La | 75 | 0.9 | Ga | 76 | 1045 | Te | 80 | 410 |
| 1665 | SiO2 | La | 75 | 0.9 | Ga | 76 | 1045 | Te | 80 | 410 |

Note that the points in FIG. 34 represent only the points of analysis (approximately 2 mm apart) on the sample, while indeed measurements can with a considerably higher density, providing concomitantly more detail within the ternary space.

Figures 35A, 35B:
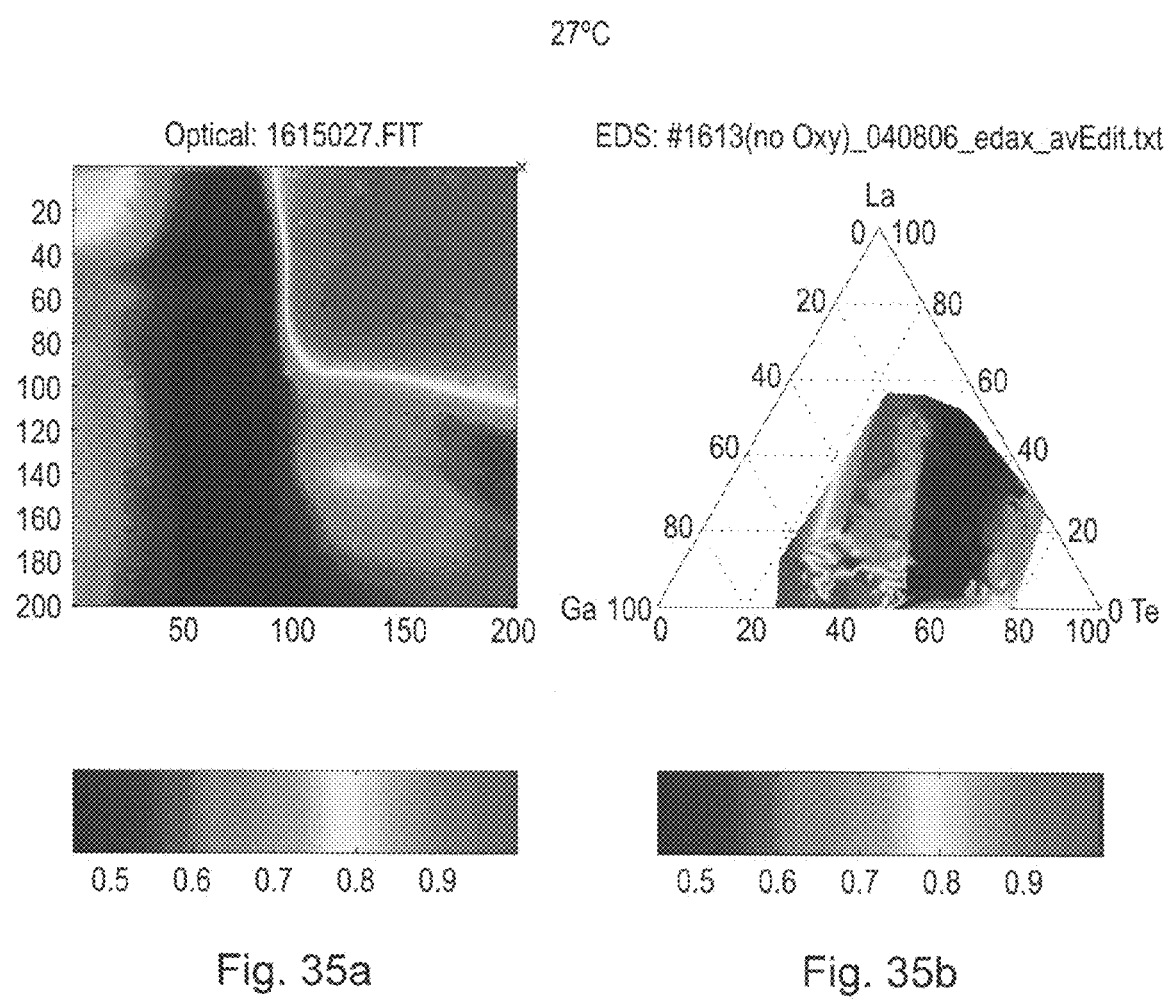
FIG. 35(a) is a digitally processed photograph of a substrate for sample 1613 shown together with FIG. 35(b) which shows the compositional range measured by EDS. The material is synthesized over the entire area of the substrate in a continuous thin film (ca. 100 nm in thickness). Clearly visible are regions of differing reflectivity which correspond to as deposited amorphous and crystalline phases.

A digitally processed photograph of a typical substrate is presented in FIG. 35(a) together with the compositional range measured by EDS in FIG. 35(b). The material is synthesised over the entire area of the substrate in a continuous thin film (ca. 100 nm in thickness). Clearly visible are regions of differing reflectivity which appear lighter (more reflective) to the naked eye while in other areas of the sample appearing more transparent, particularity when viewed on a glass substrate. We believe these areas correspond to as deposited glassy and crystalline Ga:La:Te compositions. When mapped onto the phase diagram in FIG. 35(b) the compositions which correspond to these different areas provide the first indication of differing phases of the Ga:La:Te system.

Figures 36A, 36B:
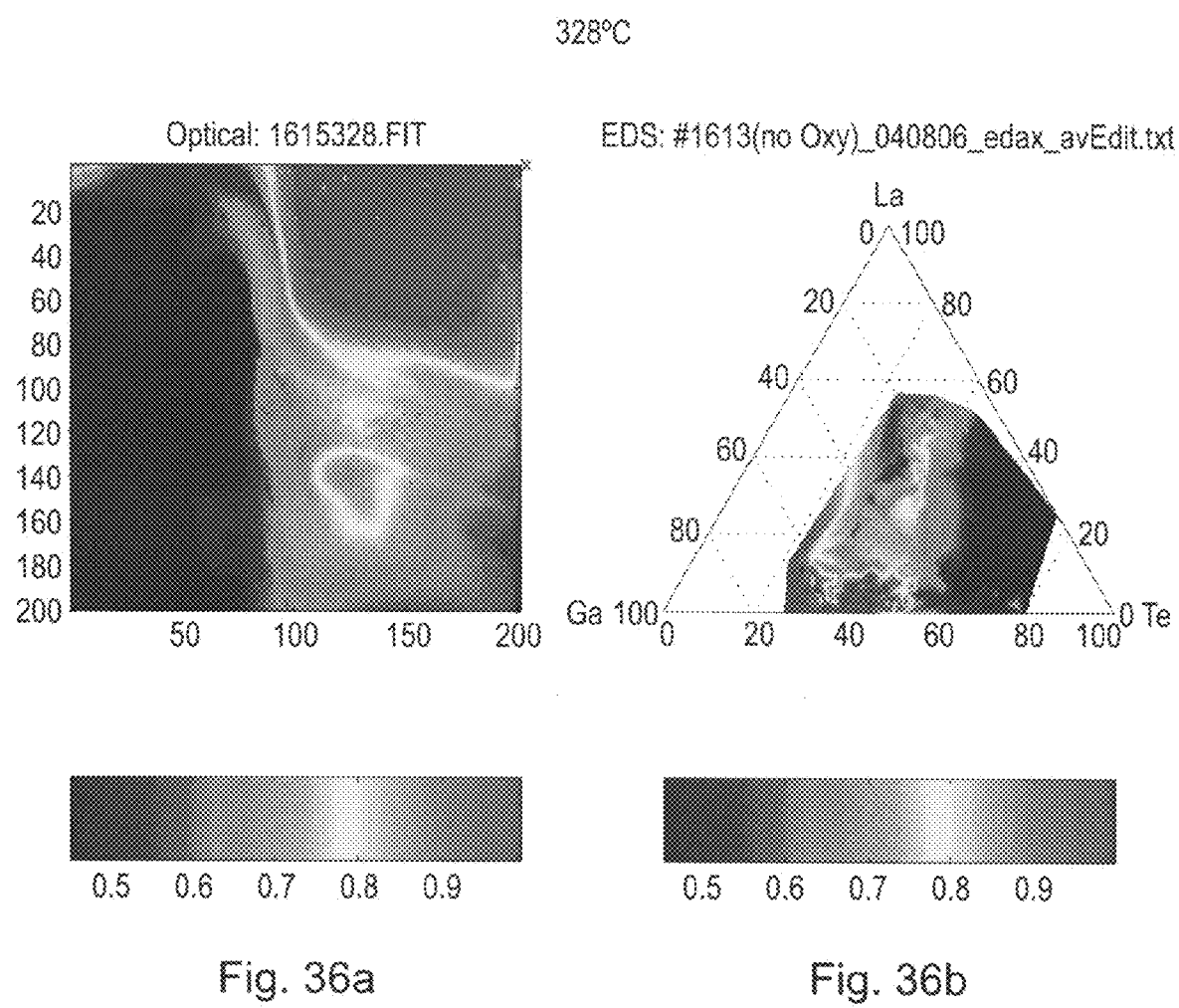
FIG. 36(a) is a digitally processed photograph of a substrate for sample 1613 after heating to 328° C., shown together with FIG. 36(b) which shows the compositional range measured by EDS. Comparison with FIG. 35 shows areas which undergo reflectivity change postulated to be an amorphous to crystalline phase change.

When this sample was heated on a hot plate and optically observed, areas of increasing reflectivity "grew" as suggesting a glass to crystalline phase change. The sample following heating to 328° C. is shown in FIG. 36.

For the chalcogenide materials in this example, a number of methods have been selected (Table 2) in order to provide bulk structural, bulk and surface compositional, optical, thermal and conductivity characterization.

Figure 37:
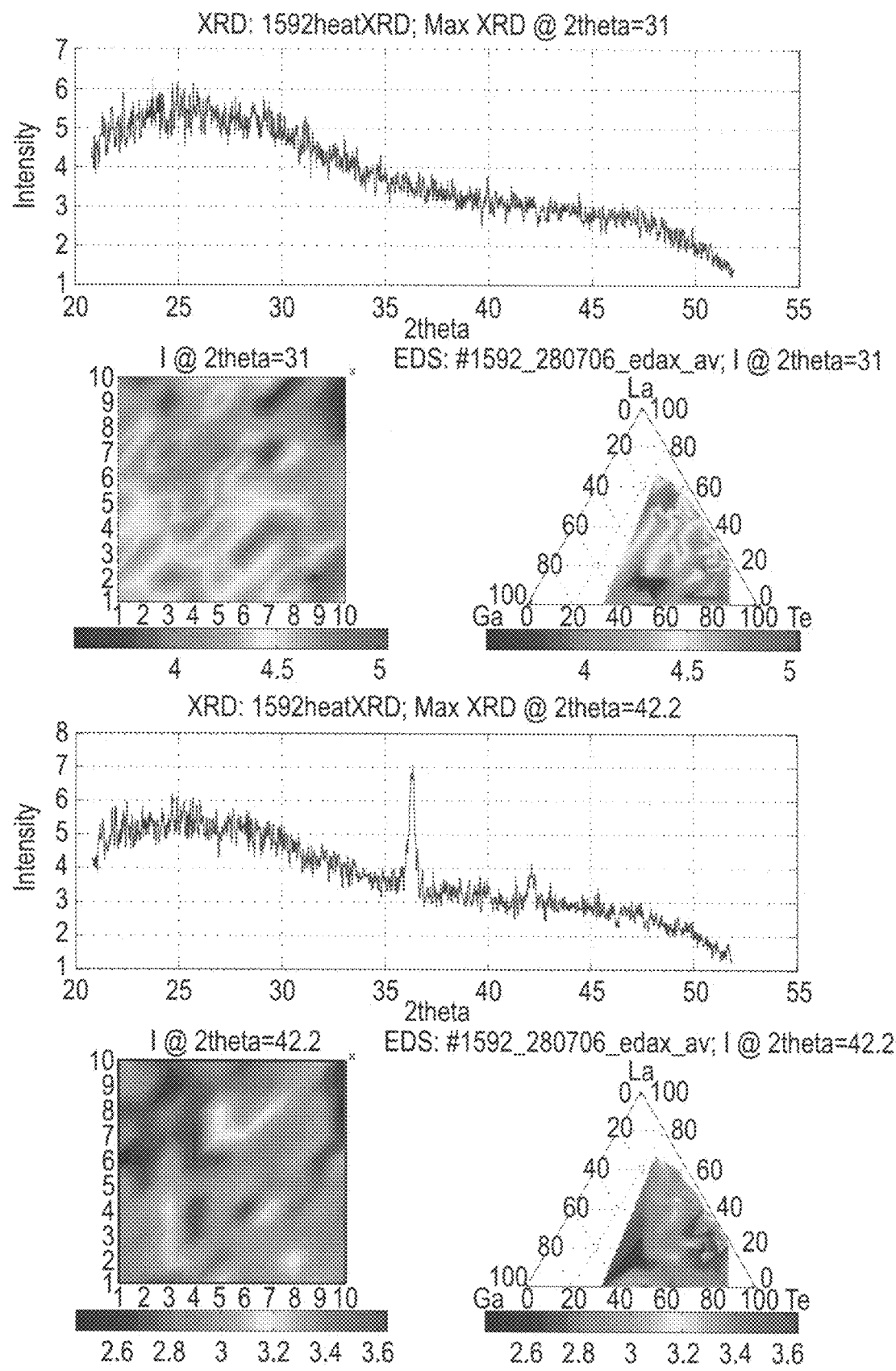
FIG. 37 shows representative data for X-ray diffraction measurement (XRD) made on sample 1592 indicating compositions with both (a) amorphous and (b) crystalline phase. This supports our interpretation that the enhanced reflectivity areas in FIGS. 35 and 36 is a result of a crystalline phase.

In order to establish the structural characteristics of the "as deposited" material, X-ray diffraction measurement (XRD) have been made. An example of these, indicating compositions with both amorphous and crystalline phase is shown in FIG. 37. This supports our interpretation that the enhanced reflectivity is a result of a crystalline phase.

TABLE 2

Summary of in-situ and other high throughput screening methods.

| Parameter | Equipment | Specifications |
|---|---|---|
| Composition and Structure | Automated SEM and EDS (JEOL JSM-5910; Oxford Instruments INCA 300) | 0-30 kV, up to 300K magnification (3.0 nm resolution) |
| | Automated Thin Film XRD (Bruker C2 XRD) | Cu K_source (_ = 1.54184 Å) 2_ −29.4° to 62.4° 60 sec per sample (~100 mm spot size) |
| | Automated Atomic Force Microscopy (Oriel) | Automated Stage, Contact and Non-Contact Modes. |
| | High Resolution TEM and EDS (JEOL JEM 3010; Oxford Instruments INCA 100TEM) | 100-300 kV; magnification up to 1.5M, res. 0.21 nm |
| | Automated Raman Microscopy (Renishaw) | |

TABLE 2-continued

Summary of in-situ and other high throughput screening methods.

| Parameter | Equipment | Specifications |
|---|---|---|
| Conductivity | Automated Four-Point or van de Pauw (Four Dimensions Inc. Model 280DI) | 0.05 m_cm-5K_ cm (50 nm sample). |
| Optical | Automated Imaging Ellipsometer (Nanofilm Technology I-Elli2000) | 100 D and y "images" in 20-25 minutes providing refractive index. |
| Thermal | Thermal Camera | Parallel Measurement of Temperature |
| Thickness | Profilometer (Alpha Step) Automated Atomic Force Microscopy (Oriel) | Automated Stage, Contact and Non-Contact Modes. |

Figure 38:
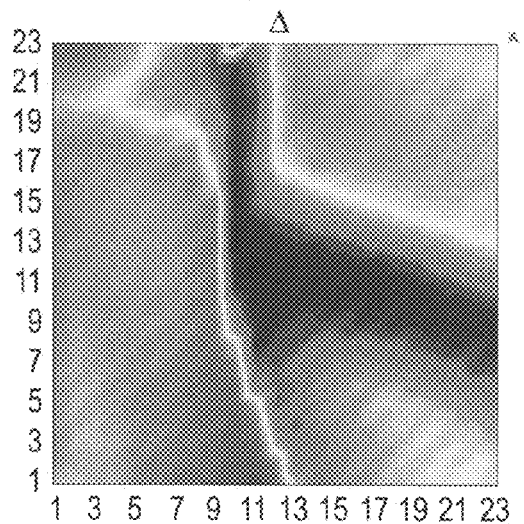
FIG. 38 shows results of an ellipsometric measurement of A and T (degrees) measured at 633 nm on sample 1617. The ellipsometric angle A reflects the difference in thickness of the material. The ellipsometric angle T is dominated by the absorbance of the phase change.
Figure 38:
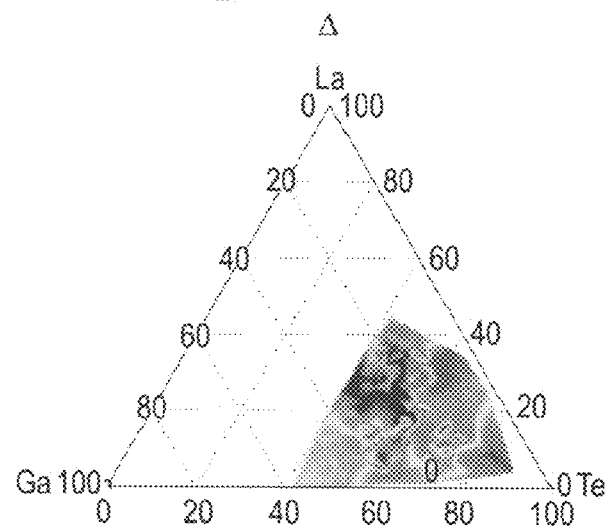
Figure 38:
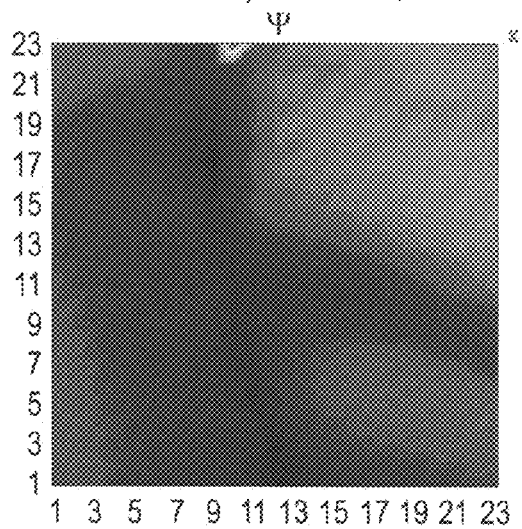
Figure 38:
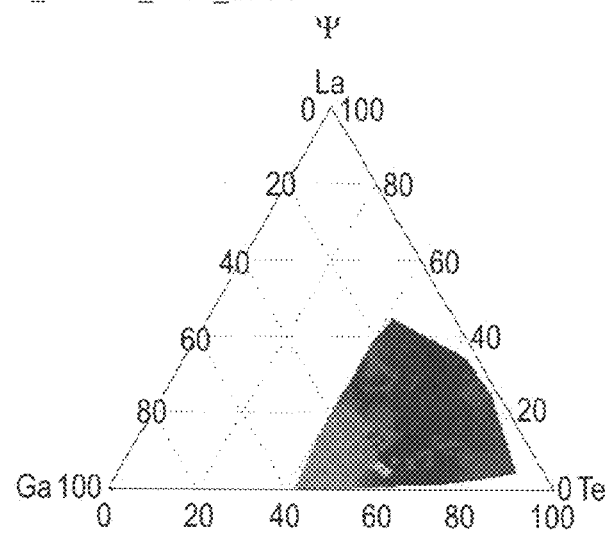
Figure 38:
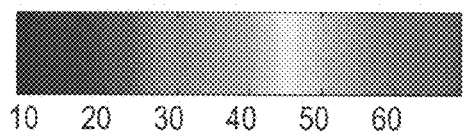
Figure 38:
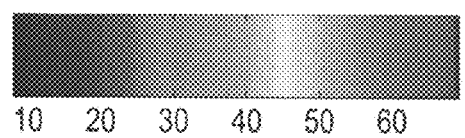

FIG. 38 shows the results of the ellipsometric measurement of $\Delta$ and $\Psi$ (degrees) measured at 633 nm for the 100 fields shown in the sample plotted in the form of a contour map. The ellipsometric angle $\Delta$ primarily reflects the difference in thickness of the material, which can be substantiated by comparison with the thickness data from AFM. The ellipsometric angle $\Psi$ is dominated by the absorbance of the phase. Comparison of the map of $\Psi$ with the processed optical image clearly shows the correlation of $\Psi$ with the highly reflecting crystalline phase. A full evaluation of the optical constants, n and k, can be obtained from this data.

Figure 39:
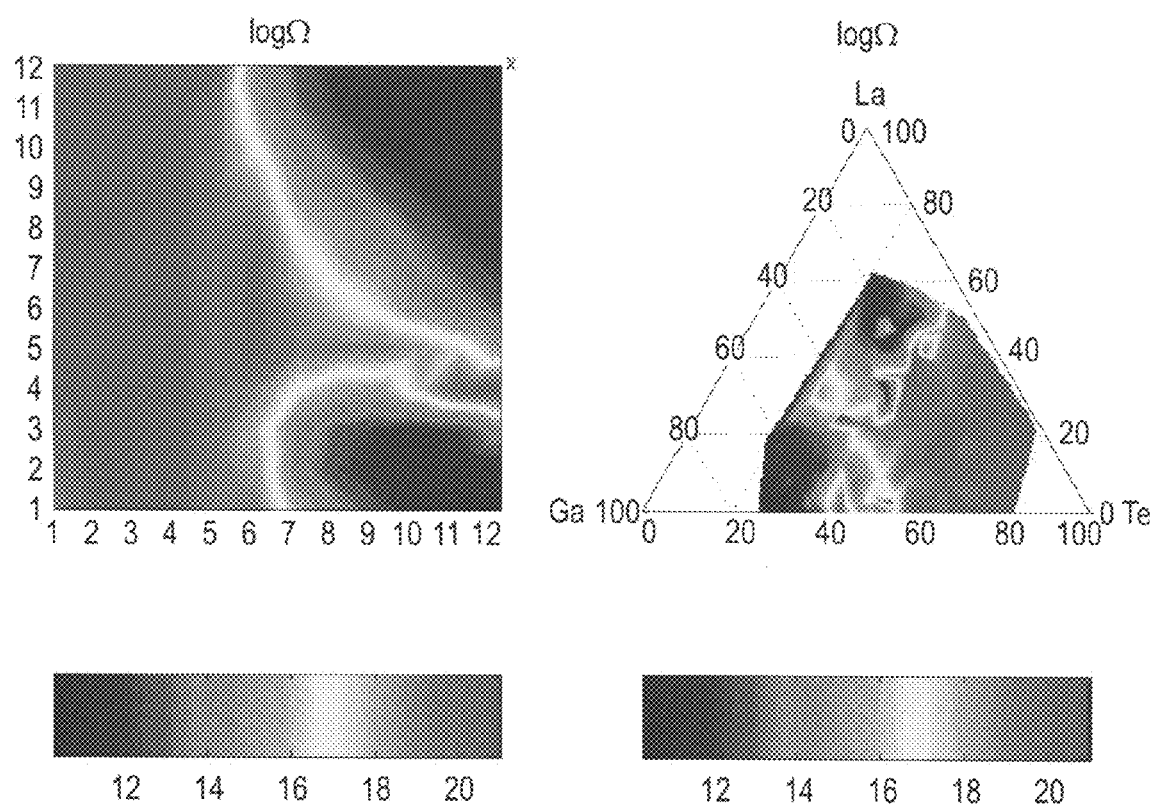
FIG. 39 shows results of conductivity measurements using a four-point probe over a resistivity range of 0.05 mΩ cm-5 kΩcm.

Additional analysis also in progress includes conductivity measurements, also automated, using a four-point over a resistivity range of 0.05 m$\Omega$ cm-5 k$\Omega$cm. This data is presented in FIG. 39.

REFERENCES

1. U.S. Pat. No. 3,271,591
2. U.S. Pat. No. 3,530,441
3. U.S. Pat. No. 5,166,758
4. U.S. Pat. No. 5,296,716
5. U.S. Pat. No. 5,534,711
6. U.S. Pat. No. 5,536,947
7. U.S. Pat. No. 5,596,522
8. U.S. Pat. No. 5,687,112
9. U.S. Pat. No. 5,166,758
10. U.S. Pat. No. 5,296,716
11. U.S. Pat. No. 5,534,711
12. U.S. Pat. No. 5,536,947

13. U.S. Pat. No. 5,596,522
14. U.S. Pat. No. 5,687,112
15. U.S. Pat. No. 3,983,542
16. U.S. Pat. No. 3,988,720
17. U.S. Pat. No. 4,103,044
18. U.S. Pat. No. 4,622,654
19. U.S. Pat. No. 4,679,085
20. U.S. Pat. No. 4,715,685
21. U.S. Pat. No. 4,719,594
22. U.S. Pat. No. 4,782,340
23. U.S. Pat. No. 4,795,657
24. U.S. Pat. No. 4,845,533
25. U.S. Pat. No. 4,853,785
26. U.S. Pat. No. 5,536,947
27. U.S. Pat. No. 5,789,277
28. U.S. Pat. No. 5,814,527
29. U.S. Pat. No. 6,229,157
30. U.S. Pat. No. 6,300,684
31. U.S. Pat. No. 6,314,014
32. U.S. Pat. No. 6,316,784
33. U.S. Pat. No. 6,337,266
34. U.S. Pat. No. 6,391,688
35. U.S. Pat. No. 6,392,913
36. U.S. Pat. No. 6,429,064
37. U.S. Pat. No. 6,462,353
38. U.S. Pat. No. 6,480,438
39. U.S. Pat. No. 6,487,113
40. U.S. Pat. No. 6,492,656
41. U.S. Pat. No. 6,501,111
42. U.S. Pat. No. 6,507,061
43. U.S. Pat. No. 6,511,862
44. U.S. Pat. No. 6,512,241
45. U.S. Pat. No. 6,514,788
46. U.S. Pat. No. 6,534,780
47. U.S. Pat. No. 6,534,781
48. U.S. Pat. No. 6,545,287
49. U.S. Pat. No. 6,545,907
50. U.S. Pat. No. 6,567,293
51. U.S. Pat. No. 6,567,296
52. U.S. Pat. No. 6,570,784
53. U.S. Pat. No. 6,576,921
54. U.S. Pat. No. 6,579,760
55. U.S. Pat. No. 6,589,714
56. U.S. Pat. No. 6,590,807
57. U.S. Pat. No. 6,593,176
58. U.S. Pat. No. 6,597,009
59. U.S. Pat. No. 6,608,773
60. U.S. Pat. No. 6,613,604
61. U.S. Pat. No. 6,617,192
62. U.S. Pat. No. 6,646,297
63. U.S. Pat. No. 6,667,900
64. U.S. Pat. No. 6,673,648
65. U.S. Pat. No. 6,673,700
66. U.S. Pat. No. 6,674,115
67. U.S. Pat. No. 6,687,153
68. U.S. Pat. No. 6,707,712
69. U.S. Pat. No. 6,878,618
70. U.S. Pat. No. 6,881,603
71. U.S. Pat. No. 6,885,021
72. U.S. Pat. No. 6,891,747
73. U.S. Pat. No. 6,111,264
74. U.S. Pat. No. 6,104,038
75. U.S. Pat. No. 6,075,719
76. U.S. Pat. No. 6,025,220
77. U.S. Pat. No. 5,879,955
78. U.S. Pat. No. 5,920,788
79. U.S. Pat. No. 6,803,335 (the entire contents of which are incorporated herein by reference)
80. J. Flahaut, M. Guittard, A. M Loireau-Lozac'h. 1983 "Rare Earth Sulphide and Oxysulphide Glasses" Glass Technology, volume 24, pages 149-155.
81. McGraw-Hill Encyclopedia of Physics, Second Edition, 1993, pages 231-232.
82. Kissinger, Horner E. 1957 "Reaction Kinetics in Differential Thermal Analysis" Analytical Chemistry, volume 29, pages 1702-1706
83. Kyratsi et al—Advanced Matter 2003, 15(17) 3 Sep. 2003
84. U.S. Pat. No. 5,933,365 (the entire contents of which are incorporated herein by reference)
85. R E Simpson, D W Hewak, S Guerin, B Hayden and G Purdy, High Throughput Synthesis and Screening of Chalcogenide Materials for Data Storage, E*PCOS Cambridge September 2005

What is claimed is:

1. A phase change memory device comprising a phase change material, wherein the phase change material is a compound of:
   (i) Ga;
   (ii) La or La and at least one further lanthanide element; and
   (iii) chalcogenide;
      wherein the lanthanide is composed of La and the chalcogenide is composed of S;
      wherein the ratio of Ga:S atoms is approximately 2:3, and the ratio of La:S atoms is approximately 2:3; and
      wherein the ratio of Ga to La is 3:1, so that the ratio of atoms of Ga:La:S is approximately 3:1:6.

2. The device according to claim 1, wherein the compound is made of at least 99% atoms of Ga, La and S.

3. The device according to claim 1, wherein the compound further comprises one or more elements selected from the group: B, Al, In, Si, Ge, Sn, As, Sb, Bi.

4. The device of claim 1, based on switching the phase change material between a first state and a second state, wherein the first state is a crystalline phase of the phase change material and the second state is an amorphous phase of the phase change material.

5. The device of claim 1, based on switching the phase change material between a first state and a second state, wherein the first state and the second state are first and second crystalline phases of the phase change material.

6. The device of claim 5, based on switching the phase change material between the first state, the second state, and additionally a third state, wherein the third state is an amorphous phase of the phase change material.

7. The device according to claim 1, wherein the compound further comprises a halide modifier of one or more Group VII elements selected from the group F, Cl, Br and I, and/or Group I elements selected from the group Na, K, Rb and Cs.

8. The device according to claim 7, wherein the halide modifier makes up between 1 to 30% of the atoms of the compound.

9. The device according to claim 7, wherein the halide modifier makes up between 20 to 30% of the atoms of the compound.

10. The device according to claim 1, wherein the compound further comprises a transition metal modifier of one or more elements selected from elements 21 to 30, 39 to 48, 72 to 80 of the periodic table.

11. The device according to claim 10, wherein the transition metal modifier is one or more elements selected from the group: Cr, Fe, Ni, Nb, Pd, Pt, Cu, Au, Ag.

12. The device according to claim 1, wherein the phase change material is addressable by an optical beam configured to allow optical pulses to be applied to programmable volumes of the phase change material to selectively read and induce phase changes in the programmable volumes selected by the optical beam.

13. The device of claim 12, wherein the device is formed into an optical memory disk.

14. The device of claim 12, further comprising a substrate and a layer of the phase change material arranged thereon.

15. The device of claim 14, further comprising upper and lower dielectric layers arranged respectively above and below the layer of phase change material.

16. The device of claim 15, further comprising at least one further layer of phase change material arranged between the upper and lower dielectric layers.

17. The device according to claim 1, wherein the phase change material is addressable by a plurality of electrodes which define an array of programmable volumes of the phase change material and which are configured to allow electrical pulses to be applied to the programmable volumes to selectively read and induce phase changes in the programmable volumes selected by the electrodes.

18. The device of claim 17, comprising a planar structure in which the phase change material is incorporated in at least one memory material layer and in which the electrodes are formed by at least one electrode material layer.

19. The device of claim 18, further comprising at least one heating layer.

20. The device of claim 18, further comprising thermal insulation material.

21. The device of claim 20, wherein the thermal insulation material is arranged in at least one thermal insulation layer.

22. The device of claim 20, wherein the thermal insulation material is arranged at least partially within the memory material layer to form a plug therein.

23. A method of operating a phase change memory device by selectively switching a compound of:
  (i) Ga:
  (ii) La or La and at least one further lanthanide element; and
  (iii) chalcogenide
  between a first state and a second state; and
  wherein the first state and the second state are first and second crystalline phases of the phase change material.

24. The method of claim 23, wherein the switching is between the first state, the second state, and additionally a third state, wherein the third state is an amorphous phase of the phase change material.

25. The method of claim 23, wherein the switching is performed optically.

26. The method of claim 23, wherein the switching is performed electrically.

* * * * *